United States Patent
Ohashi et al.

(10) Patent No.: US 9,431,220 B1
(45) Date of Patent: Aug. 30, 2016

(54) SUBSTRATE PROCESSING APPARATUS AND SUBSTRATE PROCESSING SYSTEM

(71) Applicant: HITACHI KOKUSAI ELECTRIC INC., Tokyo (JP)

(72) Inventors: Naofumi Ohashi, Toyama (JP); Masanori Nakayama, Toyama (JP); Atsuhiko Suda, Toyama (JP); Kazuyuki Toyoda, Toyama (JP); Shun Matsui, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/861,051

(22) Filed: Sep. 22, 2015

(30) Foreign Application Priority Data

Jul. 6, 2015 (JP) ................................ 2015-135164

(51) Int. Cl.
| | |
|---|---|
| *C23C 16/52* | (2006.01) |
| *H01J 37/32* | (2006.01) |
| *C23C 16/50* | (2006.01) |
| *C23C 16/455* | (2006.01) |
| *H01L 21/8238* | (2006.01) |
| *H01L 21/321* | (2006.01) |
| *H01L 21/67* | (2006.01) |
| *H01L 21/8234* | (2006.01) |
| *H01L 21/28* | (2006.01) |

(52) U.S. Cl.
CPC ......... *H01J 37/32449* (2013.01); *C23C 16/455* (2013.01); *C23C 16/50* (2013.01); *C23C 16/52* (2013.01); *H01J 37/32009* (2013.01); *H01L 21/28194* (2013.01); *H01L 21/3212* (2013.01); *H01L 21/67253* (2013.01); *H01L 21/823462* (2013.01); *H01L 21/823857* (2013.01)

(58) Field of Classification Search
CPC ................ H01J 37/32; H01J 37/32449; H01J 37/32009; C23C 16/52; C23C 16/455; C23C 16/50; H01L 21/67253; H01L 21/823462; H01L 21/823857; H01L 21/28194; H01L 21/3212
See application file for complete search history.

(56) References Cited

U.S. PATENT DOCUMENTS

2002/0090888 A1    7/2002   Nishihara

FOREIGN PATENT DOCUMENTS

JP    2002-203826 A    7/2002

*Primary Examiner* — Jeffrie R Lund
*Assistant Examiner* — Yuechuan Yu
(74) *Attorney, Agent, or Firm* — Volpe and Koenig, P.C.

(57) ABSTRACT

A substrate processing apparatus may include a process chamber configured to accommodate a substrate having a metal film polished on a first insulating film and a second insulating film polished on the metal film; a process gas supply part configured to supply a process gas to the substrate; an activation part configured to activate the process gas; a computation part configured to compute processing data for adjusting a film thickness distribution of a stacked insulating film having the polished second insulating film and a third insulating film by adjusting a film thickness distribution of the third insulating film based on the film thickness distribution data of the polished second insulating film; and a control part configured to control the process gas supply part and the activation part to adjust the film thickness distribution of the stacked insulating film based on the processing data.

15 Claims, 36 Drawing Sheets

FIG. 22

| | S4002 | S4003 | S4004 | S4005 |
|---|---|---|---|---|
| Process gas supply | | ▬▬▬▬ | ▬▬▬ | |
| Plasma ON | | | ▬▬ | |
| Power to first electromagnet | ▬▬▬▬▬▬▬▬▬ | | | |
| Power to second electromagnet | ▬▬▬▬▬▬▬▬▬ | | | |
| Purge | | | | ▬ |

SUBSTRATE PROCESSING APPARATUS AND SUBSTRATE PROCESSING SYSTEM

CROSS-REFERENCE TO RELATED APPLICATIONS

This application is based upon and claims the benefit of priority from Japanese Patent Application No. 2015-135164, filed on Jul. 6, 2015, the entire contents of which are incorporated herein by reference.

TECHNICAL FIELD

The present disclosure relates to a substrate processing system and a substrate processing apparatus.

BACKGROUND

Recently, semiconductor devices tend to be highly integrated. In line with this, multilayer interconnection has been made. The multilayer interconnection is formed by a combination of a patterning process, a polishing process, a film forming process, and the like. When forming the multilayer interconnection, it is required to prevent variations in characteristics of the semiconductor devices.

However, a variation in a distance between circuits formed on a substrate may occur due to processing problems. In particular, in the multilayer interconnection structure, such variation may significantly affect the characteristics of semiconductor devices.

SUMMARY

The present disclosure provides some embodiments of suppressing variation in characteristics of a semiconductor device.

According to one aspect of the present disclosure, there is provided a method, including: polishing a substrate in which a metal film as a metal wiring is formed on a first insulating film having a plurality of wiring grooves; forming a second insulating film on the substrate after the act of polishing a substrate; polishing the second insulating film; receiving film thickness distribution data within a surface of the substrate of the second insulating film after the act of polishing the second insulating film, and calculating processing data for adjusting a film thickness distribution of a stacked insulating film formed of the second insulating film after being polished and a third insulating film by adjusting a film thickness distribution of the third insulating film formed on the second insulating film after being polished, based on the film thickness distribution data; and adjusting the film thickness distribution of the stacked insulating film by activating a process gas to form the third insulating film such that a concentration of active species of the process gas generated in a central side of the substrate and a concentration of active species of the process gas generated in a peripheral side of the substrate are different, based on the processing data.

BRIEF DESCRIPTION OF THE DRAWINGS

FIG. 22 is a diagram illustrating an example of a substrate processing sequence according to an embodiment.

DETAILED DESCRIPTION

Hereinafter, embodiments of the present disclosure will be described.

Figure 1:
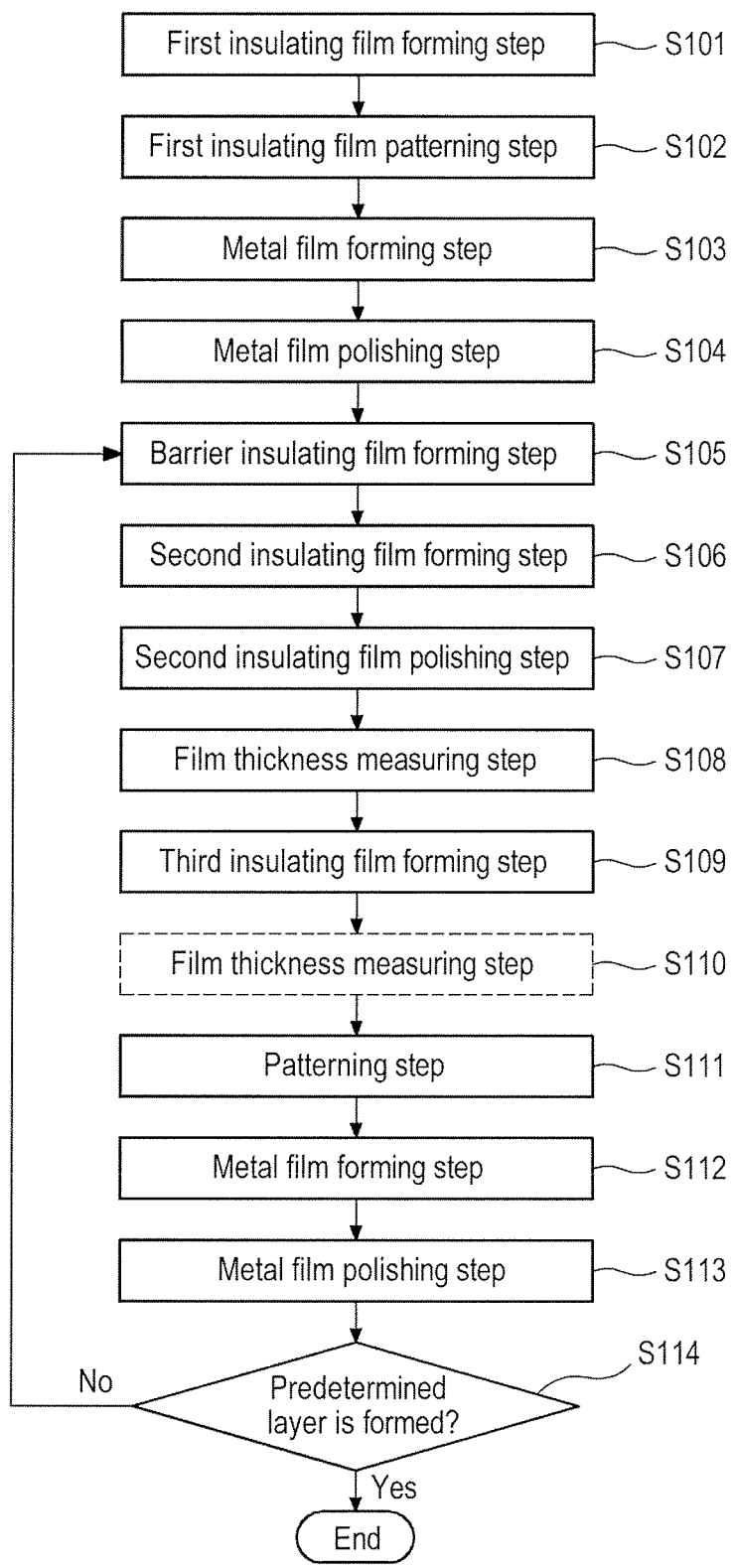
FIG. 1 is an explanatory diagram illustrating a flow of manufacturing a semiconductor device according to an embodiment of the present disclosure.

One of processes of manufacturing a semiconductor device will be described with reference to FIG. 1.

<First Insulating Film Forming Step S101>

Figure 2:
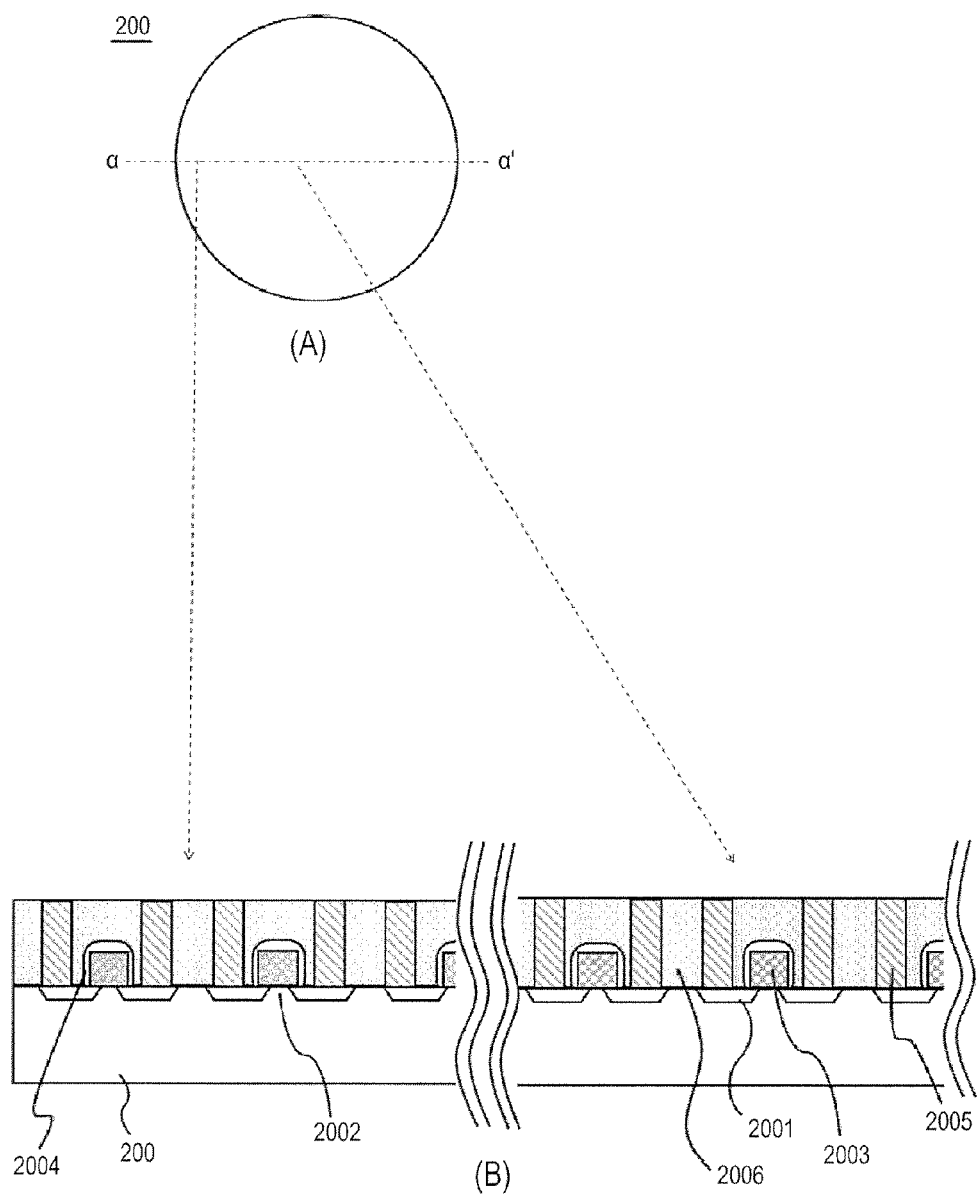
FIG. 2 is an explanatory view illustrating a wafer according to an embodiment.
Figure 3:
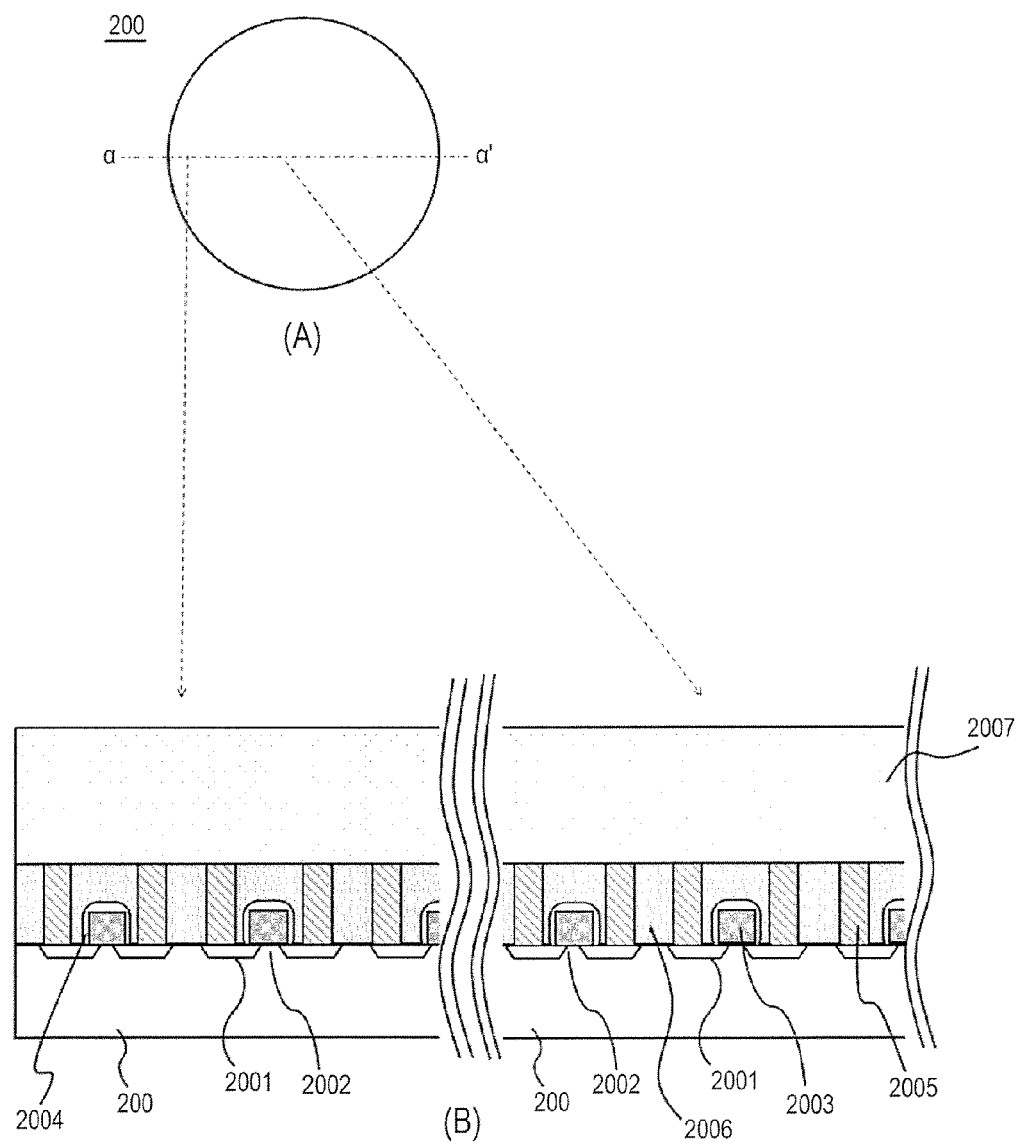
FIG. 3 is an explanatory view illustrating a process state of a wafer according to an embodiment.

Hereinafter, a first insulating film forming step S101 will be described. Regarding the first insulating film forming step S101, a wafer 200 will be described with reference to FIGS. 2 and 3. FIG. 2 illustrates a wafer before an insulating film is formed thereon. FIG. 3 illustrates a wafer after the insulating film is formed thereon.

FIG. 2 illustrates a view (A) of the wafer 200 to be processed, which is viewed from a processing surface. FIG. 2 also illustrates a cross-sectional view (B) of the wafer 200 taken along line α-α in the top view (A) of the wafer 200. In the cross-sectional view (B) of the wafer 200, a right broken line indicates a central portion of the wafer 200, and a left broken line 240 indicates a periphery of the wafer.

In the wafer 200, source/drain regions 2001 configured as a source or a drain may be formed in the wafer 200. Channel regions 2002 may be formed between the source/drain regions 2001. A gate electrode 2003 may be formed above each of the channel regions 2002. An outer wall 2004, which suppresses a current leakage from a sidewall of the gate electrode 2003, or the like, may be formed around the gate electrode 2003. The source/drain regions 2001 and the gate electrodes 2003 may be used as portions for circuit components of a semiconductor device. Metal films 2005 as a plug may be formed on the source/drain regions 2001, and an interlayer insulating film 2006 configured as a silicon oxide film may be formed between the metal films 2005. The metal films 2005 may be formed of, for example, tungsten. The interlayer insulating film 2006 will also be referred to as a $0^{th}$ insulating film herein, considering its relationship with a first interlayer insulating film 2007, which will be described later.

The first insulating film forming step S101 will continue to be described with reference to FIGS. 1 and 3. When the wafer 200 illustrated in FIG. 2 is loaded to a substrate processing apparatus configured to form a first insulating film (first insulating film forming apparatus), a silicon-containing gas and an oxygen-containing gas are supplied into a process chamber of the substrate processing apparatus. The supplied gases react with each other within the process chamber to form the first interlayer insulating film 2007 (also referred to simply as an insulating film 2007 or a wiring formation insulating film 2007) which insulates metal films 2009 described later. The insulating film 2007 may be formed of for example, a silicon oxide film ($SiO_2$ film). The silicon-containing gas may be, for example, a TEOS (Tetraethyl orthosilicate, $Si(OC_2H_5)_4$) gas. The oxygen-containing gas may be, for example, an oxygen ($O_2$) gas. The insulating film 2007 is not limited to the silicon oxide film and may be a low dielectric constant (low-k) film or a silicon oxynitride film.

When the insulating film 2007 is formed after a lapse of a desired period of time, the wafer 200 is unloaded from the substrate processing apparatus (first insulating film forming apparatus).

<Patterning Step S102>

Figure 4:
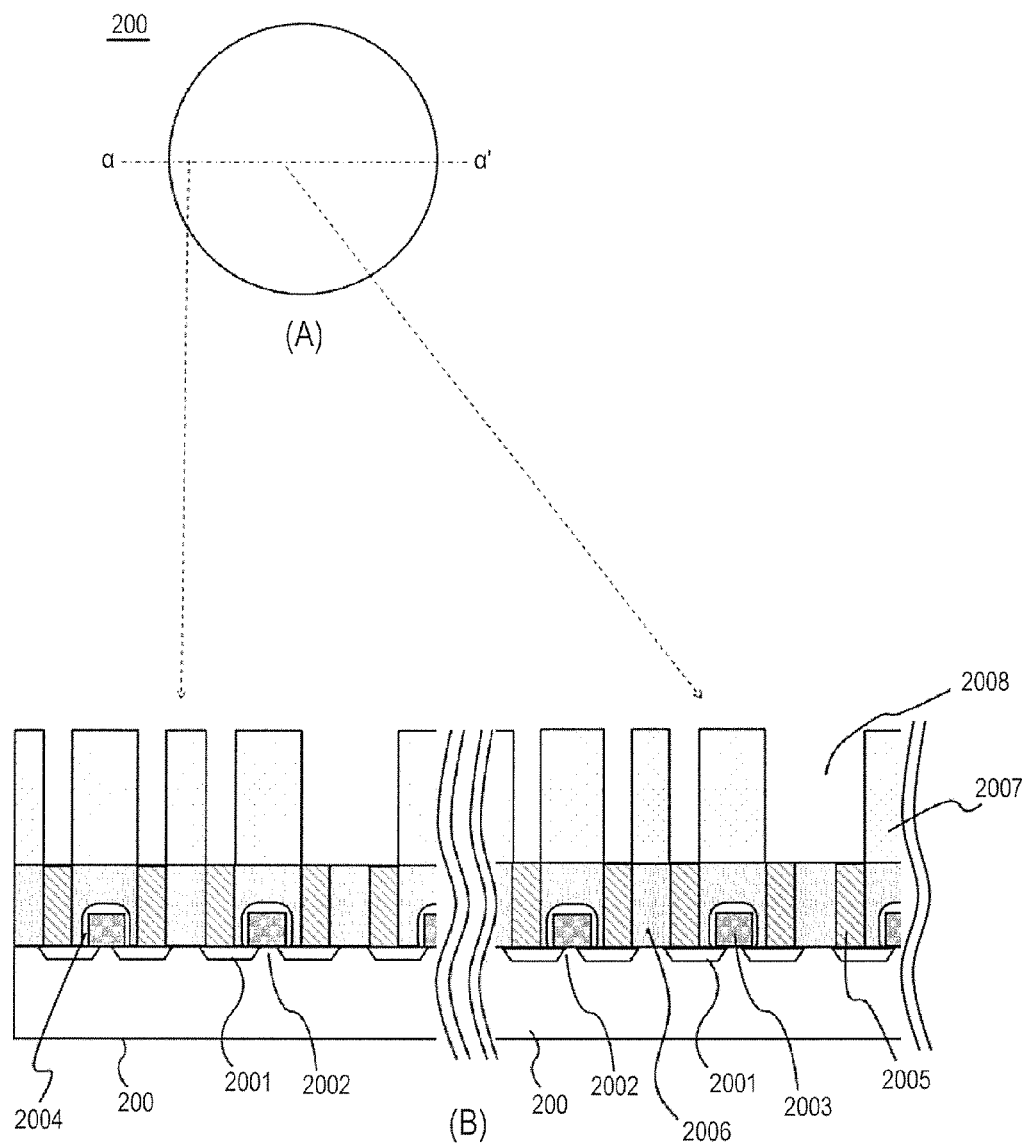
FIG. 4 is an explanatory view illustrating a process state of a wafer according to an embodiment.

Subsequently, a patterning step S102 of patterning the first insulating film 2007 will be described with reference to FIGS. 1 and 4. FIG. 4 illustrates a state of the wafer 200 after being etched.

The patterning step S102 is performed by using an exposure apparatus or an etching apparatus configured as part of a first patterning system. The patterning step S102 includes an exposure process performed by the exposure apparatus, and an etching process performed by the etching apparatus, and the like. After the wafer 200 loaded to the patterning system is exposed to light, a predetermined pattern is formed in the insulating film 2007 through the etching apparatus, as illustrated in FIG. 4. In this embodiment, wiring grooves 2008 are formed. After the etching process is completed, the wafer 200 is unloaded from the etching apparatus and unloaded from the patterning system.

<Metal Film Forming Step S103>

Subsequently, a metal film forming step S103 will be described with reference to FIGS. 1 and 5. The metal film forming step S103 may be performed by using a metal film forming system. The metal film forming system includes a barrier metal film forming apparatus configured to form a barrier metal film or a metal film forming apparatus configured to form a metal film to be configured as a wiring. After being unloaded from the patterning system, the wafer 200 is loaded to the barrier metal film forming apparatus included in the metal film forming system. The barrier metal film forming apparatus forms a barrier metal film 2021 on a surface of each wiring groove 2008, as illustrated in (C) of FIG. 5. The barrier metal film 2021 serves to suppress spreading of the metal film 2009 which will be described later, and may be formed of for example, titanium nitride (TiN). After the barrier metal film 2021 is formed, the wafer 200 with the formed barrier metal film 2021 is loaded to the metal film forming apparatus. The metal film forming apparatus may be an existing plating apparatus or sputtering apparatus. The metal film forming apparatus forms a metal film (also referred to as a wiring metal film) 2009 on the barrier metal film 2021 through plating or sputtering. The metal film 2009 may be formed of, for example, copper (Cu).

Figure 5:
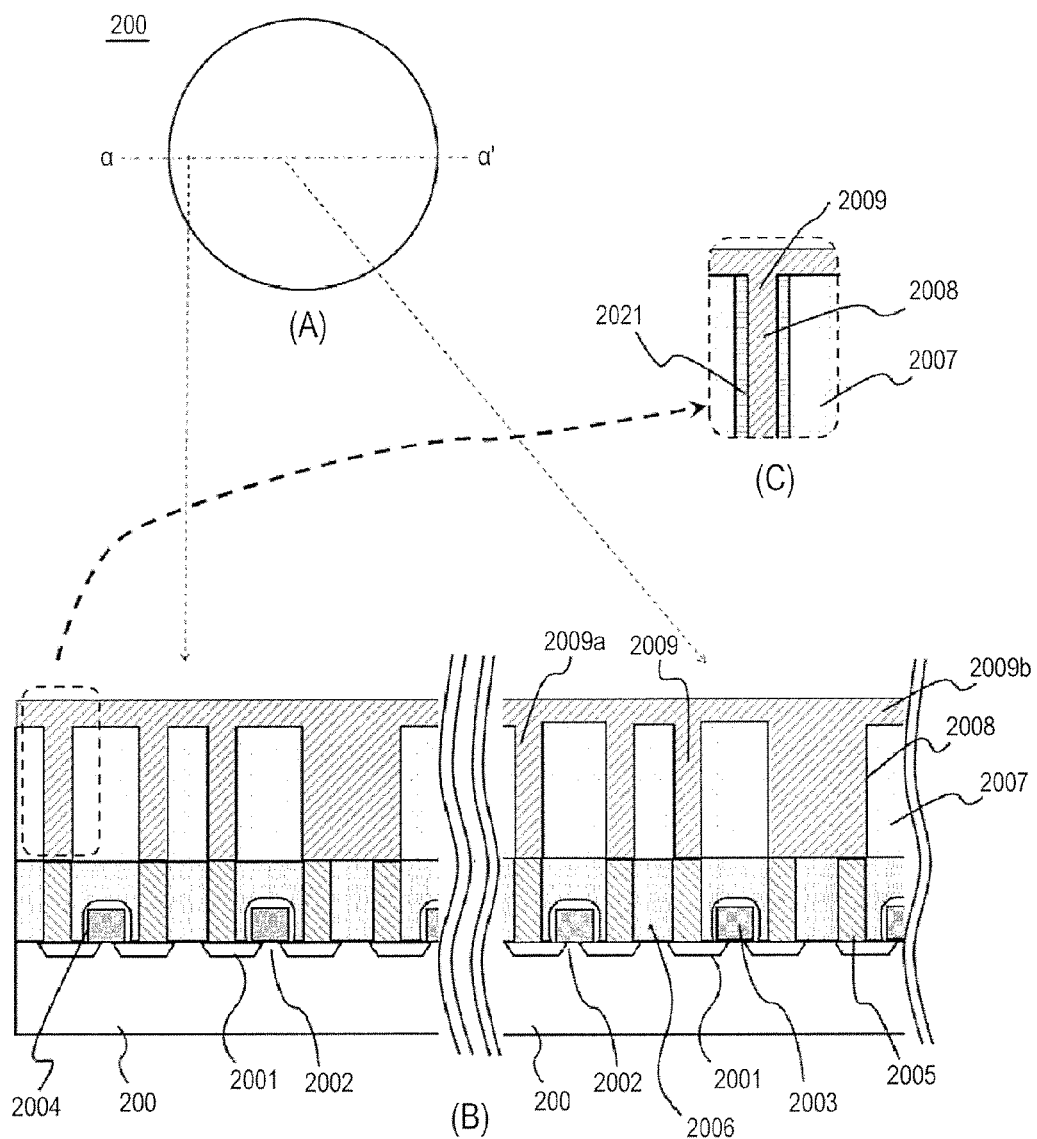
FIG. 5 is an explanatory view illustrating a process state of a wafer according to an embodiment.

Depending on properties of a film formation, the metal film 2009 is also formed on the insulating film 2007 as well as in the wiring groove 2008, as illustrated in FIG. 5. Here, the metal film 2009 formed within the wiring groove 2008 will be referred to as a metal film 2009a and the metal film 2009 formed on the insulating film 2007 will be referred to as a metal film 2009b.

After the metal film 2009 is formed in the wiring groove 2008, the wafer 200 is unloaded from the metal film forming apparatus.

<Metal Film Polishing Step S104>

Figure 6:
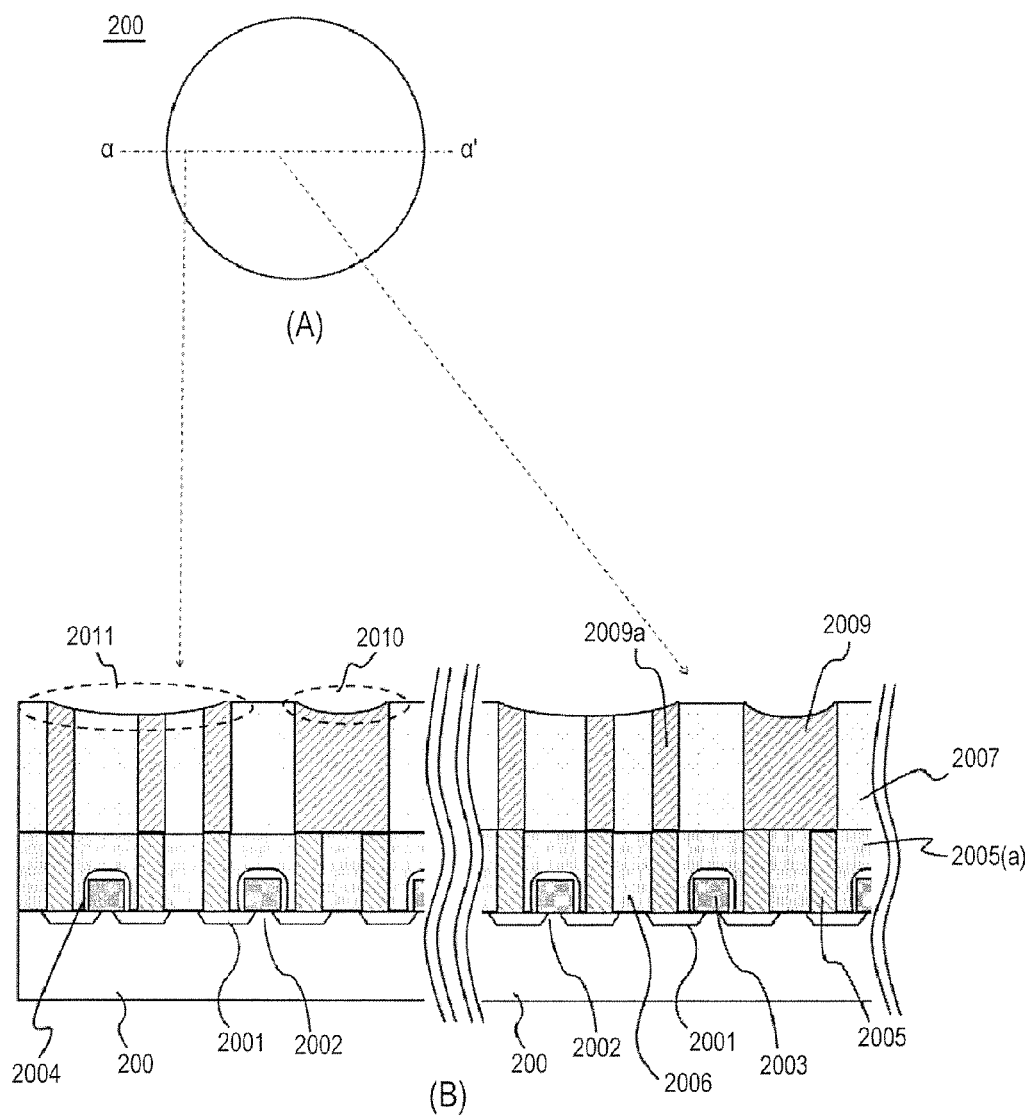
FIG. 6 is an explanatory view illustrating a process state of a wafer according to an embodiment.

Subsequently, a polishing step S104 will be described with reference to FIGS. 1 and 6. As illustrated in FIG. 5, the metal film 2009b is formed on the insulating film 2007 by forming the metal film through sputtering or plating. The metal film 2009b may be removed through polishing in order to avoid that the metal film 2009b electrically connects the metal films 2009a. Also, the polishing will be referred to as a chemical mechanical polishing (CMP) process.

After being unloaded from the metal film forming apparatus, the wafer 200 is loaded to a first polishing apparatus.

The polishing may be excessively performed in order to ensure insulation between the metal films 2009a. When the polishing is excessively performed, the metal films 2009b are removed so that the metal films 2009a are insulated, as illustrated in FIG. 6. In addition, dishing 2010 or erosion 2011 may be formed on the film due to a difference in polishing rates between the insulating film 2007 and the metal film 2009, or according to coarseness and fineness of the metal film 2009. Here, the erosion is likely to occur in, for example, places where gate electrodes are concentrated.

After the wafer 200 is processed in the first polishing apparatus for a predetermined period of time, the wafer 200 is unloaded from the first polishing apparatus.

Here, a layer including the insulating film 2007 and the metal film 2009 after the polishing will be referred to as a first layer of a multilayer wiring. Also, the metal film 2009 will be referred to as a metal wiring first layer or an M1 layer.

<Barrier Insulating Film Forming Step S105>

Figure 7:
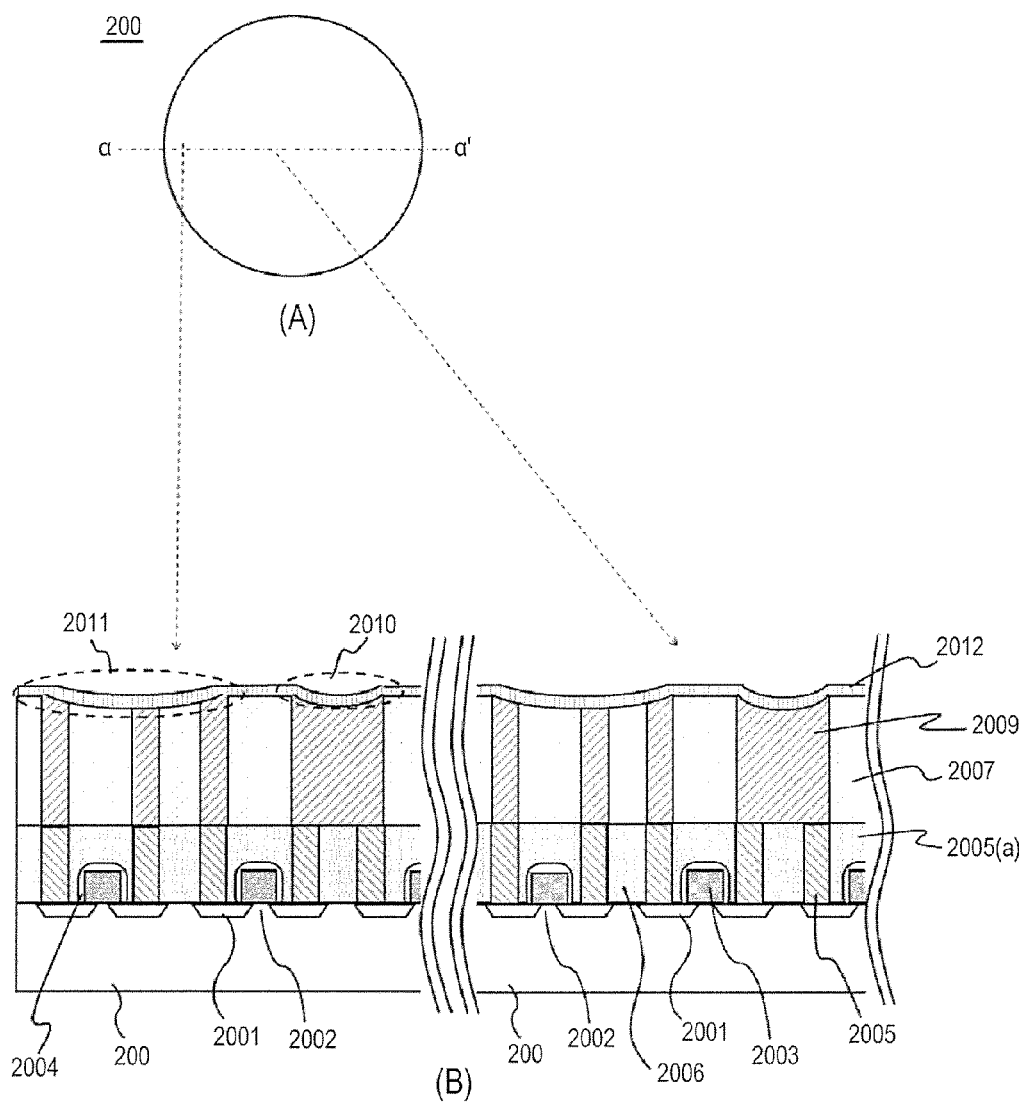
FIG. 7 is an explanatory view illustrating a process state of a wafer according to an embodiment.

Subsequently, a barrier insulating film forming step S105 will be described with reference to FIGS. 1 and 7. After being unloaded from the first polishing apparatus, the wafer 200 is loaded to a barrier insulating film forming apparatus. The barrier insulating film forming apparatus forms a barrier insulating film 2012 which is used as a barrier insulating film for preventing spreading of the metal film 2009, which will be described later.

The barrier insulating film 2012 may be made of a material that may be difficult to be etched in a patterning step described later. The barrier insulating film 2012 may be, for example, any one of a carbide silicon (SiC) film, a silicon nitride (SiN) film, and a silicon carbide nitride (SiCN) film.

The barrier insulating film 2012 is formed on the insulating film 2007 and the metal film 2009. Thus, the barrier insulating film 2012 is also formed on the dishing 2010 or the erosion 2011. Therefore, the barrier insulating film 2012 have dented portions on the dishing 2010 or the erosion 2011.

After the barrier insulating film 2012 is formed, the wafer 200 is unloaded from the barrier insulating film forming apparatus.

<Second Insulating Film Forming Step S106>

Figure 8:
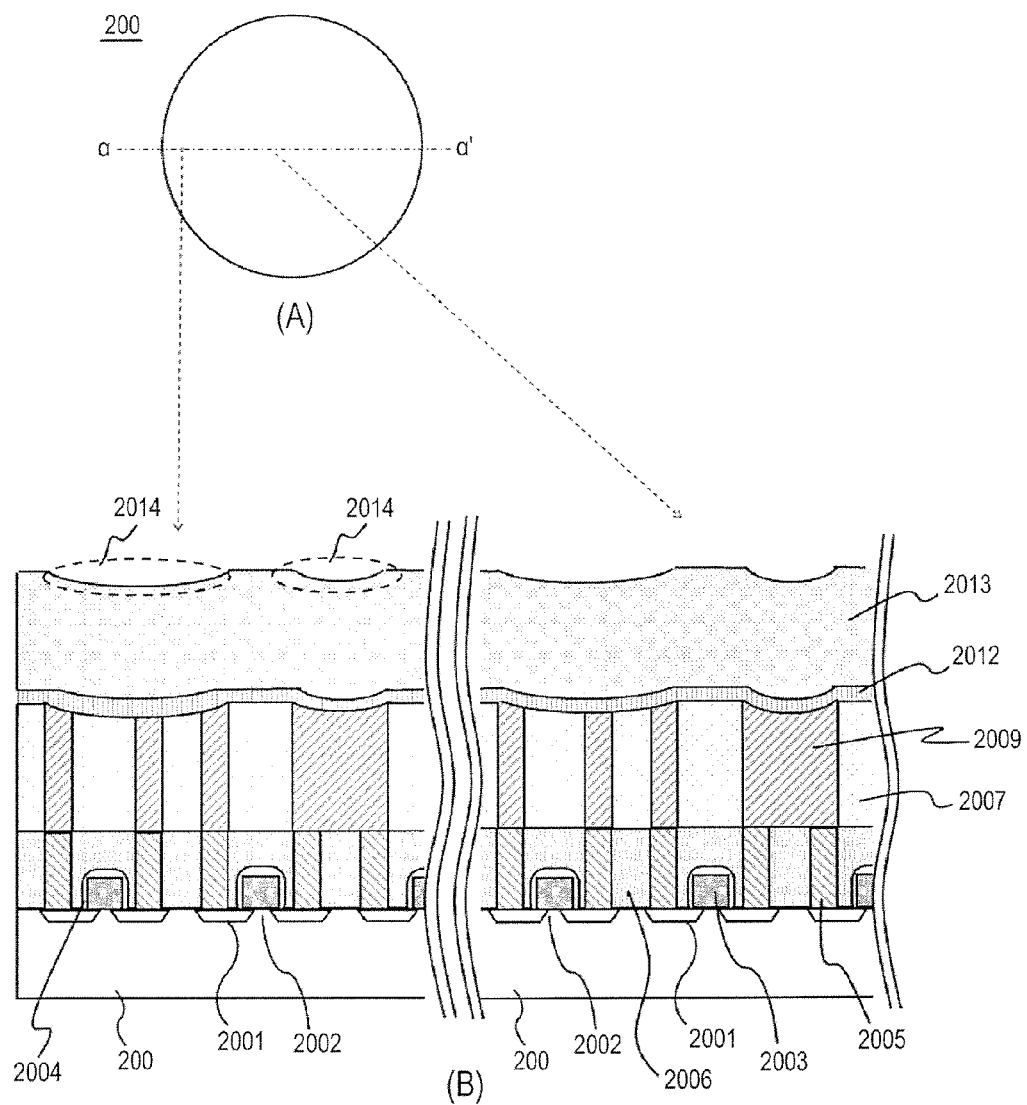
FIG. 8 is an explanatory view illustrating a process state of a wafer according to an embodiment.

Subsequently, a second insulating film forming step S106 will be described with reference to FIGS. 1 and 8. When the wafer 200 is loaded to a substrate processing apparatus configured to form a second insulating film (second insulating film forming apparatus), a silicon-containing gas and an oxygen-containing gas are supplied into a process chamber of the substrate processing apparatus. The supplied gases react with each other within the process chamber to form a second interlayer insulating film 2013 (also referred to simply as an insulating film 2013 or a wiring formation insulating film 2013) for insulating a metal film 2019 from a metal film 2020, which will be described later. The insulating film 2013 may be formed of, for example, a silicon oxide film ($SiO_2$ film). The silicon-containing gas may be, for example, a TEOS gas. The oxygen-containing gas may be, for example, an oxygen gas. The insulating film 2013 is not limited to the silicon oxide film and may be a low dielectric constant (low-k) film or a silicon oxynitride film.

After the lapse of a desired period of time, when the insulating film 2013 is formed, the wafer 200 is unloaded from the substrate processing apparatus (second insulating film forming apparatus).

The insulating film 2013 is formed on the barrier insulating film 2012. Thus, due to the dishing 2010 or the erosion 2011, the insulating film 2013 has concave portions 2014 formed on the dishing 2010 and the erosion 2011. Since the concave portions 2014 affect the characteristics of semiconductor devices, they are flattened in a subsequent second insulating film polishing step S107.

<Second Insulating Film Polishing Step S107>

Subsequently, the second insulating film polishing step S107 will be described with reference to FIGS. 9 to 15. After being unloaded from the second insulating film forming apparatus, the wafer 200 is loaded to a second polishing apparatus 400, so that the insulating film 2013 is polished. Polishing the insulating film 2013 removes the concave portion 2014.

Hereinafter, details of the polishing process will be described. After being unloaded from the second insulating film forming apparatus, the wafer 200 is loaded to the polishing apparatus 400 illustrated in FIG. 9.

Figure 9:
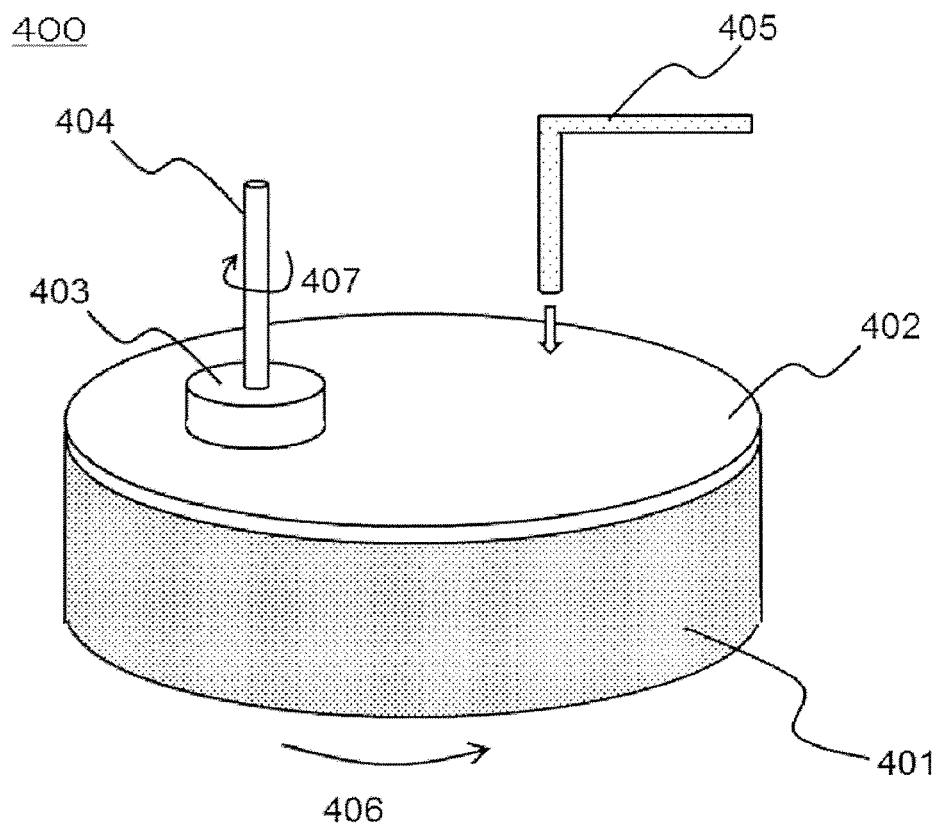
FIG. 9 is an explanatory view illustrating a polishing apparatus according to an embodiment.

FIG. 9 illustrates a polishing disc 401 and an abrasive cloth 402 to polish the wafer 200. The polishing disc 401 is connected to a rotation mechanism (not shown). To polish the wafer 200, the polishing disc 401 rotates in a direction of an arrow 406.

Reference numeral 403 is a polishing head, and a shaft 404 is connected to a top surface of the polishing head 403. The shaft 404 is connected to a rotation mechanism and an up and down movement mechanism (not shown). The wafer 200 is polished while rotating in a direction of an arrow 407.

Reference numeral 405 is a supply pipe configured to supply a slurry (an abrasive). While the wafer 200 is being polished, the slurry is supplied from the supply pipe 405 toward the abrasive cloth 402.

Figure 10:
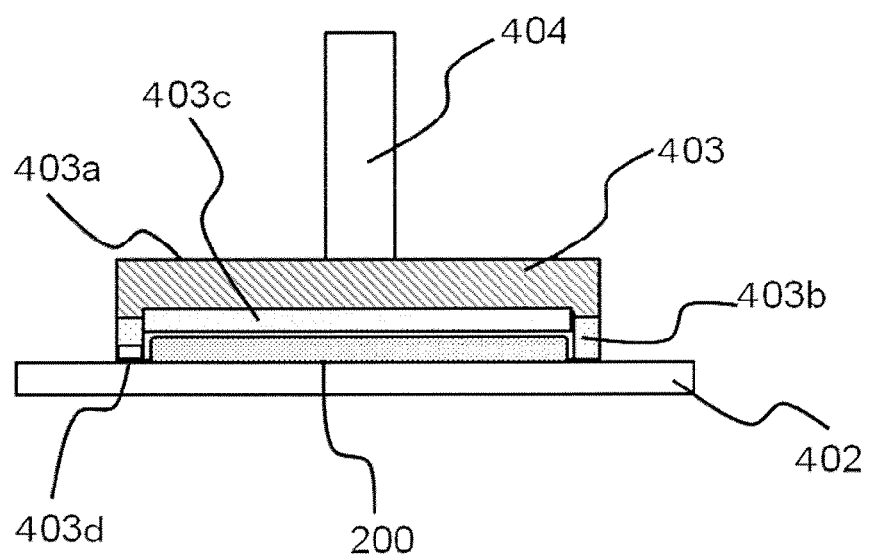
FIG. 10 is an explanatory view illustrating a polishing apparatus according to an embodiment.

Subsequently, details of the polishing head 403 and a peripheral structure thereof will be described with reference to FIG. 10. FIG. 10 is a cross-sectional view illustrating the polishing head 403 and a peripheral structure thereof. The polishing head 403 includes a top ring 403a, a retainer ring 403b and an elastic mat 403c. While the wafer 200 is being polished, the side of the wafer 200 is surrounded by the retainer ring 403b and the wafer 200 is pressed against the abrasive cloth 402 by the elastic mat 403c. A groove 403d is formed in the retainer ring 403b to allow the slurry to pass through from an outer side of the retainer ring 403b to an inner side thereof. A plurality of grooves 403d may be formed in a circumferential shape along the shape of the retainer ring 403b. It is configured such that the fresh slurry which has not been used is replaced through the groove 403d with the slurry which has been used.

Subsequently, operations of the present step will be described.

When the wafer 200 is loaded into the polishing head 403, the slurry is supplied from the supply pipe 405 and the polishing disc 401 and the polishing head 403 are rotated. The slurry flows into the retainer ring 403b to polish a surface of the wafer 200. Such polishing can remove the concave portions 2014. After being polished for a predetermined period of time, the wafer 200 is unloaded from the polishing apparatus 400.

Figure 11:
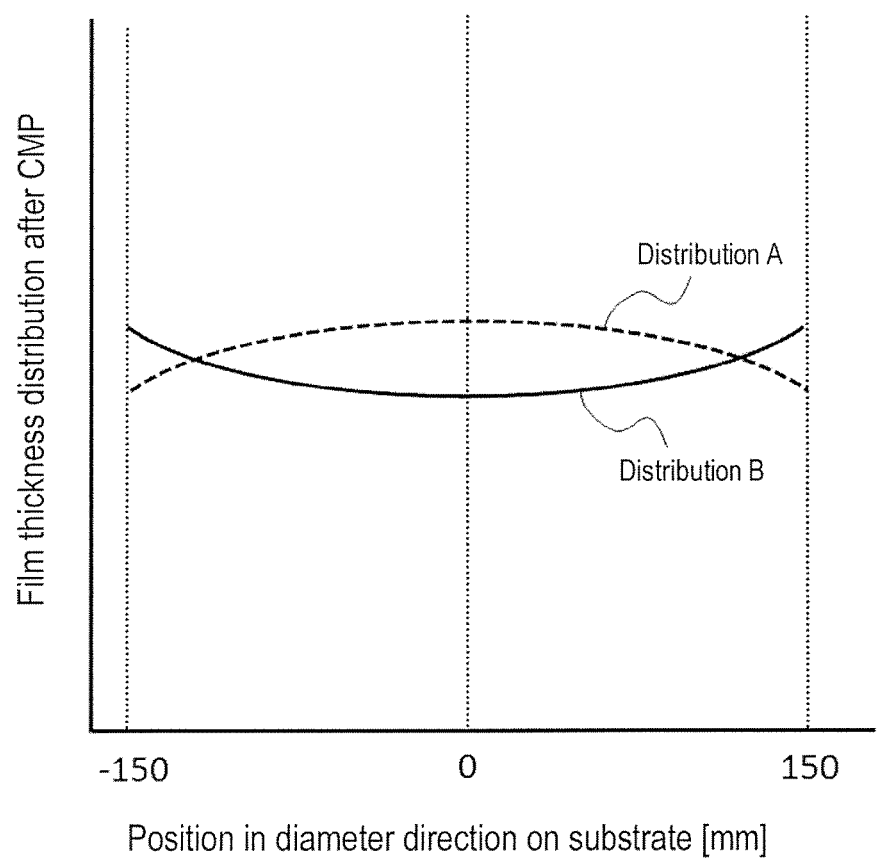
FIG. 11 is an explanatory diagram illustrating a film thickness distribution of an insulating film after a polishing process according to an embodiment.

However, it has been recognized that after this step is performed, the insulating film 2013 within the surface of the wafer 200 may have irregular heights, as shown in FIG. 11. That is, the insulating films 2013 may have uneven thickness. For example, it has been found that the wafer may have distribution A in which a film thickness of a peripheral surface of the wafer 200 is smaller than that of a central surface thereof and distribution B in which a film thickness of a central surface of the wafer 200 is smaller than that of a peripheral surface thereof.

The uneven distribution of the heights may cause a problem where heights of via holes may be varied in a patterning step, which will be described later. This affects characteristics of a metal film within the surface of the wafer 200, which results in a degradation of yield.

As to the problem above, the inventors of the present invention have found what causes each of distribution A and distribution B, which will be described hereinafter.

The cause of distribution A relates to a supply method of the slurry with respect to the wafer 200. As mentioned above, the slurry supplied to the abrasive cloth 402 is supplied to the wafer 200 via the retainer ring 403*b* from the periphery of the wafer 200. Therefore, the fresh slurry flows into the periphery of the wafer 200, while the slurry that is once used to polish the peripheral surface of the wafer 200 flows into the central surface of the wafer 200. Since the fresh slurry has high polishing efficiency, the peripheral surface of the wafer 200 is polished more than that of the central surface thereof. It has been found that this causes that a film thickness of the insulating film 2013 has distribution A.

The cause of distribution B relates to abrasion of the retainer ring 403*b*. When a large amount of wafers 200 are polished by the polishing apparatus 400, a front end of the retainer ring 403*b* pressed against the abrasive cloth 402 is abraded and the groove 403*d* or a contact surface with the abrasive cloth 402 is deformed. This may cause that the slurry may not be supplied to an inner circumference of the retainer ring 403*b* to which the slurry should be supplied. In this case, since the slurry supplied to the wafer 200 does not reach to the peripheral surface of the wafer 200, the central surface of the wafer 200 is polished while the peripheral surface thereof is not polished. It has been found that this causes that a film thickness of the insulating film 2013 has distribution B.

Accordingly, this embodiment includes the process for, after the polishing apparatus 400 polishes the insulating film 2013 on the wafer 200, adjusting heights of a stacked insulating film within the surface of the wafer 200 to be even, which will be described later. Here, the stacked insulating film refers to a film which includes the insulating film 2013 and an insulating film 2015 overlapped, which will be described later. In other words, the stacked insulating film has the insulating film 2013 as a part, and further has the insulating film 2015 as another part.

As for a specific method for adjusting the heights, after the second insulating film polishing step S107, a film thickness distribution of the insulating film 2013 is measured in a second insulating film thickness measuring step S108, and the data from the measurement is used to perform a third insulating film forming step S109. In this manner, heights of through grooves 2016 which will be described later may be adjusted in the surface of the wafer 200.

(Film Thickness Measuring Step S108)

Subsequently, a film thickness measuring step S108 will be described.

In the film thickness measuring step S108, a film thickness of the insulating film 2013 after being polished is measured using a measuring apparatus. Since a general measuring apparatus may be used for the measuring apparatus, a detailed description thereof will be omitted. The film thickness mentioned herein refers to, for example, a film thickness from a surface of the wafer 200 to a surface of the insulating film 2013.

After the polishing step S107, the wafer 200 is loaded to the measuring apparatus, The measuring apparatus measures a film thickness (height) distribution of the insulating film 2013 by measuring at least some points of the central surface and the peripheral surface of the wafer 200 that may be easily affected by the polishing apparatus 400. The measured data is transmitted to a substrate processing apparatus 100, which will be described later, through a higher apparatus. After the measurement, the wafer 200 is unloaded from the measuring apparatus.

(Third Insulating Film Forming Step S109)

Figure 12:
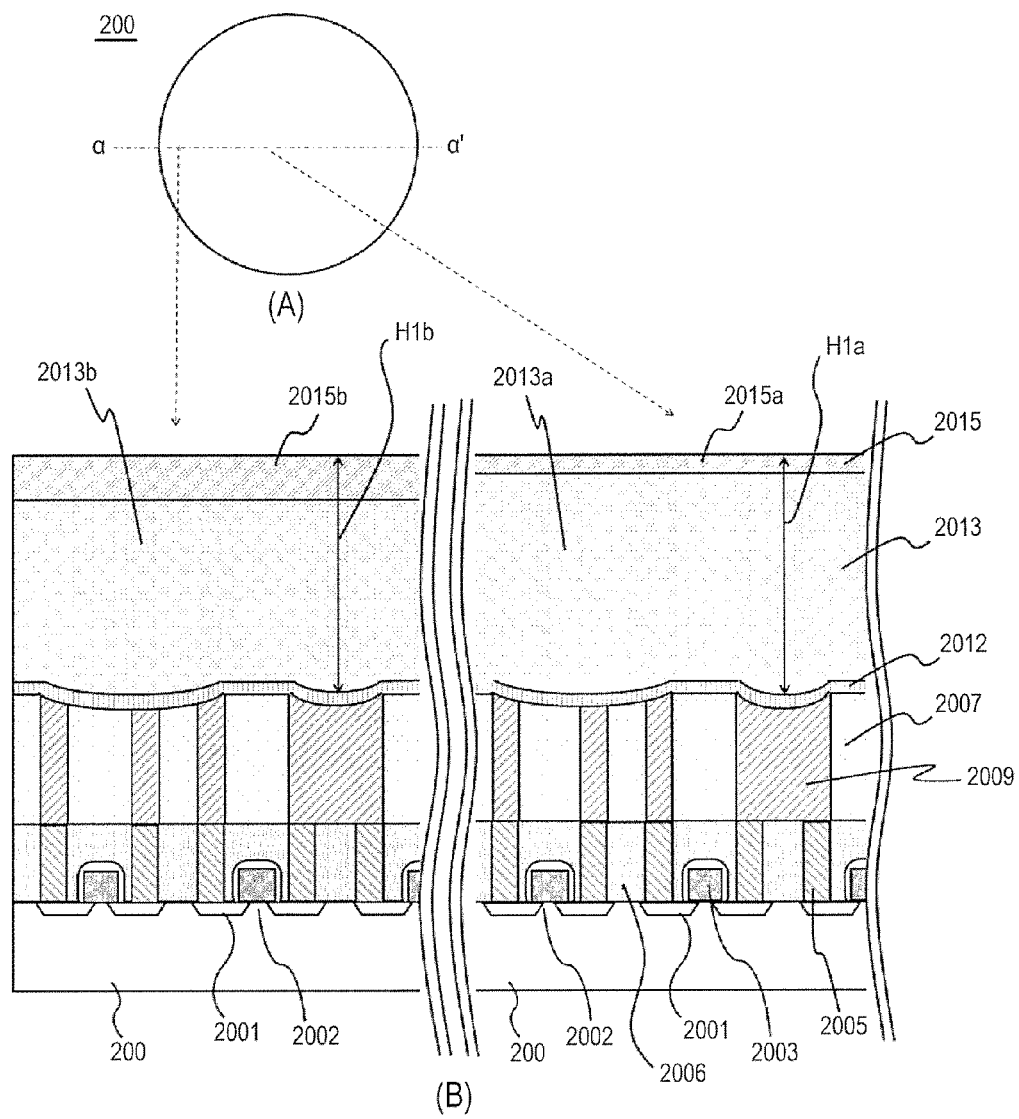
FIG. 12 is an explanatory view illustrating a process state of a wafer according to an embodiment.
Figure 14:
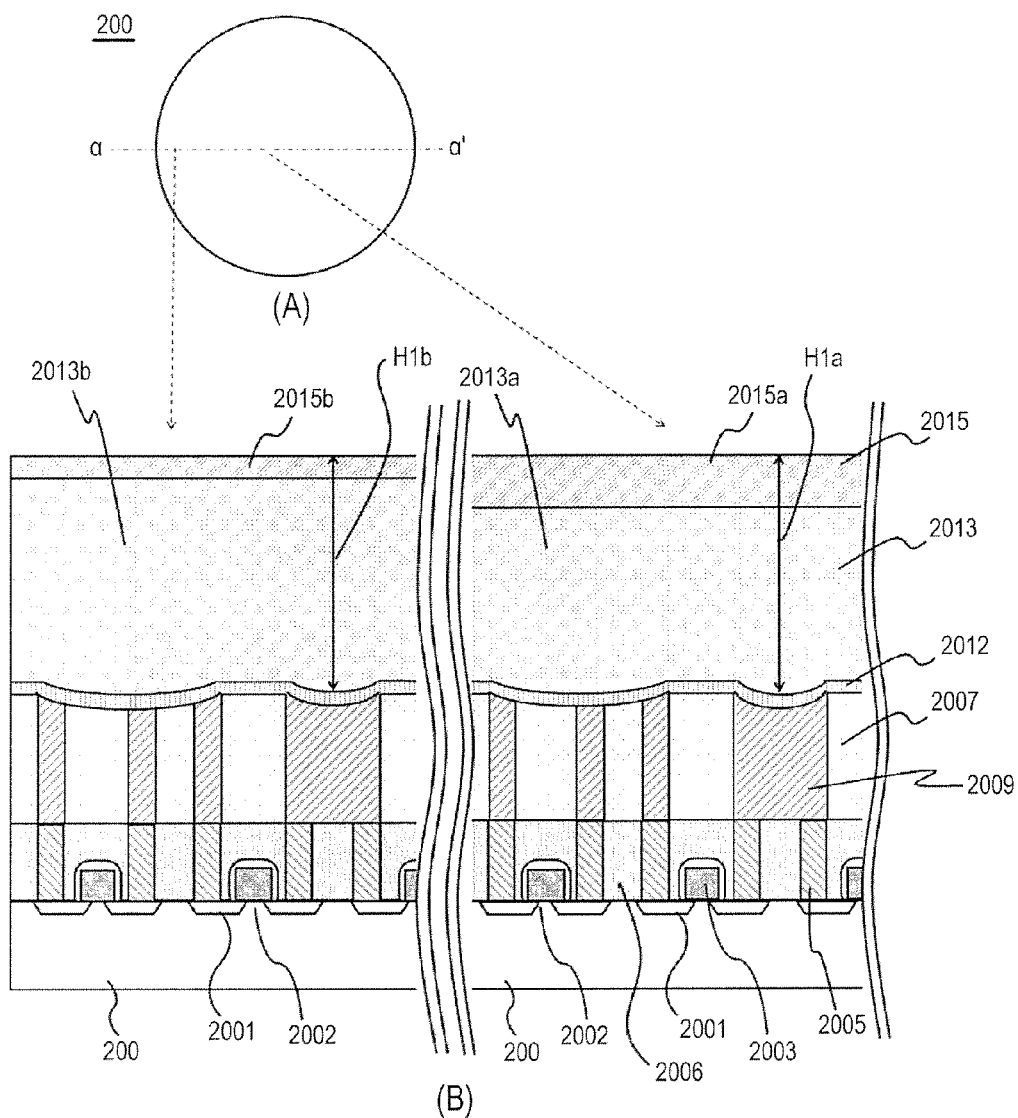
FIG. 14 is an explanatory view illustrating a process state of a wafer according to an embodiment.

Subsequently, a third insulating film forming step S109 will be described. The third insulating film has the same composition as that of the second insulating film 2013. In the present step, as illustrated in FIG. 12 or 14, the third interlayer insulating film 2015 is formed on the second insulating film first 2013 after being polished. Here, a layer formed by overlapping the second and third interlayer insulating films 2013 and 2015 refers to the stacked insulating film. Also, since the third insulating film is used to adjust a film thickness distribution of the stacked insulating film, the third insulating film may be referred to as an adjustment film.

The third interlayer insulating film 2015 is formed to regulate the film thickness distribution of the second interlayer insulating film 2013 after being polished. More preferably, the insulating film 2015 may be formed to have a regulated height of the surface of the insulating film 2015. Here, the height refers to a height at the surface of the insulating film 2015. In other words, the height refers to a distance from the surface of the water 200 to the surface of the insulating film 2015.

Further, the adjustment refers to making the film thickness of the third interlayer insulating film 2015 to have a distribution having higher uniformity than that of the second interlayer insulating film 2013.

Figure 13:
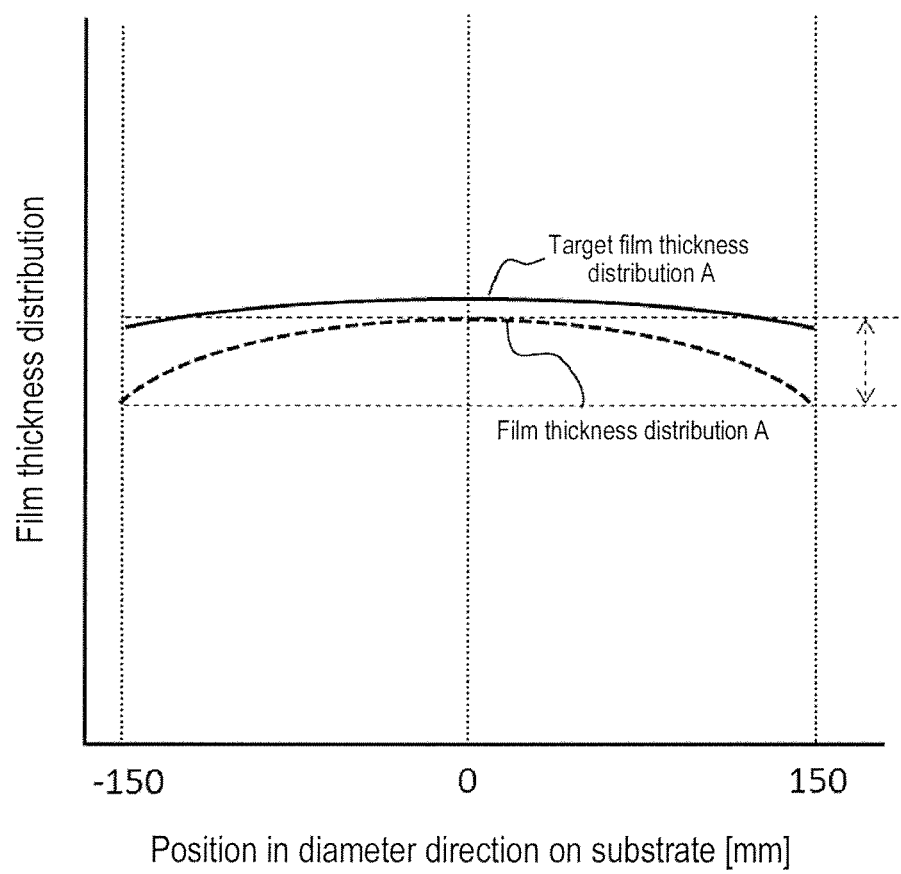
FIG. 13 is an explanatory diagram illustrating a film thickness distribution of an insulating film according to an embodiment.
Figure 15:
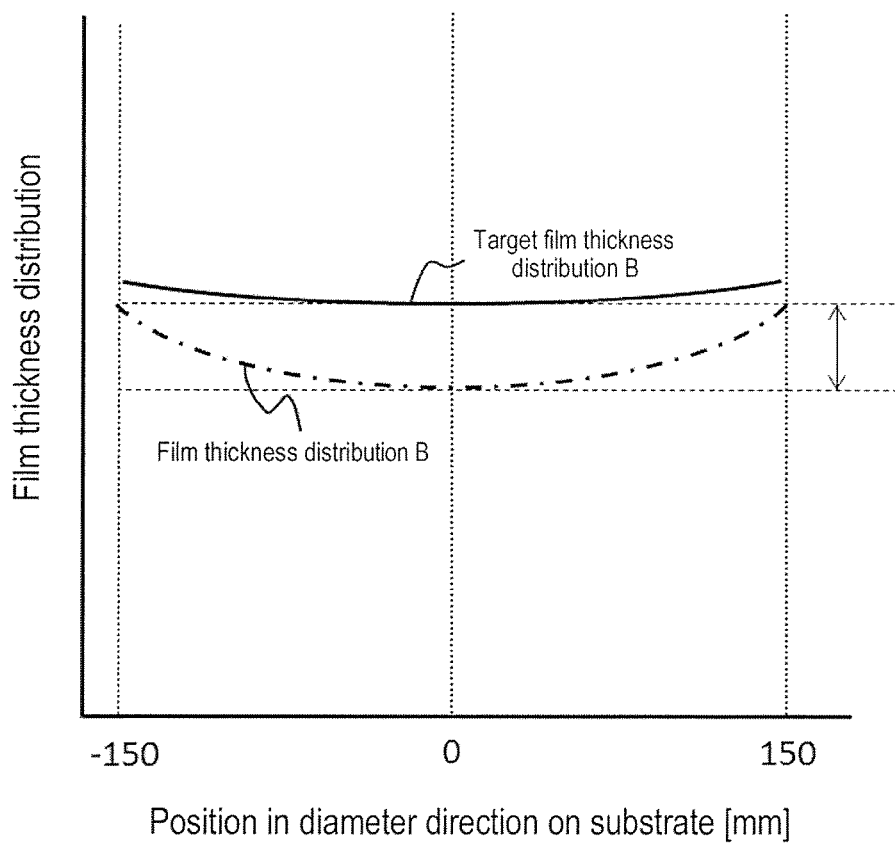
FIG. 15 is an explanatory diagram illustrating a film thickness distribution of an insulating film according to an embodiment.

Hereinafter, the present step will be described with reference to FIGS. 12 to 20. FIG. 12 illustrates the insulating film 2015 which is formed by the present step when the second interlayer insulating film 2013 has the distribution A. FIG. 13 shows the film thickness distribution A and the adjusted distribution A' (target film thickness distribution A'). FIG. 14 illustrates the insulating film 2015 which is formed by the present step when the second interlayer insulating film 2013 has distribution B. FIG. 15 shows the film thickness distribution B and the adjusted distribution B' (target film thickness distribution B') thereof. FIGS. 16 to 20 illustrate a substrate processing apparatus configured to implement the present step.

FIG. 12 illustrates a top view (A) of the wafer 200 after the insulating film 2015 is formed, and a cross-sectional view (B) of the center and outer periphery of the wafer 200 having the film thickness distribution A taken along the line α-α' in the top view (A) of the wafer 200.

FIG. 14 illustrates a top view (A) of the wafer 200 after the insulating film 2007 is formed thereon, and a cross-sectional view (B) of the center and outer periphery of the wafer 200 having the film thickness distribution B taken along the line α-α' in the top view (A) of the wafer 200.

Here, the first insulating film and the second insulating film at a center surface of the wafer 200 will be referred to as an insulating film 2013*a* and an insulating film 2015*a*, respectively. Also, the first insulating film and the second insulating film at a peripheral surface of the wafer 200 will be referred to as an insulating film 2013*b* and an insulating film 2015*b*, respectively.

Figure 16:
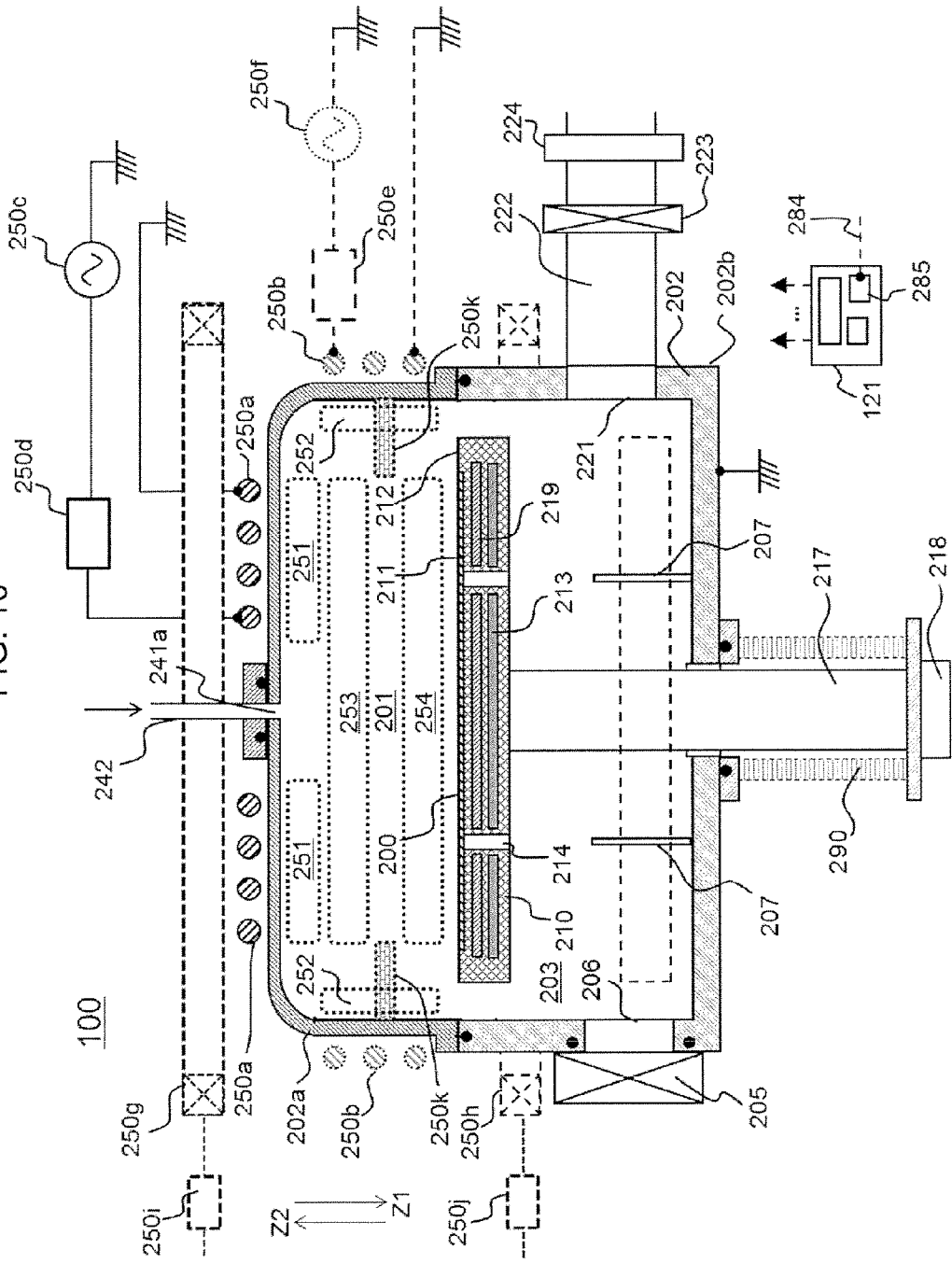
FIG. 16 is an explanatory view illustrating a substrate processing apparatus according to an embodiment.

After being unloaded from the measuring apparatus, the wafer 200 is loaded to a substrate processing apparatus 100, which is configured to form a third insulating film, as illustrated in FIG. 16.

The substrate processing apparatus 100 controls a film thickness of the insulating film 2007 within the surface of the substrate based on the measurement data obtained in the second film thickness measuring step S108. For example, when the data received from the higher apparatus indicates distribution A, the substrate processing apparatus 100 controls a film thickness such that the insulating film 2015b in the peripheral surface of the wafer 200 is so thick that the insulating film 2015a at the central surface is thinner than the insulating film 2015b at the peripheral surface. Also, when the data received from the higher apparatus indicates the distribution B, the substrate processing apparatus 100 controls a film thickness such that the insulating film 2015a at the central surface of the wafer 200 is so thick that the insulating film 2015b at the peripheral surface is thinner than the insulating film 2015a.

More preferably, the thickness of the third interlayer insulating film 2015 may be adjusted such that the stacked insulating film formed by overlapping the second and third interlayer insulating films 2013 and 2015 has a predetermined range of heights in the surface of the wafer. In other words, a film thickness distribution of the third interlayer insulating film 2015 may be adjusted such that the third interlayer insulating film 2015 has a distribution of heights within the predetermined range in the surface of the substrate.

In other words, a difference in film thicknesses of the stacked insulating film between the central side of the substrate and the peripheral side of the substrate may be adjusted to be smaller than a difference in film thicknesses of the second interlayer insulating film 2013 between the central side of the substrate and the peripheral side of the substrate.

Also, in other words, a film thickness distribution of the stacked insulating film may be adjusted to be more uniform than a film thickness distribution of the second interlayer insulating film 2013.

That is, as illustrated in FIGS. 12 and 14, a height H1a from the surface of the barrier insulating film 2012 to an upper end of the third interlayer insulating film 2015a at the central surface of the wafer 200 and a height H1b from the surface of the barrier insulating film 2012 to an upper end of the third interlayer insulating film 2015b at the peripheral surface of the wafer 200 may be adjusted.

Subsequently, the substrate processing apparatus 100 which is capable of controlling a film thickness of each of the insulating films 2015a and 2015b will be described in detail.

The substrate processing apparatus 100 according to an embodiment will be described. As illustrated in FIG. 16, the substrate processing apparatus 100 may be configured as a single-wafer type substrate processing apparatus. The substrate processing apparatus 100 may be used for at least one process for manufacturing a semiconductor device. According to the present embodiment, the substrate processing apparatus 100 is used in at least the third insulating film forming step S109.

As illustrated in FIG. 16, the substrate processing apparatus 100 includes a process vessel 202. The process vessel 202 may be made with, for example, a flat airtight vessel having a circular horizontal cross-section. The process vessel 202 may include a process space (process chamber) 201, in which the wafer 200, such as a silicon wafer, is processed as a substrate, and a transfer space 203. The process vessel 202 may include an upper vessel 202a and a lower vessel 202b. The upper vessel 202a may be formed of a non-metallic material such as, e.g., quartz or ceramic. The lower vessel 202b may be formed of a metal material such as, e.g., aluminum (Al) or stainless steel (SUS), or quartz. A space, which is provided above a substrate mounting stand 212, is referred to as the process space 201. Also, a space, which is surrounded by the lower vessel 202b and provided below the substrate mounting stand 212, is referred to as the transfer space 203.

A substrate loading/unloading port 206 is formed on a side surface of the lower vessel 202b adjacent to a gate valve 205. The wafer 200 moves into and out of the transfer space 203 through the substrate loading/unloading port 206. A plurality of lift pins 207 is installed in a bottom portion of the lower vessel 202b. Also, the lower vessel 202b is at the ground potential.

<Substrate Mounting Stand>

A substrate support part 210 configured to support the wafer 200 is installed in the process space 201. The substrate support part (susceptor) 210 mainly includes a substrate mounting surface 211 on which the wafer 200 is mounted, a substrate mounting stand 212 having the mounting surface 211 on a surface thereof, and a heater 213 as a heating part included in the substrate mounting stand 212. Through holes 214 through which the lift pins 207 pass may be formed at respective positions corresponding to the lift pins 207 in the substrate mounting stand 212.

The substrate mounting stand 212 is supported by a shaft 217. The shaft 217 passes through a bottom portion of the process vessel 202 and is connected to an elevating instrument 218 at an outside of the process vessel 202. The wafer 200 loaded on the substrate mounting surface 211 can be elevated by operating the elevating instrument 218 to elevate the shaft 217 and the substrate mounting stand 212. Further, bellows 290 encloses a lower portion of the shaft 217 such that the inside of the process vessel 202 is kept airtight.

When the wafer 200 needs to be transferred, the substrate mounting stand 212 is lowered up to a substrate support stand such that the substrate mounting surface 211 is positioned at the same level as the substrate loading/unloading port 206 (wafer transfer position). When the wafer 200 needs to be processed, the substrate mounting stand 212 is elevated until the wafer 200 reaches a processing position (wafer processing position) at the process space 201, as shown in FIG. 16.

Specifically, when the substrate mounting stand 212 is lowered to the wafer transfer position, upper end portions of the lift pins 207 protrude from an upper surface of the substrate mounting surface 211 and the lift pins 207 support the wafer 200 from below. Further, when the substrate mounting stand 212 is elevated to the wafer processing position, the lift pins 207 go under the upper surface of the substrate mounting surface 211, and the substrate mounting surface 211 supports the wafer 200 from below. In addition, since the lift pins 207 make direct contact with the wafer 200, it may be preferred to foul' the lift pins 207 with a material such as, e.g., quartz, alumina or the like. Also, an elevating instrument may be installed in the lift pins 207 to move the lift pins 207.

Figure 17:
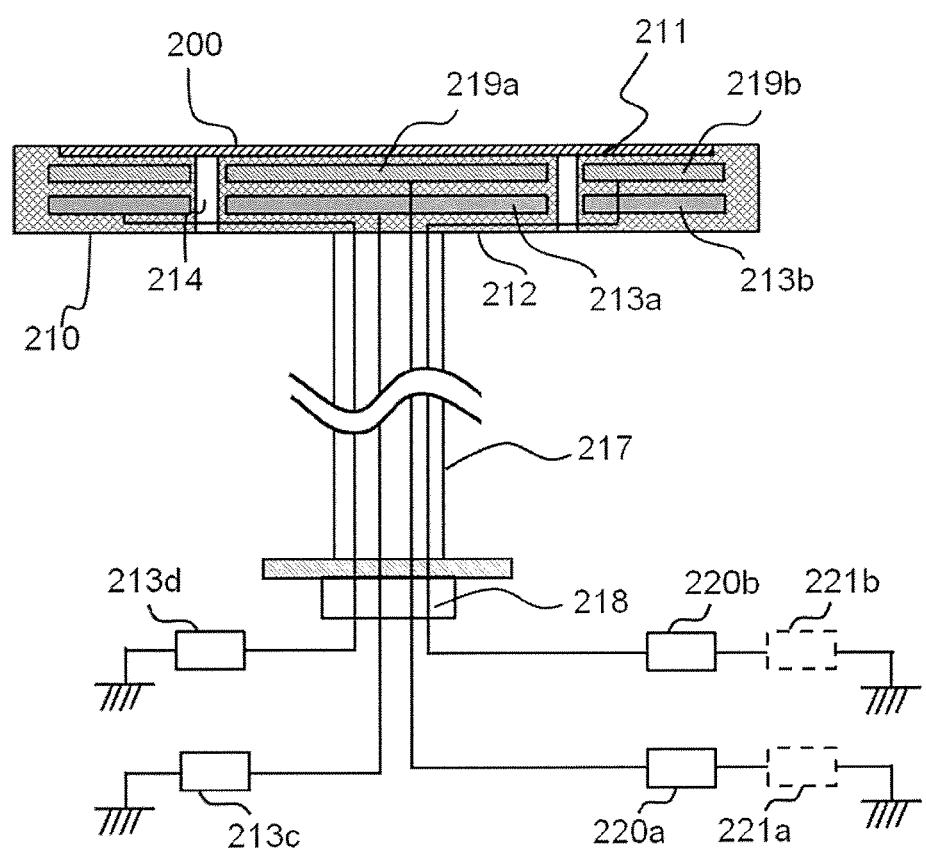
FIG. 17 is an explanatory view illustrating a substrate support part according to an embodiment.
Figure 18:
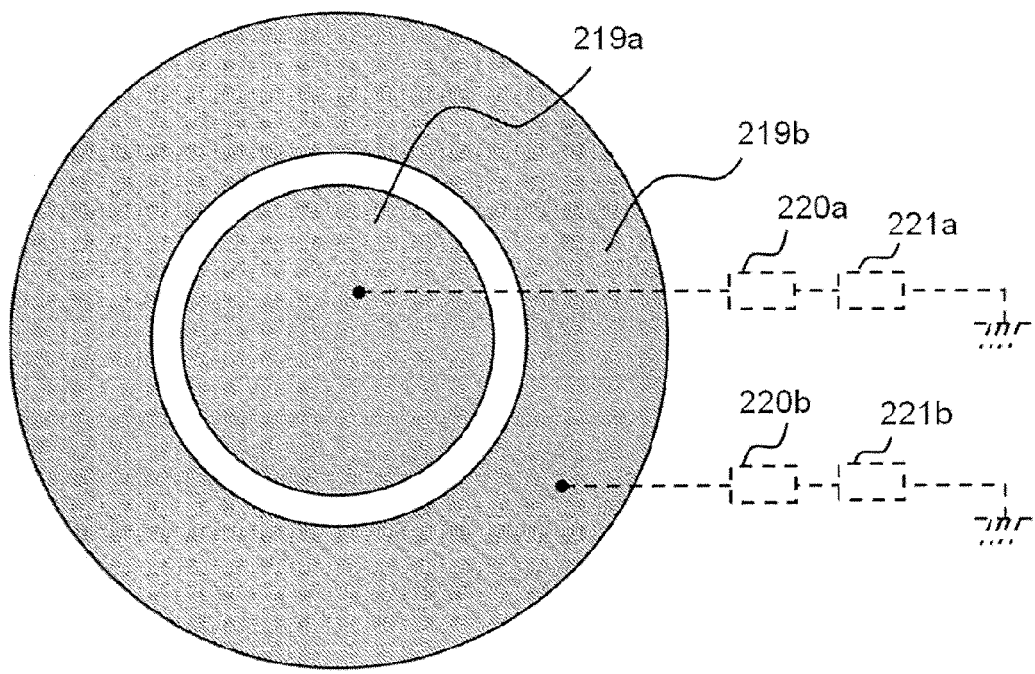
FIG. 18 is an explanatory view illustrating a substrate support part according to an embodiment.

Further, as illustrated in FIG. 17, a first bias electrode 219a and a second bias electrode 219b, which are a bias adjusting part 219 as illustrated in FIG. 16, are installed in the substrate mounting stand 212. The first bias electrode 219a is connected to a first impedance adjusting part 220a and the second bias electrode 219b is connected to a second impedance adjusting part 220b, so that an electric potential of each of the electrodes is adjustable. Also, as illustrated in FIG. 18, the first bias electrode 219a and the second bias electrode 219b are formed to make concentric circles so that electric potentials at a center side and a peripheral side of the substrate are adjustable.

In addition, a first impedance adjusting power source 221a may be installed in the first impedance adjusting part 220a, and a second impedance adjusting power source 221b may be installed in the second impedance adjusting part 220b. With the installation of the first impedance adjusting power source 221a, an adjustable range of an electric potential of the first bias electrode 219a can be extended, and an adjustable range of an amount of active species led into the center side of the wafer 200, which is the substrate, can be extended. Also, the installation of the second impedance adjusting power source 221b, an adjustable range of an electric potential of the second bias electrode 219b can be extended, and an adjustable range of an amount of active species led into the peripheral side of the wafer 200 can be extended. For example, when the active species have electrically positive potential, the first bias electrode 219a may be configured to have electrically negative potential and the second bias electrode 219b may be configured to have the electric potential higher than that of the first bias electrode 219a. This allows that an amount of the active species supplied to the center side of the wafer 200 is greater than that supplied to the peripheral side thereof. Also, when the active species generated within the process chamber 201 have the potential electrically almost neutral, an amount of the active species led into the wafer 200 may be controlled by using either or both of the first impedance adjusting power source 221a and the second impedance adjusting power source 221b.

In addition, the heater 213 is installed in the substrate processing apparatus 100 as a heating part. The heater 213, such as a first heater 213a and a second heater 213b, may be installed in each zone at the substrate support part 210. The first heater 213a may be disposed to face the first bias electrode 219a. The second heater 213b may be disposed to face the second bias electrode 219b. The first heater 213a is connected to a first heater power source 213c and the second heater 213b is connected to a second heater power source 213d so that an amount of power supplied to each heater is adjustable.

<Activation Part>

As illustrated in FIG. 16, a first coil 250a as a first activation part (upper activation part) is installed above the upper vessel 202a. The first coil 250a is connected to a first high-frequency power source 250c through a first matching box 250d. By supplying a high-frequency power to the first coil 250a, a gas supplied to the process chamber 201 may be excited to generate plasma. In particular, the plasma is generated in a space (first plasma generation region 251) which is provided above the process chamber 201 and faces the wafer 200. Also, it may be configured such that plasma is generated in a space facing the substrate mounting stand 212.

Further, as illustrated in FIG. 16, a second coil 250b as a second activation part (side activation part) is installed in sides of the upper vessel 202a. The second coil 250b may be connected to a second high-frequency power source 250f through a second matching box 250e. By supplying a high-frequency power to the second coil 250b, a gas supplied to the process chamber 201 may be excited to generate plasma. In particular, the plasma is generated in a second plasma generation region 252 which is located at the side of the process chamber and is an outer space beyond the space that faces the wafer 200. Also, it may be configured such that the plasma is generated in an outer space beyond the space facing the substrate mounting stand 212.

The present embodiment exemplary illustrates that separate matching boxes and high-frequency power sources are installed in the first activation part and the second activation part, but the present disclosure is not limited thereto and the first coil 250a and the second coil 250b may share a common matching box. Also, the first coil 250a and the second coil 250b may use a common high-frequency power source.

<Magnetic Force Generating Part (Magnetic Field Generating Part)>

As illustrated in FIG. 16, a first electromagnet (upper electromagnet) 250g as a first magnetic force generating part (first magnetic field generating part) may be installed above the upper vessel 202a. The first electromagnet 250g may be connected to a first electromagnet power source 250i for supplying power to the first electromagnet 250g. Further, the first electromagnet 250g may have a ring shape. The first electromagnet 250g may be configured to produce a magnetic force (magnetic field) in a Z1 or Z2 direction as illustrated in FIG. 16. The direction of the magnetic force (magnetic field) is controlled according to a direction of current supplied from the first electromagnet power source 250i.

In addition, a second electromagnet (side electromagnet) 250h as a second magnetic force generating part (magnetic field generating part) may be installed at a side surface of the process vessel 202, below the wafer 200. The second electromagnet 250h is connected to a second electromagnet power source 250j for supplying power to the second electromagnet 250h. The second electromagnet 250b may have a ring shape. The second electromagnet 250h may be configured to produce a magnetic force (magnetic field) in the Z1 or Z2 direction as illustrated in FIG. 16. The direction of the magnetic force (magnetic field) is controlled according to a direction of current supplied from the second electromagnet power source 250j.

A magnetic force (magnetic field) in the Z1 direction formed by either of the first and second electromagnets 250g and 250h may allow the plasma in the first plasma generation region 251 to move (to be spread) to a third plasma generation region 253 or a fourth plasma generation region 254. Further, in the third plasma generation region 253, the active species generated at the space facing the center side of the wafer 200 are more active than the active species generated in the space facing the peripheral side. This is because the gas is supplied to the center side. Also, in the fourth plasma generation region 254, the active species generated in the space facing the peripheral side of the wafer 200 is more active than that of the active species generated in the space facing the center side of the wafer 200. This is caused by that an exhaust path is formed at the peripheral side of the substrate support part 210, and thus, gas molecules are concentrated at the peripheral side of the wafer 200. The position of plasma may be controlled by using a power supplied to the first electromagnet 250g and the second electromagnet 250h. By increasing the power, the plasma may be closer to the wafer 200. Also, by forming a magnetic force (magnetic field) in the Z1 direction using the first electromagnet 250g and the second electromagnet 250h, the plasma may come to be even closer to the wafer 200. Also, by forming a magnetic force (magnetic field) in the Z2 direction, plasma formed in the first plasma generation region 251 may be suppressed from spreading toward the wafer 200, thereby lowering energy of the active species to be supplied to the wafer 200. It may be configured that the first electromagnet 250g and the second electromagnet 250h generate the magnetic field (the magnetic force) having different directions.

In addition, a magnetic blocking plate 250k may be installed between the first electromagnet 250g and the second electromagnet 250h within the process chamber 201. With the magnetic blocking plate 250k installed, the magnetic force (magnetic field) formed in the first electromagnet 250g and the magnetic force (magnetic field) formed in the second electromagnet 250h can be separated. Thus, by adjusting the respective magnetic fields, process uniformity with respect to the surface of the wafer 200 can be easily adjusted. Further, it may be configured that a height of the magnetic blocking plate 250k may be adjustable by a magnetic blocking plate elevation mechanism (not shown).
(Exhaust System)

An exhaust port 221 configured to exhaust the atmosphere of the process space 201 is formed as an exhaust part on an inner wall of the transfer space 203 (lower vessel 202b). An exhaust pipe 222 is connected to the exhaust port 221. A pressure adjuster 223 such as an auto pressure controller (APC) for controlling the interior of the process space 201 to a predetermined pressure, and a vacuum pump 224 are serially connected to the exhaust pipe 222 in this order. An exhaust system (exhaust line) is configured with the exhaust port 221, the exhaust pipe 222 and the pressure adjuster 223. Also, the exhaust system (exhaust line) may be configured to further include the vacuum pump 224.
<Gas Introduction Hole>

A gas introduction hole 241a configured to supply various gases into the process space 201 is formed in an upper portion of the upper vessel 202a. A common gas supply pipe 242 is connected to the gas introduction hole 241a.
<Gas Supply Part>

Figure 19:
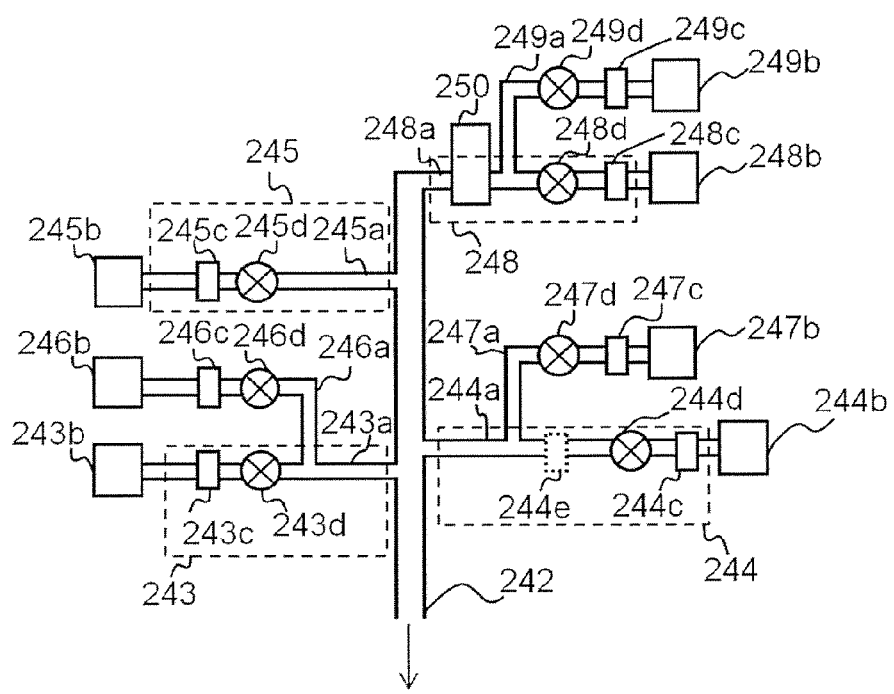
FIG. 19 is an explanatory view illustrating a gas supply part according to an embodiment.

As illustrated in FIG. 19, a first gas supply pipe 243a, a second gas supply pipe 244a, a third gas supply pipe 245a, and a cleaning gas supply pipe 248a are connected to the common gas supply pipe 242.

A first element-containing gas (a first process gas) is supplied from a first gas supply part 243 including the first gas supply pipe 243a. A second element-containing gas (a second process gas) is supplied from a second gas supply part 244 including the second gas supply pipe 244a. A purge gas is supplied from a third gas supply part 245 including the third gas supply pipe 245a. A cleaning gas is supplied from a cleaning gas supply part 248 including the cleaning gas supply pipe 248a. A process gas supply part configured to supply a process gas may include either or both of the first process gas supply part and the second process gas supply part. The process gas may include either or both of the first process gas and the second process gas.
(First Gas Supply System)

A first gas supply source 243b, a mass flow controller (MFC) 243c, which is a flow rate controller (a flow rate control part), and a valve 243d, which is an opening/closing valve, are installed in the first gas supply pipe 243a in this order from an upstream direction.

A gas containing a first element (a first process gas) is supplied from the first gas supply source 243b to the gas introduction hole 241a via the MFC 243c, the valve 243d, the first gas supply pipe 243a, and the common gas supply pipe 242.

The first process gas is a precursor gas, which is one of process gases.

Here, the first element may be, for example, silicon (Si). That is, the first process gas may be a silicon-containing gas. In one embodiment, the silicon-containing gas, for example, may be a disilane ($Si_2H_6$) gas. In another embodiment, the silicon-containing gas may be TEOS (Tetraethyl orthosilicate, $Si(OC_2H_5)_4$), bistertiary butyl aminosilane ($SiH_2)(NH(C_4H_9))_2$, abbreviation: BTBAS), a tetrakisdimethylaminosilane (($Si[N(CH_3)_2]_4$, abbreviation: 4DMAS) gas, a bisdiethylaminosilane (($Si[N(C_2H_5)_2]_2H_2$, abbreviation: 2DEAS) gas, or the like, and hexamethyldisilazan ($C_6H_{19}NSi_2$, abbreviation: HMDS), trisilylamine (($SiH_3)_3N$, abbreviation: TSA), hexachlorodisilane ($Si_2Cl_6$, abbreviation: HCDS), or the like. Further, a precursor of the first process gas may be any one of a solid, a liquid, and a gas at room temperature and normal pressure. When the precursor of the first process gas is a liquid at room temperature and normal pressure, a vaporizer (not shown) may be installed between the first gas supply source 243b and the MFC 243c. In the present embodiment, the precursor is a gas.

A downstream end of a first inert gas supply pipe 246a is connected to the first gas supply pipe 243a at a position further down from a downstream end of the valve 243d. An inert gas supply source 246b, an MFC 246c, and a valve 246d, which is an opening/closing valve, are installed in the first inert gas supply pipe 246a in this order from the upstream direction.

In the present embodiment, the inert gas may be a helium (He) gas. In other embodiments, the inert gas may be a rare gas such as e.g., a neon (Ne) gas or an argon (Ar) gas. Also, the inert gas may be a gas that hardly reacts with the process gas, the wafer 200, or a film to be formed. In some embodiments, a nitrogen ($N_2$) gas may be used.

The first gas supply part 243 (also referred to as a silicon-containing gas supply part) may be configured with the first gas supply pipe 243a, the MFC 243c, and the valve 243d.

Further, a first inert gas supply part may be configured with the first inert gas supply pipe 246a, the MFC 246c, and the valve 246d. Also, the inert gas supply source 246b and the first gas supply pipe 243a may be included in the first inert gas supply part.

In addition, the first gas supply source 243b and the first inert gas supply part may be included in the first gas supply part.
(Second Gas Supply System)

A second gas supply source 244b, an MFC 244c, and a valve 244d, which is an opening/closing valve, are installed at an upstream side of the second gas supply pipe 244a in this order from the upstream direction.

A gas containing a second element (hereinafter, referred to as a "second process gas") is supplied from the second gas supply source 244b to the gas rectifying part 234 via the MFC 244c, the valve 244d, the second gas supply pipe 244a, and the common gas supply pipe 242.

The second process gas is one of the process gases. Also, the second process gas may be a reaction gas or a reformation gas.

In the present embodiment, the second process gas contains a second element different from the first element. For example, the second element may be any one of nitrogen (N), oxygen (O), carbon (C), and hydrogen (H). In some embodiments, the second process gas may be a gas containing a plurality of the above elements. Specifically, an oxygen ($O_2$) gas may be used as the second process gas.

The second process gas supply part 244 may be configured with the second gas supply pipe 244a, the MFC 244c, and the valve 244d.

In addition, a remote plasma unit (RPU) 244e configured to activate the second process gas may be installed as the activation part.

Further, a downstream end of the second inert gas supply pipe 247a is connected to the second gas supply pipe 244a at a position further down from a downstream end of the valve 244d. An inert gas supply source 247b, an MFC 247c, and a valve 247d, which is an opening/closing valve, are installed in the second inert gas supply pipe 247a in this order from the upstream direction.

An inert gas is supplied from the second inert gas supply pipe 247a to the gas rectifying part 234 via the MFC 247c and the valve 247d through the second inert gas supply pipe 247a. The inert gas acts as a carrier gas or a dilution gas in the thin film forming step S109, in particular steps S4001 to S4005 which will be described later.

A second inert gas supply part may be configured with the second inert gas supply pipe 247a, the MFC 247c, and the valve 247d. Also, the inert gas supply source 247b and the second gas supply pipe 244a may be included in the second inert gas supply part.

Further, the second gas supply source 244b and the second inert gas supply part may be included in the second element-containing gas supply part 244.

(Third Gas Supply System)

A third gas supply source 245b, an MFC 245c, which is a flow rate controller (flow rate control part), and a valve 245d, which is an opening/closing valve, are installed in the third gas supply pipe 245a in this order from the upstream direction.

An inert gas as a purge gas is supplied from the third gas supply source 245b to the gas rectifying part 234 via the MFC 245c and the valve 245d, through the third gas supply pipe 245a and the common gas supply pipe 242.

In the present embodiment, the inert gas is, for example, a nitrogen ($N_2$) gas. In other embodiments, the inert gas may be a rare gas such as a He gas, a neon (Ne) gas, or an argon (Ar) gas.

The third gas supply part 245 (also referred to as a purge gas supply part) may be configured with the third gas supply pipe 245a, the MFC 245c, and the valve 245d.

<Cleaning Gas Supply Part>

A cleaning gas source 248b, an MFC 248c, a valve 248d, and an RPU 250 are installed in the cleaning gas supply pipe 248a in this order from the upstream direction.

A cleaning gas is supplied from the cleaning gas source 248b to the gas rectifying part 234 via the MFC 248c, the valve 248d, and the RPU 250, through the cleaning gas supply pipe 248a and the common gas supply pipe 242.

A downstream end of the fourth inert gas supply pipe 249a is connected to the cleaning gas supply pipe 248a at a position further down from a downstream end of the valve 248d. A fourth inert gas supply source 249b, an MFC 249c, and a valve 249d are installed in the fourth inert gas supply pipe 249a in this order from the upstream direction.

Further, a cleaning gas supply part may be configured with the cleaning gas supply pipe 248a, the MFC 248c, and the valve 248d. Also, the cleaning gas source 248b, the fourth inert gas supply pipe 249a, and the RPU 250 may be included in the cleaning gas supply part.

Also, an inert gas supplied from the fourth inert gas supply source 249b may act as a carrier gas or a dilution gas of the cleaning gas.

In the cleaning step, a cleaning gas supplied from the cleaning gas source 248b acts as a cleaning gas to remove by-products or the like attached to the gas rectifying part 234 or the process chamber 201.

Here, the cleaning gas is, e.g., a nitrogen trifluoride ($NF_3$) gas. Also, as the cleaning gas, for example, a hydrogen fluoride (HF) gas, a chlorine trifluoride ($ClF_3$) gas, a fluorine ($F_2$) gas, or the like may be used, or any combination thereof may also be used.

Further, it is preferable to configure the flow rate control part installed in each of the gas supply parts described above to have high responsiveness to a gas flow, such as a needle valve or an orifice. For example, when a pulse width of a gas is in the order of milliseconds, an MFC may not be able to respond, but the needle valve or the orifice combined with a high speed ON/OFF valve may respond to the gas pulse of milliseconds or less.

<Control Part>

As illustrated in FIG. 16, the substrate processing apparatus 100 includes a controller 121 configured to control the operations of respective parts of the substrate processing apparatus 100.

Figure 20:
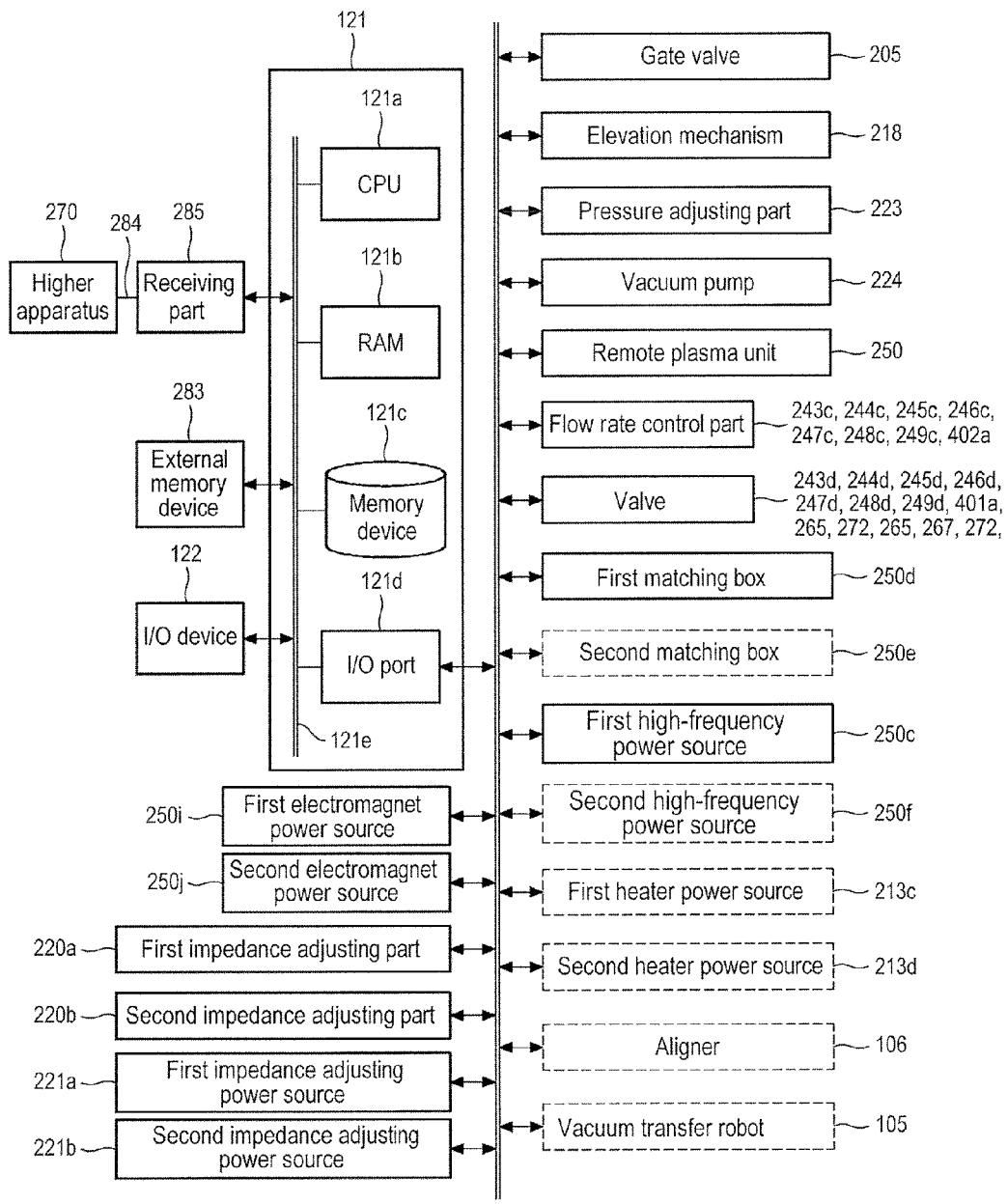
FIG. 20 is a block diagram illustrating a schematic configuration of a controller according to an embodiment.

As illustrated in FIG. 20, the controller 121 serving as a control part (control means) may be a computer including a central processing unit (CPU) 121a, a random access memory (RAM) 121b, a memory device 121c, and an I/O port 121d. The RAM 121b, the memory device 121c, and the I/O port 121d are configured to exchange data with the CPU 121a via an internal bus 121e. An input/output device 122 configured as, e.g., a touch panel or the like, an external memory device 283, a receiving part 285, and the like are connected to the controller 121. In addition, the receiving part 285 is provided to be connected to a higher apparatus 270 through a network 284. The receiving part 285 may receive information of other apparatus from the higher apparatus 270.

The memory device 121c may include a flash memory, a hard disc drive (HDD), or the like. The memory device 121c readably stores therein a control program for controlling operations of the substrate processing apparatus, a program recipe having a sequence, condition, or the like for a substrate processing, which will be described later. In addition, the process recipe may be a combination of sequences of a substrate processing process described later, and each sequence may be implemented by the controller 121 to obtain a desired result. The process recipe may function as a program. Hereinafter, the program recipe, the control program, or the like may be generally referred to simply as a program. Further, when the term program is used in the present disclosure, it should be understood as including the program recipe, the control program, or both the program recipe and the control program. Also, the RAM 121b is configured as a memory area (work area) in which a program, data, or the like read by the CPU 121a is temporarily stored.

The I/O port 121d may be connected to the gate valve 205, the elevating instrument 218, the pressure adjuster 223, the vacuum pump 224, the RPU 250, the MFCs 243c, 244c, 245c, 246c, 247c, 248c, and 249c, the valves 243d, 244d, 245d, 246d, 247d, 248d, and 249d, the first matching box 250d, the second matching box 250e, the first high-frequency power source 250c, and the second high-frequency power source 250f. The I/O port 121d may be further connected to the first impedance adjusting part 220a, a second impedance adjusting part 220b, a first impedance adjusting power source 221a, the second impedance adjusting power source 221b, the first electromagnet power source 250i, and the second electromagnet power source 250j. The I/O port 121d may be further connected to the first heater power source 213c, the second heater power source 213d, and the like.

The CPU 121a is configured to read and execute the control program from the memory device 121c. The CPU 121a may read the process recipe from the memory device 121c according to, for example, an operation command input from the input/output device 122. Further, the CPU 121a is configured to control, according to the read process recipe, control of the opening/closing operation of the gate valve 205, the elevation operation of the elevating instrument 218, the pressure adjustment operation by the pressure adjuster 223, the ON/OFF control of the vacuum pump 224, the gas excitation operation of the RPU 250, the flow rate adjustment operation of the MFCs 243c, 244c, 245c, 246c, 247c, 248c, and 249c, and/or the ON/OFF control of gas from the valves 243d, 244d, 245d, 246d, 247d, 248d, and 249d. The CPU 121a is further configured to conduct, according to the read process recipe, the matching control of the first matching box 250d and the second matching box 250e, the ON/OFF control of the first high-frequency power source 250c and the second high-frequency power source 250f, the impedance adjustment of the first impedance adjusting part 220a and the second impedance adjusting part 220b, the ON/OFF control of the first impedance adjusting power source 221a and the second impedance adjusting power source 221b, the power control of the first electromagnet power source 250i and the second electromagnet power source 250j, and/or the power control of the first heater power source 213c and the second heater power source 213d.

In addition, the controller 121 is not limited to being configured as a dedicated computer, and may be configured as a general-purpose computer. For example, the controller 121 of the present embodiment may be configured by installing the program on the general-purpose computer using the external memory device 283 using the external memory device 283 storing the program as described above (e.g., a magnetic tape, a magnetic disc such as a flexible disc or a hard disc, an optical disc such as a compact disc (CD) or a digital versatile disc (DVD), a magneto-optical (MO) disc, or a semiconductor memory such as a universal serial bus (USB) memory or a memory card). Further, any others than the external memory device 283 may be used for supplying the program to the computer. For example, the program may be supplied using a communication means such as the Internet or a dedicated line, rather than through the external memory device 283. Also, the memory device 121c or the external memory device 283 may be configured as a non-transitory computer-readable recording medium. Hereinafter, these will be generally referred to simply as "a recording medium." Additionally, when the term "recording medium" is used in the present disclosure, it may be understood as including the memory device 121c, the external memory device 283, or both the memory device 121c and the external memory device 283.

Further, although it is described in the present embodiment that the receiving part receives information of other apparatus from the higher apparatus 270 has been described, this is not limited thereto. For example, the receiving part may receive information directly from other apparatus, rather than through the higher apparatus 270. Also, the input/output device 122 may receive information of other apparatus to be used for the controls. Also, the external memory device 283 may store therein information of other apparatus and provide it when it is needed.

Figure 21:
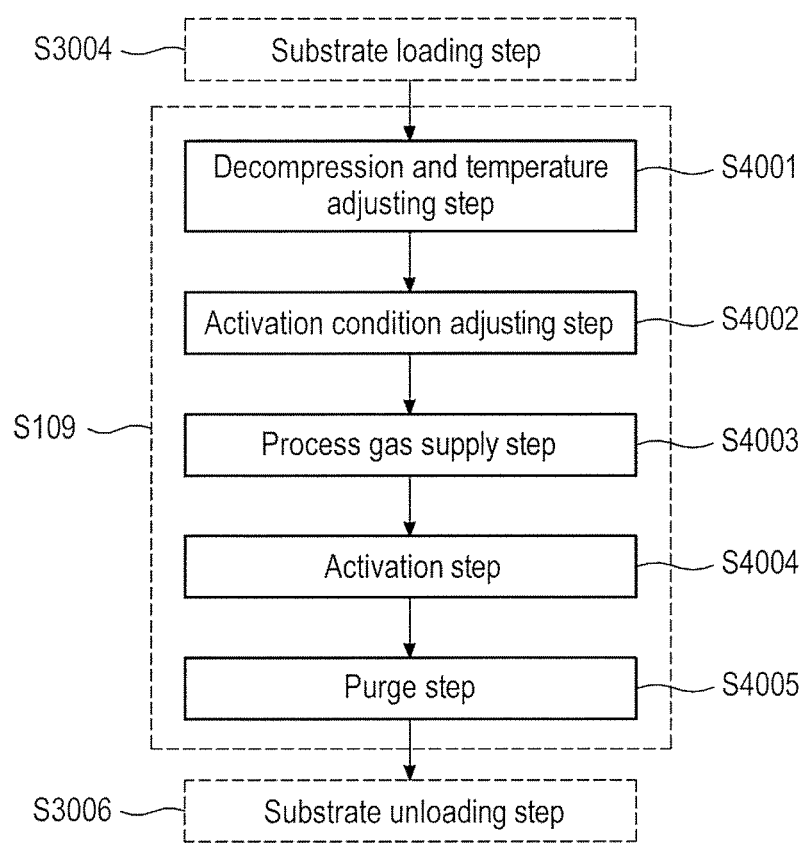
FIG. 21 is a flowchart illustrating a process of processing a substrate according to an embodiment.

Subsequently, a method of forming a film using the substrate processing apparatus 100 will be described with reference to FIGS. 21 and 22.

After the film thickness measuring step S108, the measured wafer 200 is loaded to the substrate processing apparatus 100. Further, in the following description, the operations of respective parts of the substrate processing apparatus are controlled by the controller 121.

<Substrate Loading Step S3004>

After the measurement of the first insulating film 2013 in the film thickness measuring step S108, the wafer 200 is loaded to the substrate processing apparatus 100. Specifically, the substrate support part 210 is lowered by the elevation mechanism 218 so that the lift pins 207 protrude from the through holes 214 toward an upper surface side of the substrate support part 210. Also, after an internal pressure of the process chamber 201 is adjusted to a predetermined pressure, the gate valve 205 is opened and the wafer 200 is loaded from the gate valve 205 over the lift pins 207. After the wafer 200 is loaded over the lift pins 207, the substrate support part 210 is elevated to a predetermined position by the elevating instrument 218 and the wafer 200 is loaded from the lift pins 207 on the substrate support part 210. In the present embodiment, as to the predetermined pressure in the present embodiment, an internal pressure of the process chamber 201 may be set to be greater than or equal to that of the vacuum transfer space 203.

<Decompression and Temperature Adjusting Step S4001>

The interior of the process chamber 201 is exhausted through the exhaust pipe 222 such that the interior of the process chamber 201 reaches a predetermined pressure (degree of a vacuum). At this time, a degree of valve opening of an APC valve is feedback-controlled by the pressure adjuster 223 based on a pressure measured by a pressure sensor. Further, based on a temperature value detected by a temperature sensor (not shown), an amount of current supplied to the heater 213 is feedback-controlled such that the interior of the process chamber 201 is set to be a predetermined temperature. Specifically, the substrate support part 210 is preheated by the heater 213, and then left for a predetermined period of time until temperature variation in the wafer 200 or the substrate support part 210 disappears. During this period, when moisture remains in the process chamber 201, or degassing occur from a member, these may be removed by vacuum-exhausting or purge by supplying a $N_2$ gas. With the above processes, a preparation before a film forming process is completed. In some embodiments, when the interior of the process chamber 201 is exhausted to a predetermined pressure, the interior of the process chamber 201 may be vacuum-exhausted once up to a maximum degree of vacuum, which can be reached.

Further, in the present embodiments, the first heater 213a and the second heater 213b may be configured to adjust temperatures based on received data. By setting temperatures of the center side and the peripheral side of the wafer 200 differently, the center side and the peripheral side of the wafer 200 may be processed differently.

In addition, when an nth layer of insulating film is formed, it may be preferable to control a temperature of the substrate to be lower than when a (n−1)th layer of the insulating film is formed. In case where more layers of the insulating film are formed, processing those layers with a higher temperature than when the (n−1)th layer of the insulating film is formed can suppress a metal film between the (n−1)th layer of the insulating film and the respective layer of the insulating film, a metal film embedded in the respective insulating film, from spreading to the layers of the insulating film.

<Activation Condition Adjusting Step S4002>

Subsequently, adjustment (tuning) of at least one of Embodiments A to C as given below is performed. FIG. 22 illustrates Embodiment A.

[Embodiment A]

The first electromagnet power source 250*i* and the second electromagnet power source 250*j* supply a predetermined power to the first electromagnet 250*g* and the second electromagnet 250*h*, respectively, to form a predetermined magnetic force (magnetic field) within the process chamber 201. For example, the magnetic force (magnetic field) may be formed in the Z1 direction. At this time, a magnetic field or a magnetic flux density formed above the center or the periphery of the wafer 200 may be tuned based on received measurement data. The magnetic force (magnetic field) or the magnetic flux density may be turned based on strength of a magnetic field formed in the first electromagnet 250*g* and strength of a magnetic field formed in the second electromagnet 250*h*. Such tuning allows a greater amount of active species (concentration of activity species) led into the center side of the wafer 200 than an amount of active species (concentration of active species) led into the peripheral side of the substrate, so that throughput of the center side of the wafer 200 may be greater than that of the peripheral side.

In some embodiments, when the magnetic blocking plate 250*k* is installed in the process chamber 201, a height of the magnetic blocking plate 250*k* may be tuned. By adjusting the height of the magnetic blocking plate 250*k*, a magnetic field or a magnetic flux density may be tuned.

[Embodiment B]

An electric potential of each of the first bias electrode 219*a* and the second bias electrode 219*h* is adjusted. For example, the first impedance adjusting part 220*a* and the second impedance adjusting part 220*b* are adjusted such that the electric potential of the first bias electrode 219*a* is lower than that of the second bias electrode 219*b*. By adjusting the electric potential of the first bias electrode 219*a* to be lower than that of the second bias electrode 219*b*, an amount of active species (concentration of active species) led into the center side of the wafer 200 may be greater than that led into the peripheral side, so that throughput in the center side of the wafer 200 may be greater than that in the peripheral side thereof.

[Embodiment C]

A setting value for a high-frequency power supplied to each of the first coil 250*a* and the second coil 250*b* is adjusted. For example, setting values for the first high-frequency power source 250*c* and the second-high frequency power source 250*f* are adjusted (varied) such that a high-frequency power supplied to the first coil 2520*a* is greater than that supplied to the second coil 250*b*. By adjusting the high-frequency power supplied to the first coil 2520*a* to be greater than that supplied to the second coil 250*b*, an amount of active species (concentration of active species) supplied to the center side of the wafer 200 may be greater than that supplied to the peripheral side, so that throughput in the center side of the wafer 200 may be greater than that in the peripheral side thereof With any one or more of Embodiments A to C, a process temperature for forming a (n+1)th insulating film may be adjusted to be lower than a temperature for forming an nth insulating film. According to this, a metal film present between the layers of the insulating film, a metal film embedded in each of the insulating films may be suppressed from spreading to the layer of the insulating film.

<Process Gas Supply Step S4003>

Subsequently, a silicon element-containing gas as the first process gas is supplied into the process chamber 201 from the first process gas supply part. Further, the exhaust system is controlled to continue to exhaust the interior of the process chamber 201 such that an internal pressure of the process chamber 201 has a predetermined pressure (a first pressure). Specifically, the valve 243*d* of the first gas supply pipe 243*a* is opened to allow the silicon element-containing gas to flow to the first gas supply pipe 243*a*. The flow rate of the silicon element-containing gas is adjusted by the MFC 243*c*. The silicon element-containing gas with the adjusted flow rate is supplied into the process chamber 201 from the gas introduction hole 241*a* and is exhausted from the exhaust pipe 222. Also, at this time, the valve 246*d* of the first inert gas supply pipe 246*a* may be opened to allow an argon (Ar) gas to flow to the first inert gas supply pipe 246*a*. The Ar gas may flow from the first inert gas supply pipe 246*a* and a flow rate of the Ar gas may be adjusted by the MFC 246*c*. The Ar gas with the adjusted flow-rate is mixed with the silicon element-containing gas within the first gas supply pipe 243*a*, and then be supplied into the process chamber 201 through the gas introduction hole 241*a* and exhausted through the exhaust pipe 222.

<Activation Step S4004>

Subsequently, an oxygen-containing gas as the second process gas is supplied into the process chamber 201 from the second process gas supply part. Further, the exhaust system is controlled to continue to exhaust the interior of the process chamber 201 such that an internal pressure of the process chamber 201 has a predetermined pressure. Specifically, the valve 244*d* of the second gas supply pipe 244*a* is opened to allow an oxygen-containing gas to flow to the second gas supply pipe 244*a*. A flow rate of the oxygen-containing gas is adjusted by the MFC 244*c*. The oxygen-containing gas with the adjusted flow rate is supplied into the process chamber 201 from the gas introduction hole 241*a* and exhausted through the exhaust pipe 222. At this time, when a high-frequency power is supplied to the first coil 250*a* from the first high-frequency power source 250*c* through the first matching box 250*d*, the oxygen element-containing gas in the process chamber 201 is activated. At this time, oxygen-containing plasma may be generated in at least any one of the first plasma generation region 251, the third plasma generation region 253, and the fourth plasma generation region 254, and activated oxygen is supplied to the wafer 200. It may be preferable that active species having different concentrations are supplied to the center side and the peripheral side of the wafer 200. For example, by adjusting a magnitude of a magnetic field in the second electromagnet 250*h* to be greater than that of a magnetic field formed in the first electromagnet 250*g*, plasma density at the peripheral side of the fourth plasma generation region 254 may be higher than that at the center side thereof. In this case, active plasma may be generated above the peripheral side of the wafer 200, compared with above the center side of the wafer 200.

The state where the oxygen-containing plasma is generated is maintained for a predetermined period of time and a predetermined process is performed on the substrate.

Also, it may be configured such that a difference in electric potential between the first bias electrode 219*a* and the second bias electrode 219*b* causes different concentrations of active species in the center side and the peripheral side.

Also, at this time, oxygen-containing plasma may be generated in the second plasma generation region 252 by supplying a high-frequency power from the second high-frequency power source 250*f* to the second coil 250*b* via the second matching box 250*e*.

<Purge Step S4005>

In a state where the oxygen-containing plasma is generated, after a predetermined period of time has lapsed, a high-frequency power is turned off to lose plasma. At this time, the supply of the silicon element-containing gas and the supply of the oxygen-containing gas may be stopped or may continue for a predetermined period of time. After the supply of the silicon element-containing gas and the oxygen-containing gas is stopped, a gas remaining in the process chamber 201 is exhausted through the exhaust part. At this time, it may be configured such that the inert gas is supplied from the inert gas supply part into the process chamber 201 to push out the remaining gas. This configuration may reduce a time duration of the purge step and enhance throughput.

<Substrate Unloading Step S3006>

After the purge step S4005, a substrate unloading step S3006 is performed and the wafer 200 is unloaded from the process chamber 201. Specifically, the interior of the process chamber 201 is purged with an inert gas and adjusted to be in a pressure in which the wafer is transferable. After the pressure adjustment, the substrate support part 210 is lowered by the elevating instrument 218 and the lift pins 207 protrude from the through holes 214, so that the wafer 200 is loaded over the lift pins 207. After the wafer 200 is loaded over the lift pins 207, the gate valve 205 is opened and the wafer 200 is unloaded from the process chamber 201.

Subsequently, a method for controlling a film thickness of the third interlayer insulating film 2015 by using the apparatus of the present embodiment will be described. As described above, after the polishing step S107 is completed, the second interlayer insulating film 2013 has different film thicknesses at the central surface and at the peripheral surface of the wafer 200. In the film thickness measuring step S108, a film thickness distribution of the second interlayer insulating film 2013 is measured. The measurement result is stored in the RAM 121b through the higher apparatus 270. The stored data is compared with a recipe within the memory device 121c and the CPU 121a computes predetermined processing data. The processing data is used to control the apparatus.

Next, provided below describes when the data stored in the RAM 121b relates to distribution A will be described. Distribution A refers to when the insulating film 2013a is thicker than the insulating film 2013b as illustrated in FIGS. 11 and 12.

In case of distribution A, the present process adjusts a film thickness of the insulating film 2015b formed in the peripheral surface of the wafer 200 to be large and adjusts a film thickness of the insulating film 2015a formed in the central surface of the wafer 200 to be smaller than that of the insulating film 2015b. Specifically, by controlling a magnetic force generated by the second electromagnet 250h to be greater than magnetic force generated by the first electromagnet 250g, plasma density in the fourth plasma generation region 254 may become higher than plasma density in the third plasma generation region 253 and active plasma may be generated at the portion above the peripheral side of the wafer 200, compared with the portion above the center side. By performing a process in the state where the plasma is generated in this manner, a height of the overlapping insulating film 2015 and insulating film 2013 may be adjusted to be a target film thickness distribution A' as illustrated in FIG. 13. That is, a film thickness of the stacked insulating film may be adjusted to be the same as the film thickness distribution A'.

At this time, the thickness of the insulating film 2015 is controlled such that a thickness H1b of the overlapping insulating films 2013b and 2015b and a thickness H1 of the overlapping insulating films 2013a and 2015a are substantially equal. It may be preferable to control a distance from the surface of the substrate to an upper end of the second interlayer insulating film to fall within a predetermined range. It may be more preferably to control a film thickness distribution of the third interlayer insulating film 2015 is controlled such that a height of the insulating film 2015 (an upper end of the third interlayer insulating film) within the surface of the substrate falls within a predetermined range.

Further, according to another embodiment, electric potentials of the first bias electrode 219a and an electric potential of the second bias electrode 219b may be separately controlled. For example, by controlling the electric potential of the second bias electrode 219b to be lower than the electric potential of the first bias electrode 219a, an amount of active species led into the peripheral side of the wafer 200 may be increased, thereby increasing a film thickness of the peripheral side of the wafer 200.

Also, a power supplied to the first coil 250a and a power supplied to the second coil 259b may be controlled separately. For example, by controlling the power supplied to the second coil 250b to be greater than the power supplied to the first coil 250a, an amount of the active species supplied to the peripheral side of the wafer 200 may be increased, thereby increasing a film thickness of the peripheral side of the wafer 200.

Also, more precise control may be achieved by performing two or more of the controls above in parallel.

Next, provided below describes when the data stored in the RAM 121b relates to distribution B. Distribution B refers to when the insulating film 2013b is thicker than the insulating film 2013a, as illustrated in FIGS. 11 and 14.

In case of distribution B. during the present process, a film thickness of the insulating film 2015a formed in the central surface of the wafer 200 is adjusted to be large while a film thickness of the insulating film 2015b formed in the peripheral surface of the wafer 200 is adjusted to be small. Specifically, it controls the magnetic force generated by the first electromagnet 250g to be greater than magnetic force generated by the second electromagnet 250h, to generate plasma in the third plasma generation region 253. By doing so, a height of the insulating film, that is, a height of the overlapping insulating films 2013 and 2015 may be adjusted to be the same as a film thickness distribution B' as illustrated in FIG. 15. That is, a film thickness of the stacked insulating film may be adjusted to be the same as the film thickness distribution B'.

At this time, the thickness of the insulating film 2015 is adjusted such that the thickness H1b of the overlapping insulating films 2013b and 2015b and the thickness H1a of the overlapping insulating films 2013a and 2015a are substantially equal. It may be more preferable that a difference between a distance from the surface of the wafer 200 to an upper end of the insulating film 2015b and a distance from the surface of the wafer 200 to an upper end of the insulating film 2015a falls within a predetermined range. It may be more preferably that a film thickness distribution of the third interlayer insulating film 2015 is controlled such that a distribution of a height of the insulating film 2015 (an upper end of the third interlayer insulating film) within the surface of the substrate falls within a predetermined range.

In accordance with another embodiment, an electric potential of the first bias electrode 219a and an electric potential of the second bias electrode 219b may be separately controlled. For example, by controlling the electric potential of the first bias electrode 219a to be lower than the electric potential of the second bias electrode 219b, an amount of active species led into the central side of the wafer

200 may be increased, thereby increasing a film thickness of the central side of the wafer 200.

Also, a power supplied to the first coil 250*a* and a power supplied to the second coil 259*b* may be controlled separately. For example, by controlling the power supplied to the first coil 250*a* to be greater than the power supplied to the second coil 250*b*, an amount of the active species supplied to the central side of the wafer 200 may be increased, thereby increasing a film thickness of the central side of the wafer 200.

Also, more precise control may be achieved by performing two or more of the controls in parallel.

(Film Thickness Measuring Step S110)

After the third insulating film forming step S109, a film thickness measuring step S110 may be performed. In the film thickness measuring step S110, a height of the overlapping the second and third interlayer insulating film 2013 and 2015 is measured. Specifically, it is examined if the height of the overlapping films is adjusted, that is, whether a film thickness of the stacked insulating film has been adjusted to be the same as a target film thickness distribution. Here, the meaning of the expression "the height is adjusted" may not be limited to that heights are completely identical to each other, and may include that heights are different. For example, the height difference may be allowable if the difference falls within a range that does not affect a subsequent patterning step or a subsequent metal film forming step.

After the third insulating film forming step S109, the wafer 200 is loaded to the measuring apparatus. The measuring apparatus is configured to measure a film thickness (height) distribution of the insulating film 2015 by measuring at least some points of the central surface and the periphery surface of the wafer 200 that may be easily affected by the polishing apparatus 400. The measurement data is transferred to the higher apparatus 270. After the measurement, the wafer 200 is unloaded.

When the distribution of heights within the surface of the wafer 200 falls in a predetermined range, specifically, a range of distributions that do not affect a subsequent patterning step S111 or a subsequent metal film forming step S112, the process proceeds to the patterning step S111. Also, the film thickness measuring step S110 may be omitted when it has been already known that the film thickness distribution is a predetermined distribution.

<Patterning Step S111>

Subsequently, the patterning step S111 will be described. After the film thickness measurement, the wafer 200 is patterned in a desired pattern. Details of the patterning step will be described with reference to FIGS. 23 to 25. In the present disclosure, an embodiment is described using distribution A. However, it is clear that the present disclosure is applicable to distribution B as well.

Figure 23:
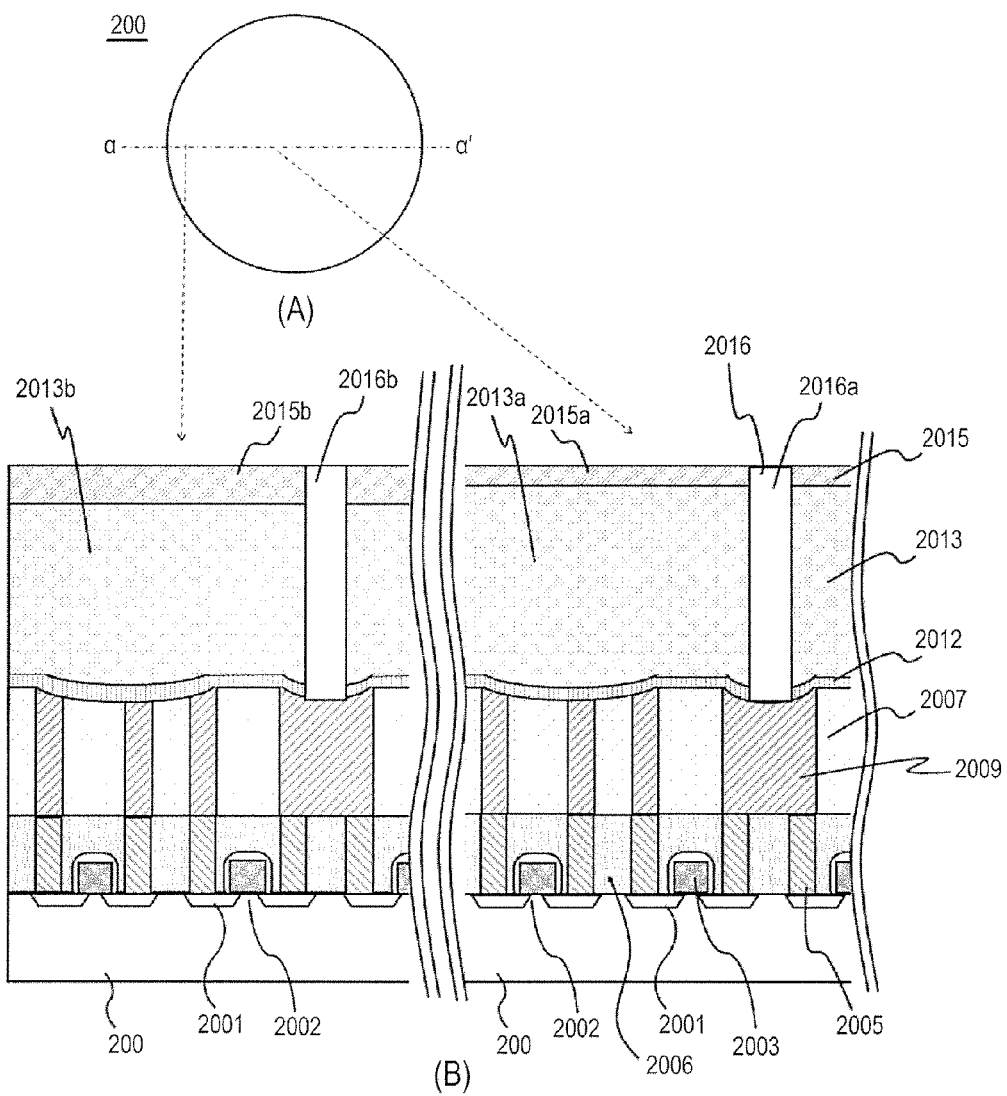
FIG. 23 is an explanatory view illustrating a process state of a wafer according to an embodiment.

The patterning step S111 is performed by an exposure apparatus or an etching apparatus included in the second patterning system. The patterning step S111 includes an exposure process performed by the exposure apparatus, an etch process performed by the etching apparatus, and the like. After the wafer 200 is loaded to the patterning system, the wafer 200 is exposed to light, and the etching apparatus forms the stacked insulating film with a predetermined pattern, as illustrated in FIG. 23. In the present embodiment, a through groove 2016 is formed. After the etching is completed, the wafer 200 is unloaded from the etching apparatus and unloaded from the patterning system.

Specifically, in the present step, as illustrated in FIG. 23, the through groove 2016 used as a contact hole is formed in the stacked insulating film (a film obtained by stacking the second interlayer insulating film 2013 and the third interlayer insulating film 2015). When the through groove 2016 is formed, the barrier insulating film 2012 is etched such that a portion of the metal film 2009 is exposed. The etching is performed by an etching apparatus configured to etch the barrier insulating film 2012 for a predetermined time. A metal film 2019, which will be described later, is electrically connected with the metal film 2009 at the exposed portion of the metal film 2009. As described later, a lower portion of the through groove 2016 is configured as a via hole in which the metal film 2019 is embedded, and an upper portion of the through groove 2016 is configured as a wiring groove in which the metal film 2020 is embedded.

Figure 24:
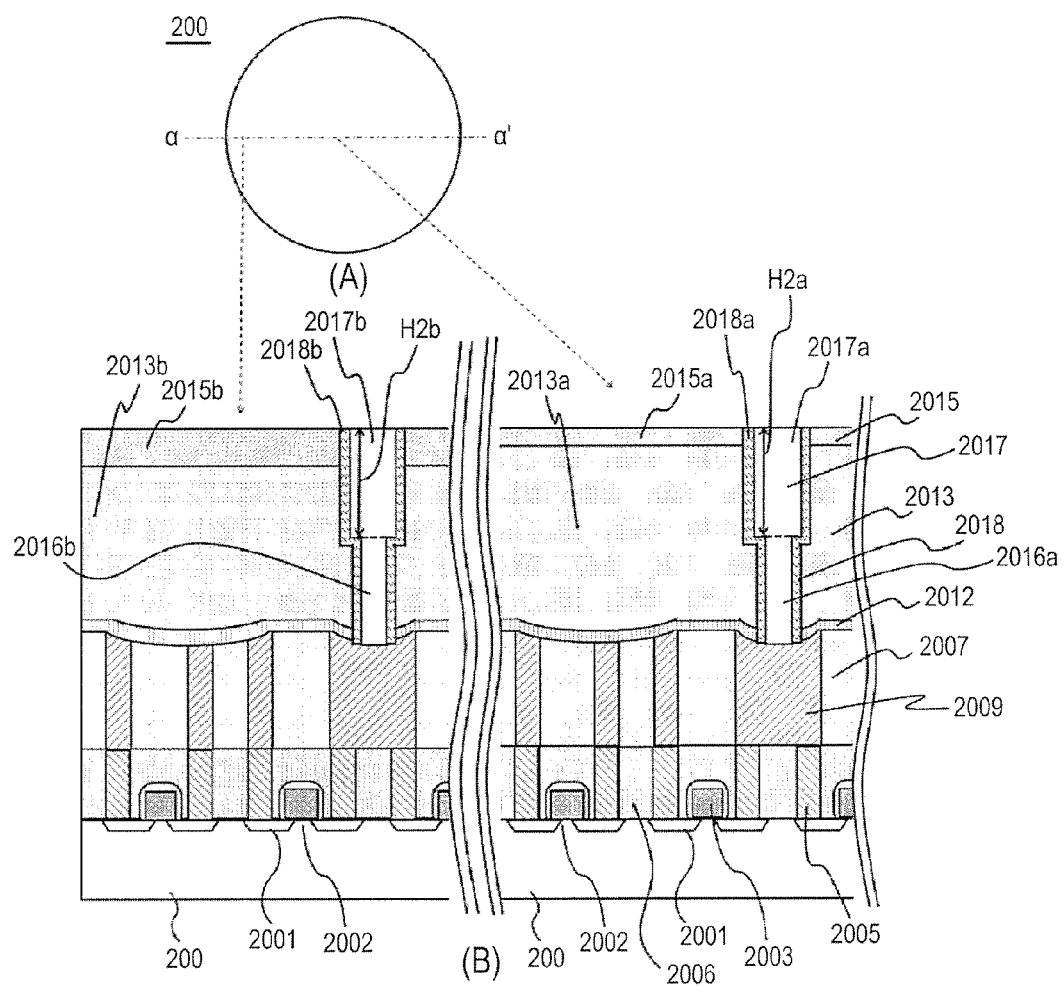
FIG. 24 is an explanatory view illustrating a processing state of a wafer according to an embodiment.

Subsequently, as illustrated in FIG. 24, a wiring groove 2017 configured to dispose a metal film as a wiring is formed. When the wiring groove 2017 is formed, an etching apparatus configured to form the wiring groove processes the wafer 200 for a predetermined time. In the present embodiment, a wiring groove 2017*a* having a height H2*a* is formed in a central surface of the wafer 200. Also, a wiring groove 2017*b* having a height H2*b* is formed in a peripheral surface of the wafer 200. Since the stacked insulating film has the same height in the central surface and the peripheral surface of the wafer 200, the height H2*a* and the height H2*b* are substantially equal naturally. Further, the wiring groove is used as a second layer of the semiconductor device.

<Metal Film Forming Step S112>

Figure 25:
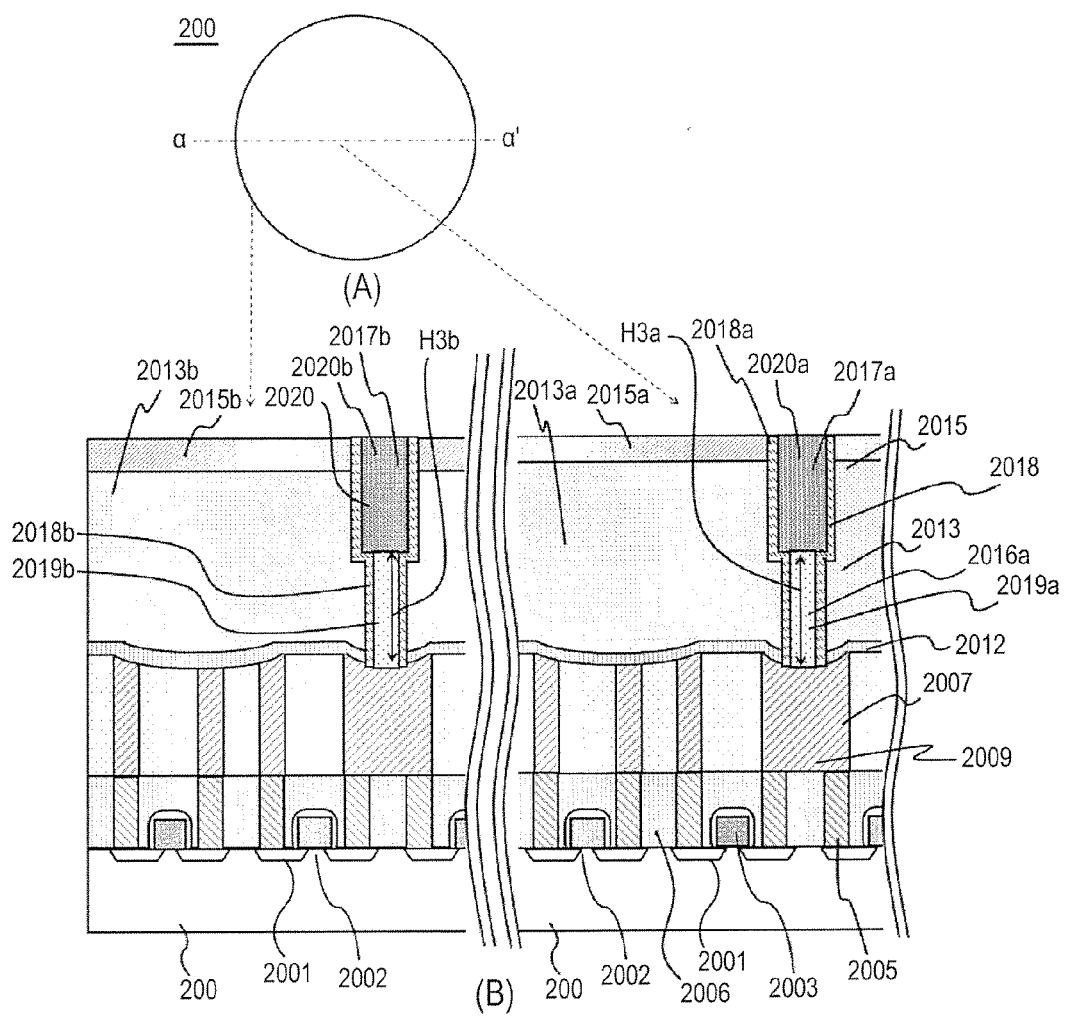
FIG. 25 is an explanatory view illustrating a processing state of a wafer according to an embodiment.

Subsequently, a barrier metal film 2018 is formed on a surface of the through groove 2016 or the wiring groove 2017. Thereafter, as illustrated in FIG. 25, metal films 2019*a* and 2019*b* used as a connection wiring (also referred to as a via or a through terminal) is embedded in the barrier metal film 2018, and also, metal films 2020*a* and 2020*b* (also referred to as wiring metal films 2020*a* and 2020*b* or wirings 2020*a* and 2020*b*) used as a wiring is embedded in the wiring grooves 2017*a* and 2017*b*, respectively. The metal film 2019*a* and the metal film 2020*a* may be formed from the same constituent as the metal film 2019*b* and the metal film 2020*b*, respectively. When the metal films 2019*a* and 2019*b* and the metal films 2020*a* and 2020*b* are formed from the same constituent, the metal films 2019*a* and 2019*b* and the metal films 2020*a* and 2020*b* may be formed through a single film forming process. The metal films 2019*a* and 2019*b* and the metal films 2020*a* and 2020*b* may be formed from, for example, copper.

Also, here, a layer having the metal film 2019, the metal film 2020, and the insulating film 2013 will be referred to as a second layer of the multilayer wiring layer. Also, the metal film 2020 will be referred to as a second metal wiring layer or an M2 layer.

As described above, by performing the substrate processing step including the third insulating film forming step S109, the height of the through groove 2016 between the M1 layer and the M2 layer, which is used as a via hole, may be uniform within the surface of the wafer 200. That is, a height H3*a* of a through groove 2016*a* between the M1 layer and the M2 layer in the central surface of the wafer 200 and a height H3*b* of a through groove 2016*b* between the M1 layer and the M2 layer in the peripheral surface of the wafer 200 may be adjusted. In this manner, the height of the metal film 2019*a* at the center of the wafer 200 and the height of the metal film 2019*b* at the periphery of the wafer 200 may be adjusted, and thus, characteristics of the metal film 2019 within the surface of the wafer may be uniform. Thus, semiconductor devices produced from the wafer 200 may have uniform characteristics.

Also, the characteristics mentioned herein refer to characteristics proportional to the height of the metal film 2019, for example, an electrical capacitance or a resistance value.

<Polishing Step S113>

When the metal film forming step S112 is completed, polishing is performed to insulate metal films, similarly to the metal film polishing step S104.

<Determination Step S114>

It is examined whether a desired number of layers have been formed on the wafer. When the desired number of layers has been formed, the process is ended. When the desired number of layers has not been formed, the process proceeds to the barrier insulating film forming step S105. The barrier insulating film forming step S105 to the metal film polishing step S113 are repeatedly performed until the desired number of layers are formed.

Although the present embodiment is described using the example of the M1 layer and the M2 layer, the present disclosure is not limited thereto, but may be applicable to, for example, M3 or more layers.

Further, although the present embodiment is described with the example of connecting the upper and lower layers in a gravitation direction, the present disclosure is not limited thereto and may be applied to, for example, a 3D stacked circuit.

Next, a comparative example will be described with reference to FIGS. 28 to 30.

In the comparative example, the film thickness measuring step S108 and the third insulating film forming step S109 are not performed. That is, after the second insulating film polishing step S107, the patterning step S111 is performed. Therefore, heights of the insulating films and heights of the through grooves 2016 are different in the central surface and the peripheral surface of the wafer 200.

The comparative example will be described with reference to FIG. 28. FIG. 28 shows the comparative example, which is compared with FIG. 23. In FIG. 28, a height of the insulating film 2013 is different in the central surface of the wafer 200 and the peripheral surface of the wafer 200 due to the second insulating film polishing step S107. That is, the heights of the insulating film 2013a and the insulating film 2013b are different.

Figure 28:
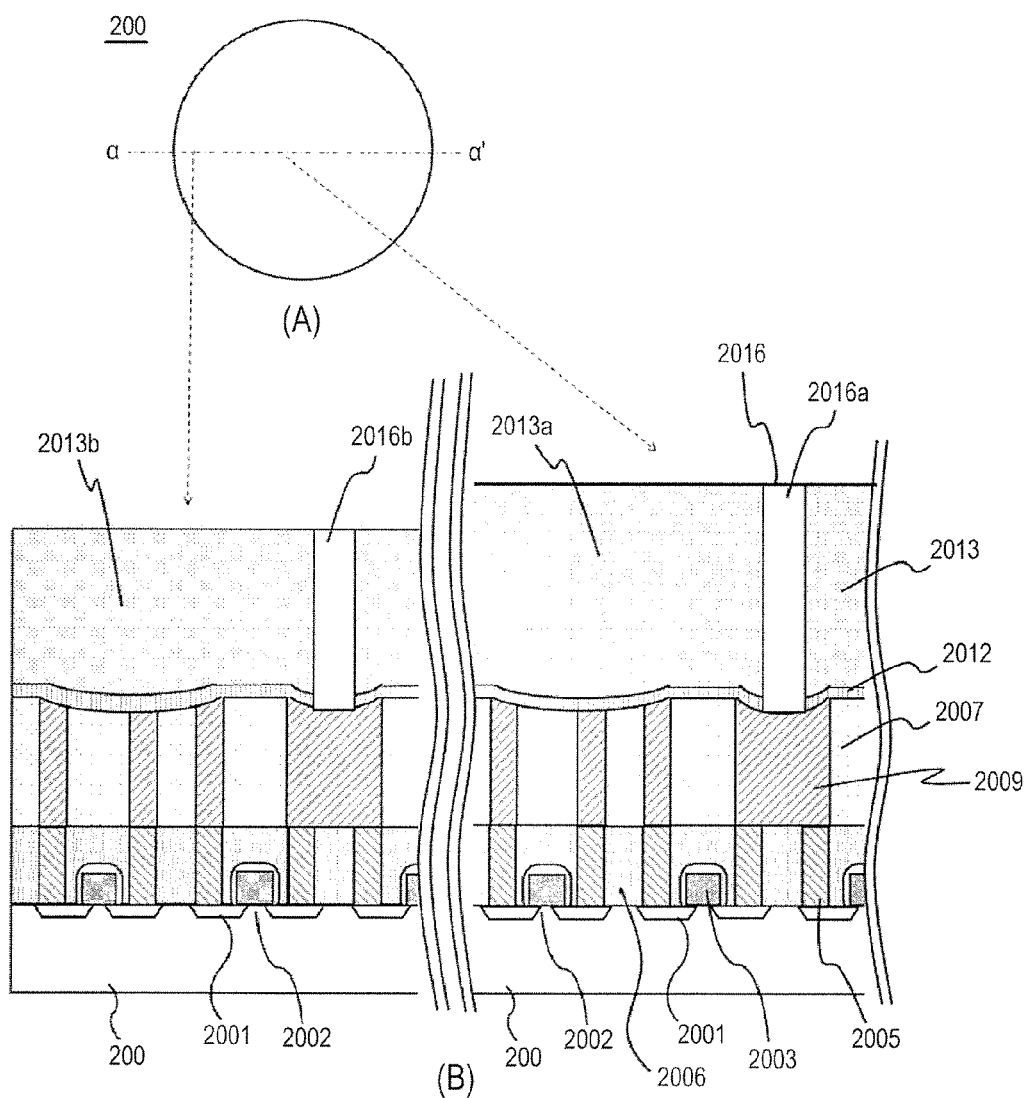
FIG. 28 is an explanatory view illustrating a process state of a wafer regarding a comparative example.
Figure 29:
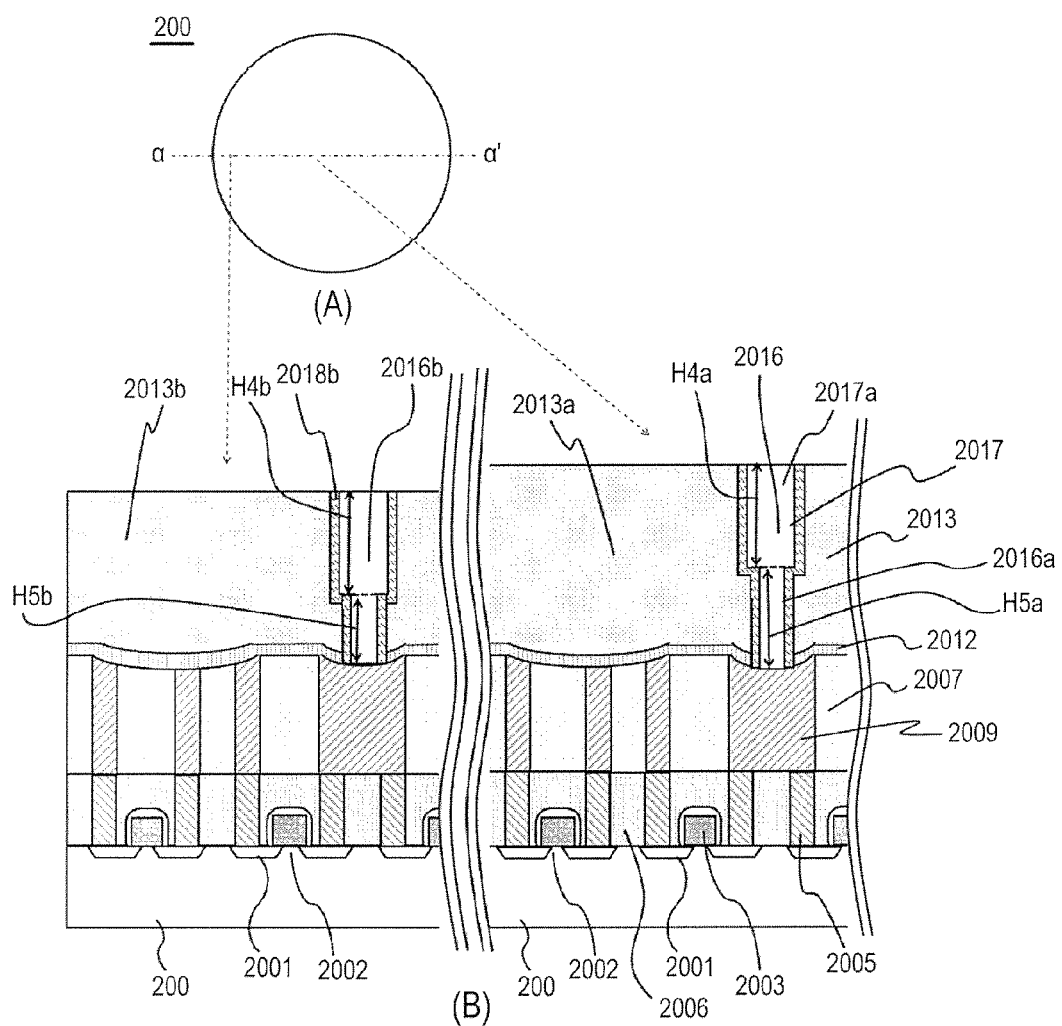
FIG. 29 is an explanatory view illustrating a process state of a wafer regarding a comparative example.

An etching process is performed on the wafer 200 as illustrated in FIG. 28 to form the wiring groove 2017. After the etching process is performed for a predetermined time, a height H4a of the wiring groove 2017a in the inner circumference of the wafer 200 and a height H4b of the wiring groove 2017b at the periphery of the wafer 200 are uniform, as illustrated in FIG. 29. However, since the heights of the insulating film 2013 are different at the periphery of the wafer 200 and the center of the wafer 200 are different, the heights of the via holes in the through groove 2016 are also different. That is, a height H5a of a via hole at the center of the wafer 200 and a height H5b of a via hole at the periphery of the wafer 200 are different.

Figure 30:
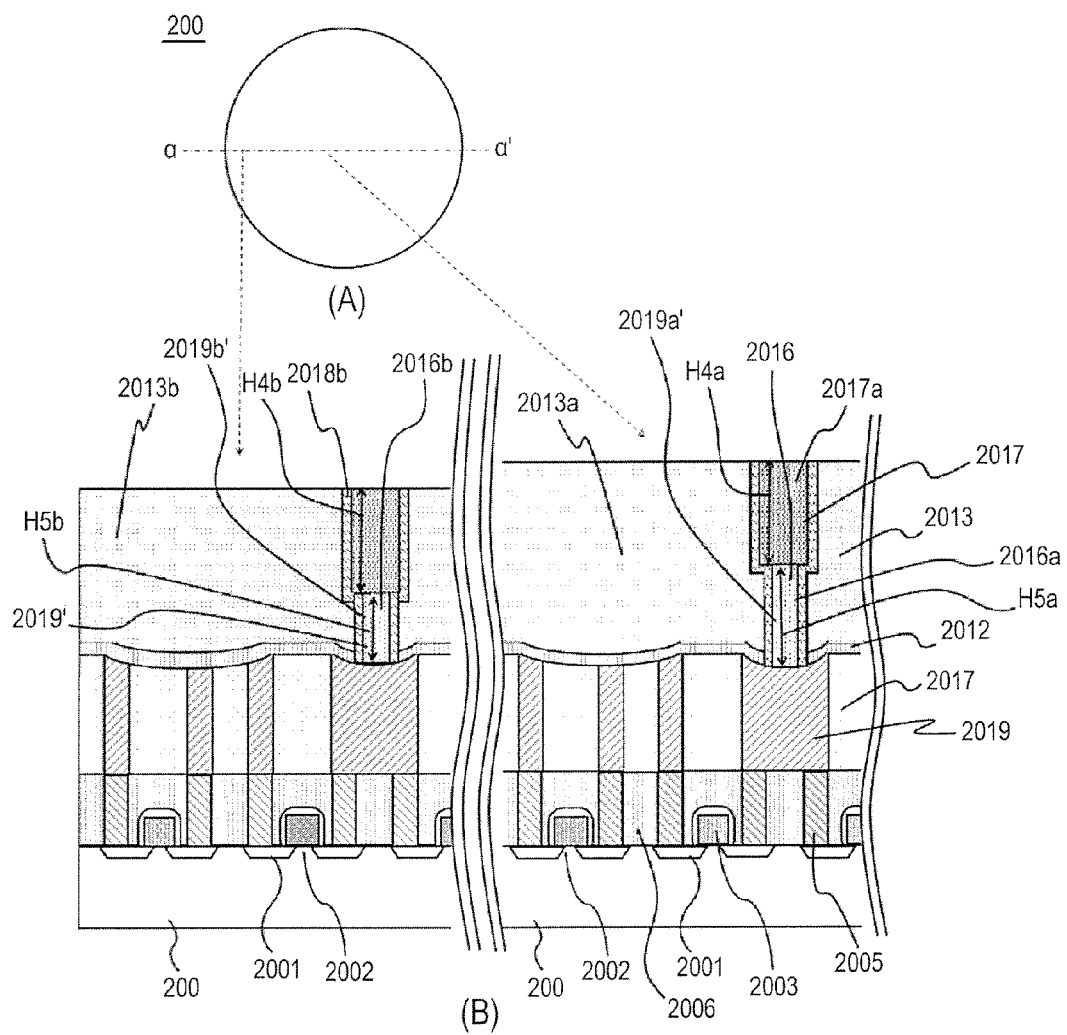
FIG. 30 is an explanatory view illustrating a processing state of a wafer regarding a comparative example.

Since the heights of the via holes at the center of the wafer 200 and at the periphery of the wafer 200 are different, heights of a metal film 2019' embedded in the via holes are also different at the center of the wafer 200 and the periphery of the wafer 200, as illustrated in FIG. 30. Thus, the metal film 2019a has different characteristics which are proportional to heights, for example an electrical capacitance or a resistance value, between the center of the wafer 200 and the periphery of the wafer 200. Thus, semiconductor devices produced from the wafer 200 cannot have uniform characteristics.

In contrast, in the present embodiment of the present disclosure, since the film thickness measuring step S108 and the third insulating film forming step S109 are performed, the metal film 2019 may have uniform heights within the surface of the wafer 200. Thus, the semiconductor device can have uniform characteristics in the surface of the wafer 200, thereby remarkably contributing to enhancement of yield, compared to the comparative example.

Figure 26:
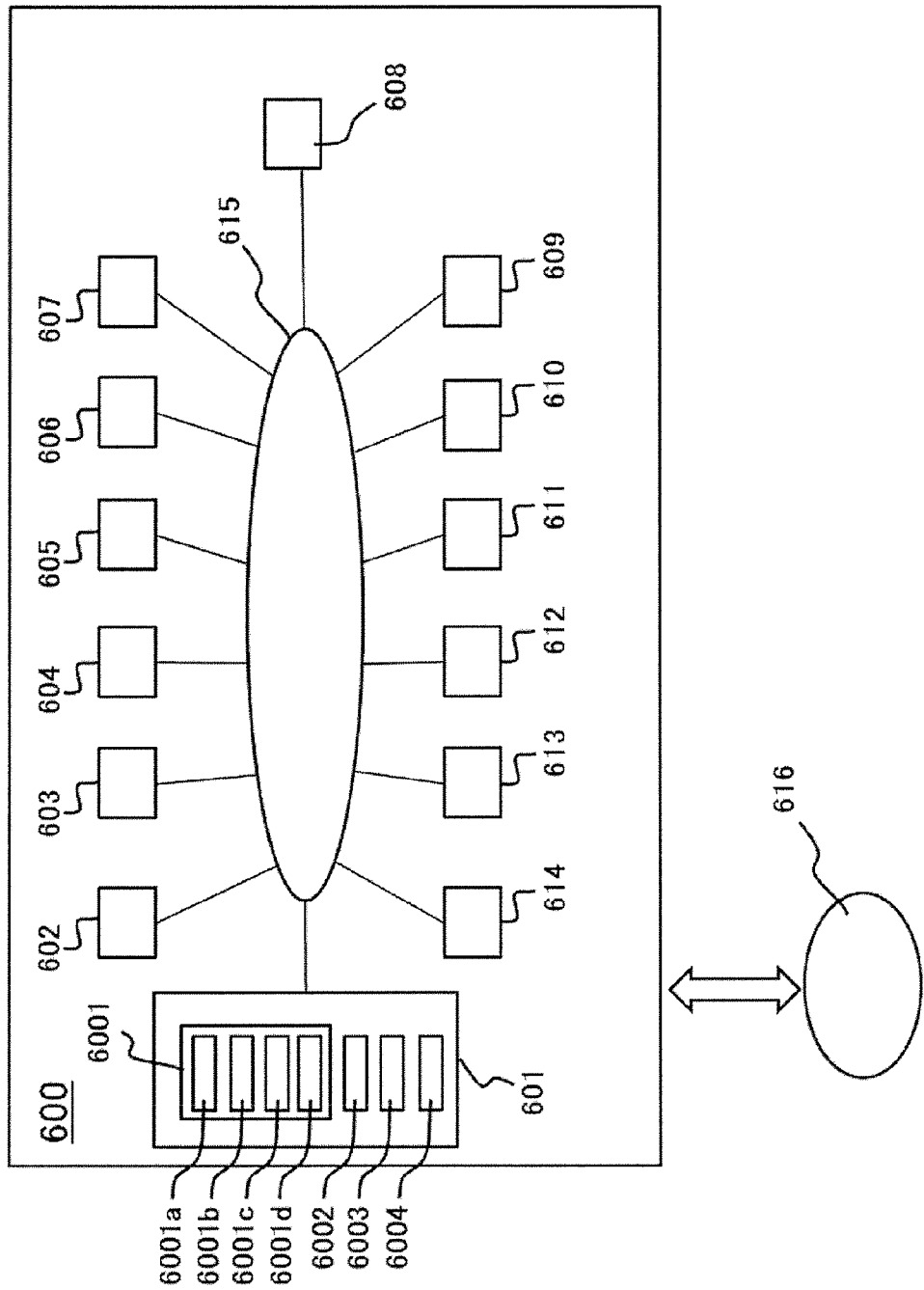
FIG. 26 is an explanatory diagram illustrating a system according to an embodiment.

Further, although the present embodiment is exemplary described using separate apparatuses for performing the steps from the first insulating film forming step S101 to the second metal film forming step, a single substrate processing system may be used to perform those steps, as illustrated in FIG. 26. In the embodiment illustrated in FIG. 26, the system 600 includes a higher apparatus 601 configured to control the system. The system 600, which serves as a substrate processing apparatus or a substrate processing system for processing a substrate, includes an insulating film focusing apparatus 602 configured to perform the first insulating film forming step S101, a patterning system 603 configured to perform the patterning step S102, a metal film forming system 604 configured to perform the metal film forming step S103, a polishing apparatus 605 configured to perform the metal film polishing step S104, a barrier insulating film forming apparatus 606 configured to perform the barrier insulating film forming step S105, an insulating film forming apparatus 607 configured to perform the second insulating film forming step S106, and a polishing apparatus 608 (corresponding to the polishing apparatus 400 of the present embodiment) configured to perform the second insulating film polishing step S107. The system 600 further includes a measuring apparatus 609 configured to perform the film thickness measuring step S108, an insulating film forming apparatus 610 (corresponding to the substrate processing apparatus 100 of the present embodiment) configured to perform the third insulating film forming step S109, a film thickness measuring apparatus 611 configured to perform the film thickness measuring step S110, a patterning system 612 configured to perform the patterning step S111, a metal film forming system 613 configured to the metal film forming step S112, and a polishing apparatus 614 configured to perform the metal film polishing step S113. In addition, the system 600 further includes a network 615 configured to exchange information between the apparatuses and/or systems.

The higher apparatus 601 includes a controller 6001 configured to control information transmission of each substrate processing apparatus or substrate processing system.

The system controller 6001 serving as a control part (control means) of the system is configured as a computer including a central processing unit (CPU) 6001a, a random access memory (RAM) 6001b, a memory device 6001c, and an I/O port 6001d. The RAM 6001b, the memory device 6001c, and the I/O port 6001d are configured to exchange data with the CPU 6001a via an internal bus. The higher apparatus 601 is configured to be connected with an input/output device 6002, e.g., a touch panel, and/or an external memory device 6003. In addition, the higher apparatus 601 further includes a transceiver part 6004 configured to receive and transmit information to/from other apparatus and/or systems through the network.

The memory device 6001c may include, for example, a flash memory, a hard disc drive (HDD). The memory device 6001c readably stores therein a program for instructing the substrate processing apparatus to perform operations. Further, the RAM 6001*b* has a memory area (work area) in which a program, data, or the like read by the CPU 6001*a* is temporarily stored.

The CPU 6001*a* is configured to read from the memory device 6001*c* and execute the control program, and also to read program from the memory device 6003*c* according to an input of an operation command from the input/output device 6002. Further, the CPU 6001*a* is configured to control information transmission operation of each apparatus according to the read program.

In addition, the system controller 6001 is not limited to being configured as a dedicated computer and may be configured as a general-purpose computer. In accordance with one embodiment, the system controller 6001 may be configured by using the external memory device 6003 storing the program as described above (e.g., a magnetic tape, a magnetic disc such as a flexible disc or a hard disc, an optical disc such as a compact disc (CD) or a digital versatile disc (DVD), a magneto-optical (MO) disc, or a semiconductor memory such as a universal serial bus (USB) memory or a memory card) to install the program on the general-purpose computer. Further, the program may be provided to the computer by using any others than the external memory device 6003. For example, a communication means such as the Internet or a dedicated line may be used to provide the program, instead of the external memory device 6003. Also, the memory device 6001*c* or the external memory device 6003 is configured as a non-transitory computer-readable recording medium. Hereinafter, these will be generally referred to simply as "a recording medium." Additionally, the term "recording medium" in the present disclosure may refer to the recording medium including the memory device 6001*c*, the external memory device 6003, or both the memory device 6001*c* and the external memory device 6003.

The apparatuses of the system 600 can be appropriately selected, and apparatuses for performing functions may be integrated into a single apparatus. Conversely, a plurality of apparatuses configured to perform a single process may be installed when improving throughput is critical. In addition, the apparatuses of the system 600 may be managed by another system, instead of the system 600. In this case, information may be transmitted to such another system through a higher network 616.

Further, the memory device 6001*c* may store therein a program for controlling the insulating film forming apparatus 610 based on data received from the measuring apparatus 609. In this case, the higher apparatus 601 performs the controlling. Thus, in a case that a plurality of the insulating film forming apparatus 610 is provided, an insulating film forming apparatus may be appropriately selected from the plurality of the insulating film forming apparatuses 610 according to conditions such as transfer rate, and thus, processing efficiency can be enhanced.

Figure 27:
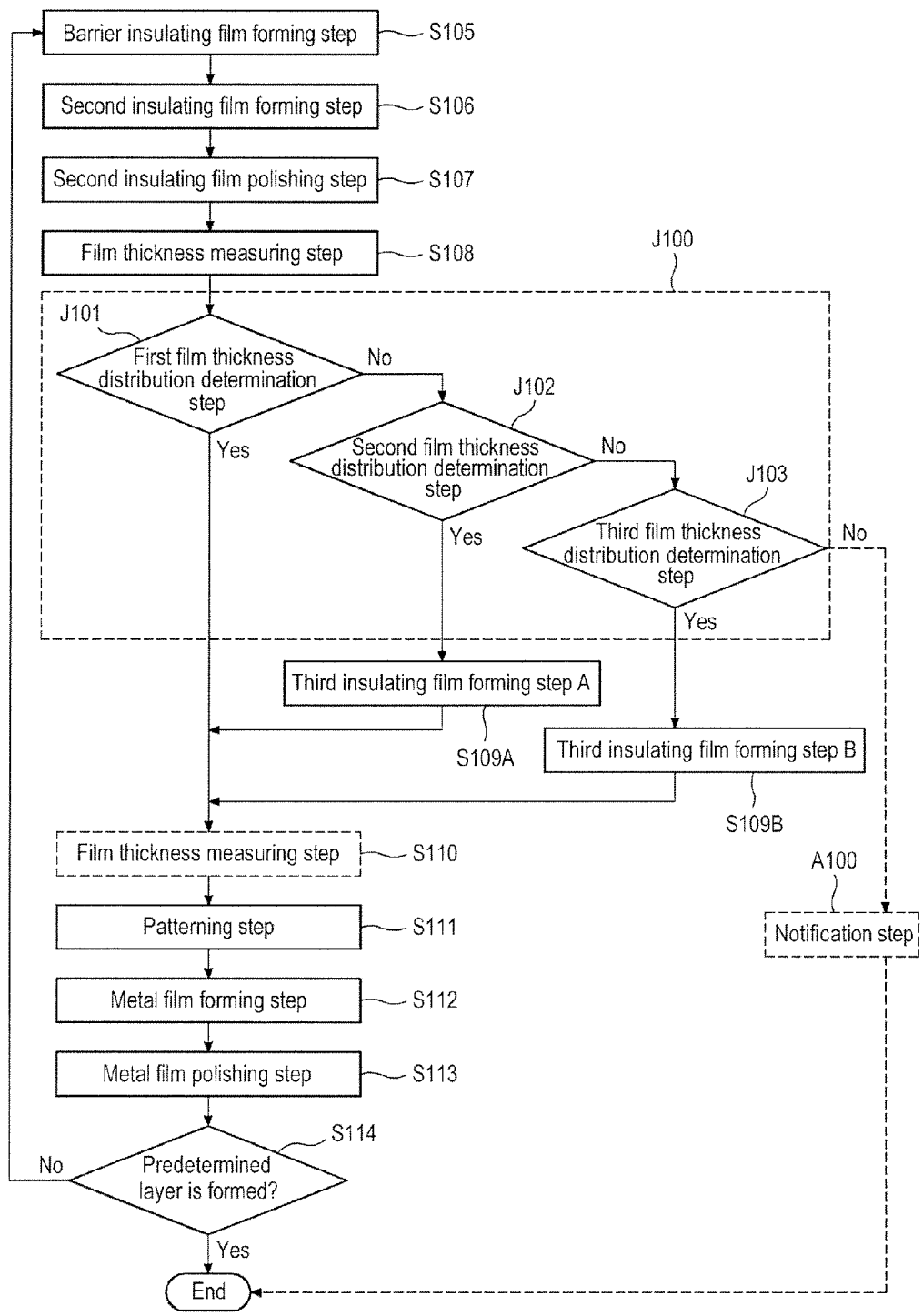
FIG. 27 is a flowchart illustrating an example of a processing sequence of a system according to an embodiment.

A flow of controlling the insulating film forming apparatus 610 based on data (film thickness distribution data) received from the measuring apparatus 609 will be described with reference to FIG. 27.

Upon a receipt of the film thickness distribution data from the measuring apparatus 609, a subsequent film thickness distribution determination step J100 is performed. In the film thickness distribution determination step J100, a first film thickness distribution determination step J101, a second film thickness distribution determination step J102, and/or a third film thickness distribution determination step J103 may be performed according to on a film thickness distribution data result.

<First Film Thickness Distribution Determination Step J101>

In the first film thickness distribution determination step J101, it is determined whether the film thickness distribution data is within a predetermined range (to determine whether a film thickness distribution is required to be adjusted). When the film thickness distribution data is within the predetermined range, the wafer 200 is transferred to the patterning system 612 to perform the patterning step S111 thereon the wafer 200. When the film thickness distribution data is not within the predetermined range, the second film thickness distribution determination step J102 is performed. A comparison computation of the film thickness distribution at the first film thickness distribution determination step J101 may be performed by, for example, the higher apparatus 601. In one embodiment, the determination on whether the film thickness distribution data is within the predetermined range may be performed based on, for example, a difference between a maximum value and a minimum value, as illustrated in FIGS. 13 and 15.

<Second Film Thickness Distribution Determination Step J102>

In the second film thickness distribution determination step J102, it is determined whether the film thickness distribution data corresponds to the film thickness distribution A (to determine whether the film thickness distribution is required to be adjusted). The determination may be made based on, for example, whether a film thickness of the central side of the wafer 200 is greater than that of the peripheral side of the wafer 200. When it is determined that the film thickness distribution data corresponds to the distribution A, processing data for a target film thickness distribution A' is computed so that the substrate processing apparatus 100 performs a third insulating film forming step A (S109A). When it is determined that the film thickness distribution data does not correspond to the film thickness distribution A, the third film thickness determination step J103 is performed.

<Third Film Thickness Distribution Determination Step J103>

In the third film thickness distribution determination step J103, it is determined whether film thickness distribution data corresponds to the film thickness distribution B (to determine whether a film thickness distribution is required to be adjusted). The determination may be made according to, for example, whether a film thickness of the central side of the wafer 200 is smaller than that of the peripheral side thereof. When it is determined that the film thickness distribution data corresponds to the film thickness distribution B, processing data for a target film thickness distribution B' is computed so that the substrate processing apparatus 100 performs a third insulating film forming step B (S109B). When the polished film thickness distribution data does not correspond to the film thickness distribution B, a notification step A100 for notifying (outputting) the input/output device 6002, the higher network 616, or the like of adjustment unavailability information, error information, or the like may be performed, and the processing of the wafer 200 may be ended.

The present embodiment exemplary employs the first film thickness distribution determination step J101, the second film thickness distribution determination step J102, and the third film thickness distribution determination step J103 separately. However, the present disclosure is not limited thereto and may employ a common determination step to perform the determinations conducted in the first film thickness distribution determination step J101, the second film thickness distribution determination step J102, and the third film thickness distribution determination step J103 with respect to a film thickness of a predetermined point of the wafer 200.

When the higher apparatus 601 performs the determinations as discussed above, a transfer path of the wafer 200 may be optimized; thereby enhancing throughput.

In addition, with the higher apparatus 601 performing the determinations and notifying (outputting) determination results to the input/output device 6002, the higher network 616, or the like, a workload for analyzing a usage situation of each apparatus or variation in the film thickness distribution data may be reduced.

For example, when the input/output device 6002, the higher network 616 or the like is notified of data (information) on, for example, the respective number of times that the first film thickness distribution determination step J101, the second film thickness distribution determination step J102, and/or the third film thickness distribution determination step J103 provides the result "Y", the result "N", and a ratio of "Y"/"N", a timing for maintenance of each apparatus may be easily recognized.

Further, the film thickness distribution determination step J100 may be performed by a controller installed in the measuring apparatus 609, instead of the higher apparatus 601, and the film thickness distribution data may be transmitted to either or both of the higher apparatus 601 and an apparatus of a subsequent step.

Also, the film thickness distribution determination step J100 may be performed by the controller 121 installed in the substrate processing apparatus 100.

Also, in the present embodiment, although other steps of the second insulating film forming step have been described, it is not limited to the steps, as well as apparatuses, and systems for the steps.

Although it is described above that the wafer 200 is divided into the center and the periphery, the present disclosure is not limited thereto and the control of the film thickness of the insulating film may be conducted with respect to more subdivided regions along a diameter direction. For example, the wafer may be divided into three or more regions such as a center of the substrate, a periphery of the substrate, and an intermediate region between the center and the periphery.

Also, although the present embodiment employs the film thickness measuring step S110, the present disclosure is not limited thereto and the film thickness measuring step S110 may not be performed. In this case, it would be fine if a height of the overlapping insulating films 2013 and 2015 is adjusted to fall in a range in which the characteristics of the via hole are not varied.

<Other Embodiments>

FIG. 22 exemplary illustrates the process sequence in which a film formation amount at the center side of the wafer 200 and that at the peripheral side thereof are differentiated. However, the present disclosure is not limited thereto, and the following process sequences may be performed.

Figure 31:
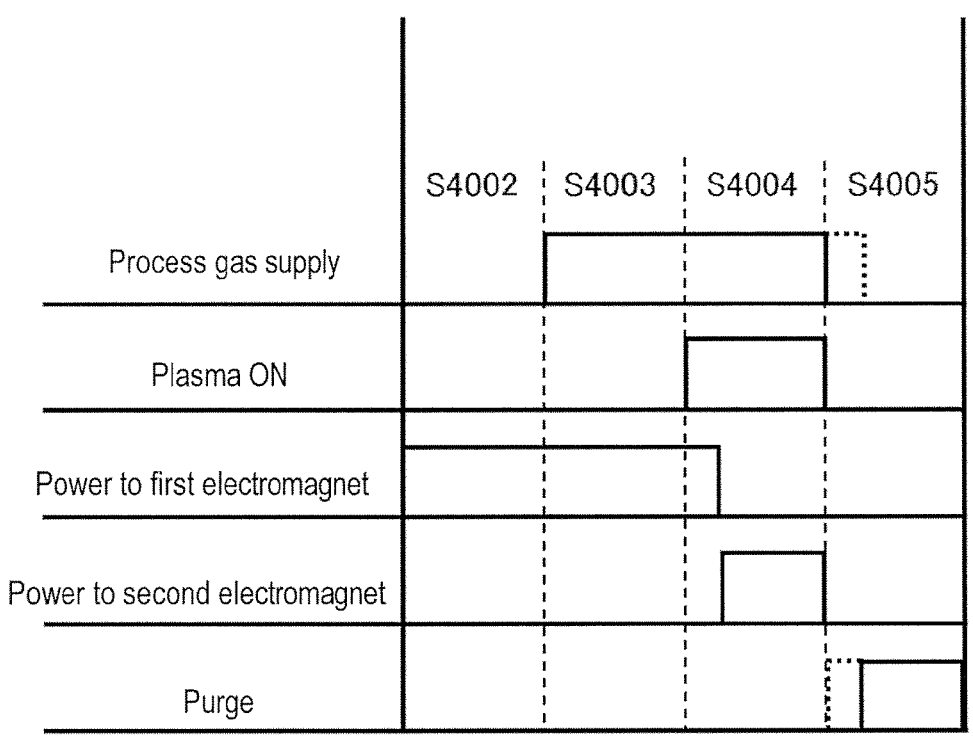
FIG. 31 is a diagram illustrating an example of a substrate processing sequence according to another embodiment.
Figure 32:
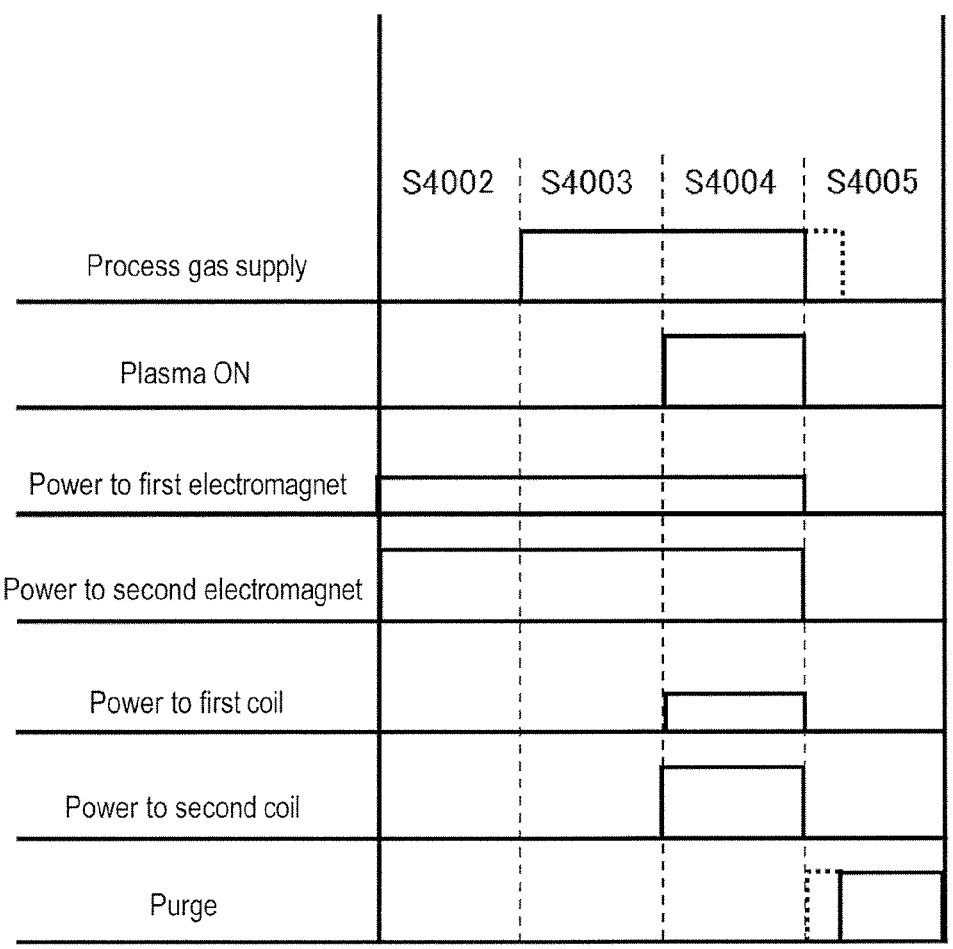
FIG. 32 is a diagram illustrating an example of a substrate processing sequence according to another embodiment.

For example, FIG. 31 illustrates another exemplary embodiment of a process sequence. FIG. 31 illustrates the example in which, after a magnetic field is generated in the first electromagnet 250g, a magnetic field is generated in the second electromagnet 250h. In this manner, a film formation amount at the periphery side of the substrate may be greater than that at the center side thereof. Conversely, when the magnetic field is generated in the first electromagnet 250g after the magnetic field is generated in the second electromagnet 250h, the film formation amount at the center side of the substrate may be greater than that at the peripheral side thereof FIG. 32 illustrates still another exemplary embodiment of the process sequence. FIG. 32 illustrates the example in which a power to the second coil 250b is greater than a power to the first coil 250a, in the process sequence of FIG. 22. In this manner, a film formation amount at the peripheral side of the substrate may be greater than that at the center side thereof. Conversely, when a power to the first electromagnet 250g is greater than a power to the second electromagnet 250h, and the power to the first coil 250a is greater than the power to the second coil 250b, the film formation amount at the center side of the substrate may be greater than that at the peripheral side thereof.

Figure 33:
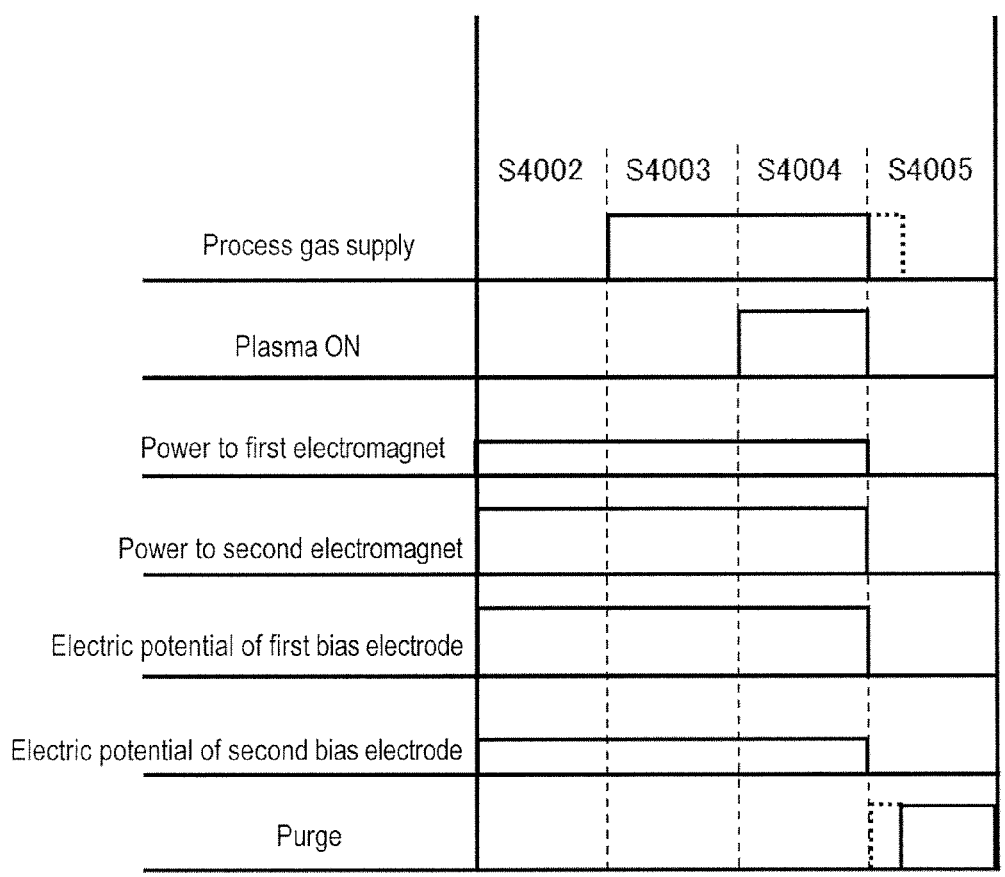
FIG. 33 is a diagram illustrating an example of a substrate processing sequence according to another embodiment.

FIG. 33 illustrates still another exemplary embodiment of the process sequence. FIG. 33 illustrates the example in which an electric potential of the first bias electrode 219a is greater than that of the second bias electrode 219b, in the process sequence of FIG. 22. In this manner, the film formation amount at the peripheral side of the substrate may be greater than that at the center side thereof. Conversely, when the power to the first electromagnet 250g is greater than the power to the second electromagnet 250h and the electric potential of the second bias electrode 219b is greater than that of the first bias electrode 219a, the film formation amount at the center side of the substrate may be greater than that at the peripheral side thereof.

Figure 34:
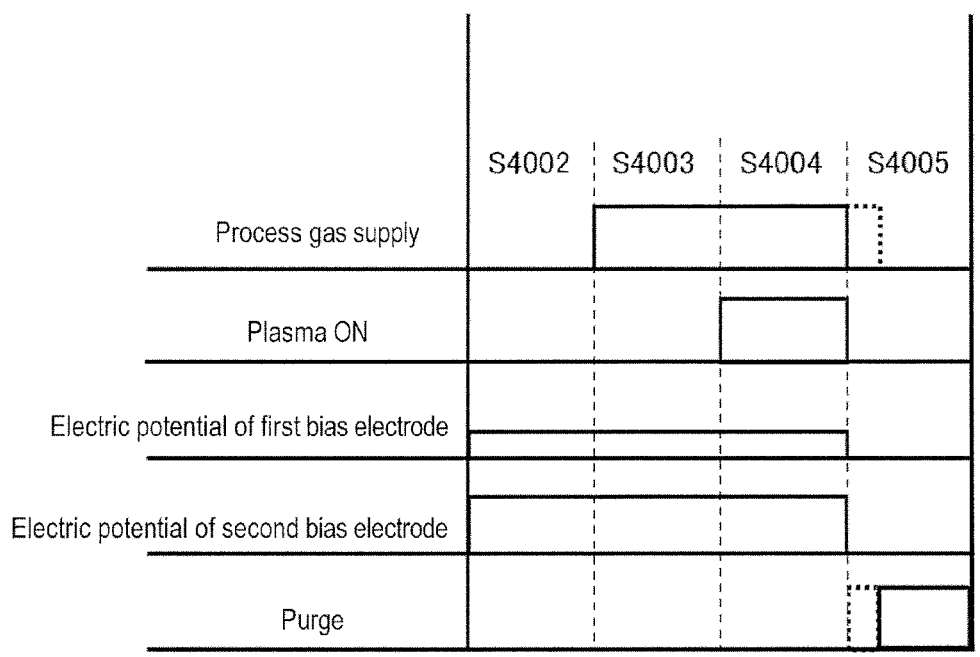
FIG. 34 is a diagram illustrating an example of a substrate processing sequence according to another embodiment.

FIG. 34 illustrates still exemplary embodiment of the process sequence. FIG. 34 illustrates a sequence in which an electric potential of the second bias electrode is higher than that of the first bias electrode. In this manner, the film thickness distribution A as illustrated in FIG. 13 may be adjusted to correspond to the film thickness distribution A'.

Figure 35:
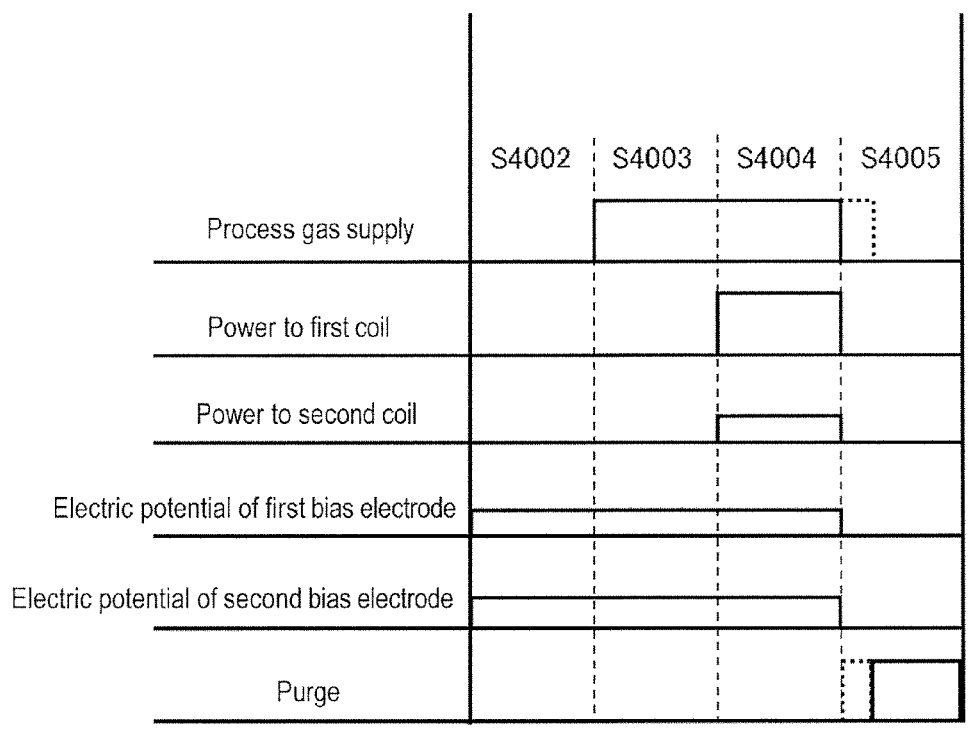
FIG. 35 is a diagram illustrating an example of a substrate processing sequence according to another embodiment.

FIG. 35 illustrates still exemplary embodiment of the process. FIG. 35 illustrates a sequence in which a high-frequency power supplied to the first coil 250a is greater than a high-frequency power supplied to the second coil 250b. In this manner, the film thickness distribution B as illustrated in FIG. 15 may be adjusted to correspond to the film thickness distribution B'.

Figure 36:
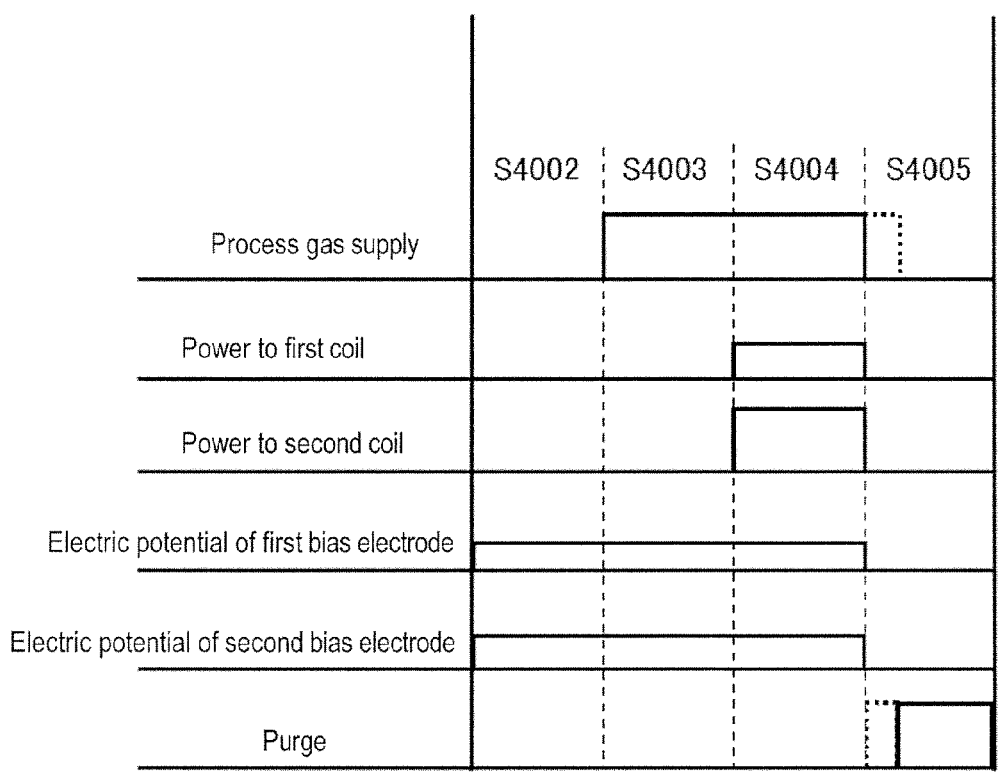
FIG. 36 is a diagram illustrating an example of a substrate processing sequence according to another embodiment.

FIG. 36 illustrates still exemplary embodiment of the process. FIG. 36 illustrates a sequence in which a high-frequency power supplied to the first coil 250a is smaller than a high-frequency power supplied to the second coil 250b. In this manner, the film thickness distribution A as illustrated in FIG. 13 may be adjusted to correspond to the film thickness distribution A'.

Figure 37:
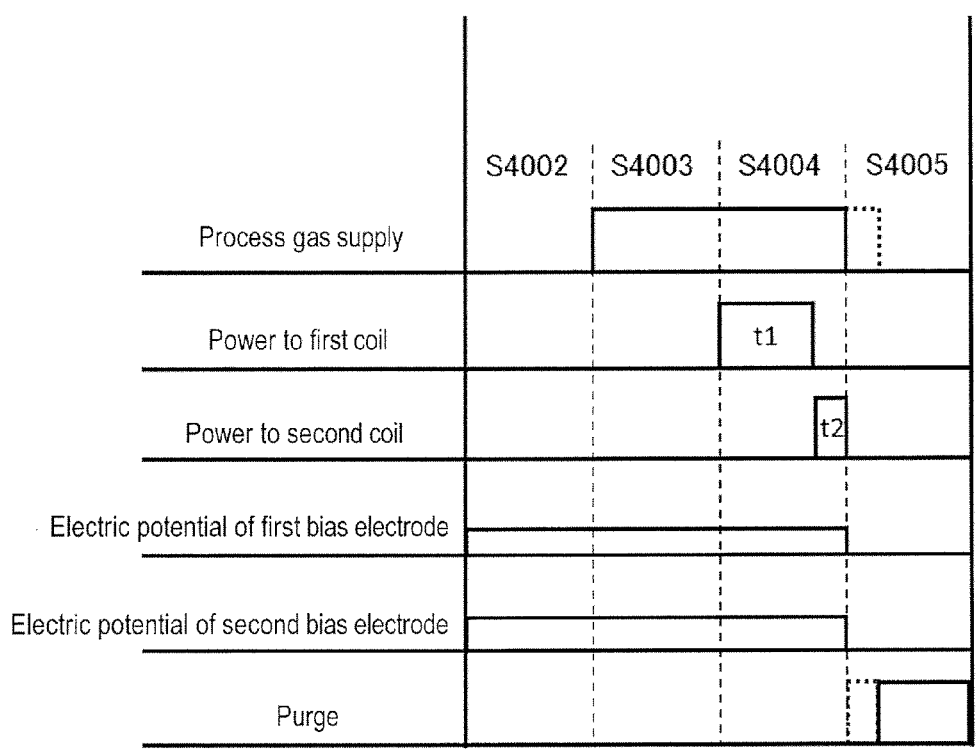
FIG. 37 is a diagram illustrating an example of a substrate processing sequence according to another embodiment.

FIG. 37 illustrates still exemplary embodiment of the process. FIG. 37 illustrates a sequence in which a high-frequency power is supplied to the first coil 250a for a time t1, and then, the high-frequency power is supplied to the second coil 250b for a time t2. In the present embodiment, that the time t1 is set to be longer than the time t2. In this manner, the film thickness distribution B as illustrated in FIG. 13 may be adjusted to correspond to the film thickness distribution B'. Although in the present embodiment, the high-frequency power is supplied to the second coil 250b after the high-frequency power is supplied to the first coil 250a, the power may be supplied to the first coil 250a after the power is supplied to the second coil 250b.

Figure 38:
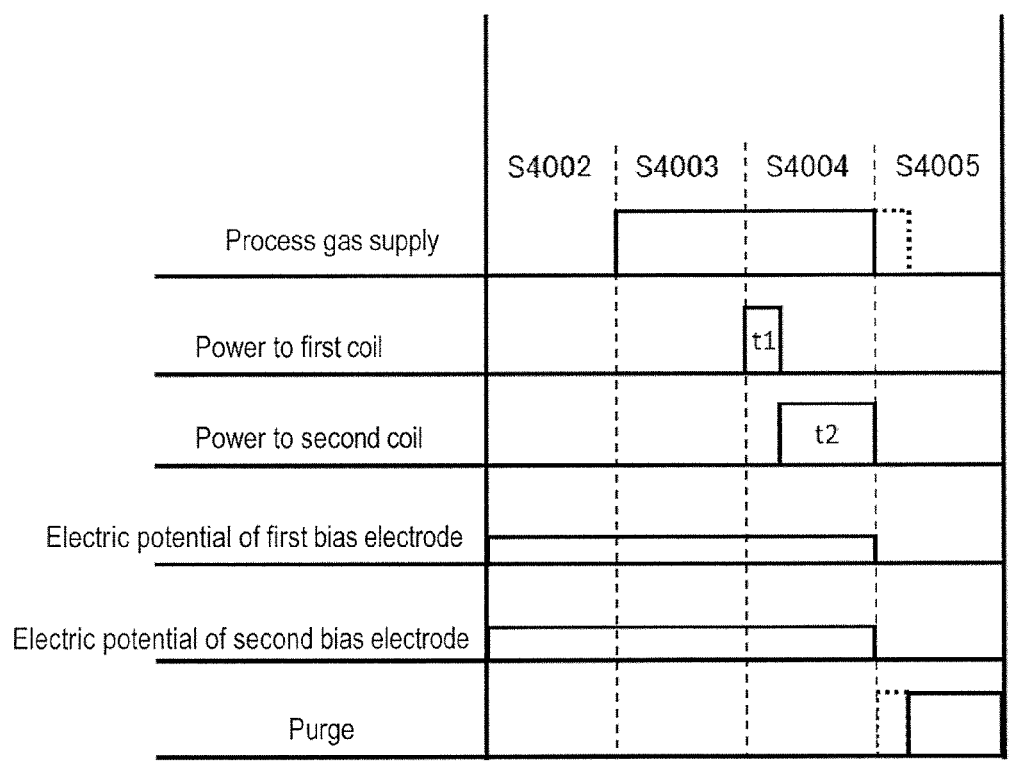
FIG. 38 is a diagram illustrating an example of a substrate processing sequence according to another embodiment.

FIG. 38 illustrates still exemplary embodiment of the process. FIG. 38 illustrates a sequence in which that the time t1 is set to be shorter than the time t2. In this manner, the film thickness distribution A as illustrated in FIG. 13 may be adjusted to correspond to the film thickness distribution A'. Also, although in the present embodiment, the high-frequency power is supplied to the second coil 250b after the high-frequency power is supplied to the first coil 250a, the power may be supplied to the first coil 250a after the power is supplied to the second coil 250b.

Also, it is exemplary described in the above that the plasma is generated within the process chamber 201 by using the first coil 250a, the first electromagnet 250g, and the second electromagnet 250h, but the present disclosure is not limited thereto. For example, the plasma may be generated within the process chamber 201 by using the second coil 250b, the first electromagnet 250g, and the second electromagnet 250h, without the first coil 250a. When only the second coil 250b is used for generating the plasma, the plasma may be mainly generated in the second plasma generation region 252. However, a distribution of the plasma may be regulated by spreading the active species generated in the second plasma generation region to the center side of the wafer 200 using either or both of the first electromagnet 250g and the second electromagnet 250h.

Further, although it is described above that the wafer is divided into the inner circumference and the periphery, the present disclosure is not limited thereto and the control of the film thickness of the silicon-containing film may be conducted with respect to more subdivided regions along a diameter direction. For example, the substrate may be divided into three regions such as the inner circumference of the substrate, the periphery of the substrate, and an intermediate space between the inner circumference and the periphery.

Further, although in the foregoing description, the diameter of the first electromagnet 250g is equal to that of the second electromagnet 250h, the diameters may be arranged differently. For example, the diameter of the second electromagnet 250h may be greater than that of the first electromagnet 250g, or the diameter of the first electromagnet 250g may be greater than that of the second electromagnet 250h.

Also, although it is exemplary described in the above that the first electromagnet 250g and the second electromagnet 250h are fixed, the present disclosure is not limited thereto and a lifting operating mechanism may be installed in each of the electromagnets so that positions of the magnets may be changed according to processes.

Also, the film forming steps may include film formation processing such as CVD (chemical vapor deposition), cyclic processing for forming a thin fi with alternately supplied gases, and/or processing of oxidation, nitriding, or oxynitriding for reforming a film. These processing enable the adjustment even when an uneven structure cannot be reduced through migration or sputtering.

Also, when sputtering or film formation processing is performed, anisotropic processing or isotropic processing may be combined thereto. The combination with anisotropic processing or isotropic processing may allow the adjustment to be done more precisely.

Also, although it is described in the above that the silicon oxide film is used as the insulating film, other elements achieving the same purpose such as an oxide film, a nitride film, a carbide film, an oxynitride film, or a composite film thereof, may be used to form a pattern.

Also, although the processing of one of processes of manufacturing a semiconductor device is exemplary described in the above, the present disclosure is not limited thereto and may be applied for processing a substrate, such as patterning processing in a liquid crystal panel manufacturing process, patterning processing in a solar cell manufacturing process, or patterning processing in a power device manufacturing process.

Also, although it is described in the above that different apparatuses are used in the first insulating film forming step, the second insulating film forming step, and the third insulating film forming step, the present disclosure is not limited thereto. For example, the first insulating film forming step may be performed by the substrate processing apparatus 900.

Also, although the embodiment described above may use the wafer of, for example, 300 mm in diameter, a large substrate such as a wafer of 450 mm in diameter may be more effective because the insulating film forming step S107 can provide more remarkably influences on the large substrate. That is, a film thickness difference between the insulating film 2013a and the insulating film 2013b can become greater. The second insulating film forming step may suppress the variation of characteristics within the surface of the large substrate.

<Aspects of the Present Disclosure>

Hereinafter, some aspects of the present disclosure will be supplementarily stated.

(Supplementary Note 1)

According to one aspect of the present disclosure, there is provided a substrate processing method or a method of manufacturing a semiconductor device, including: polishing a substrate in which a metal film as a metal wiring is formed on a first insulating film having a plurality of wiring grooves; forming a second insulating film on the substrate after the act of polishing a substrate; polishing the second insulating film; receiving film thickness distribution data within a surface of the substrate of the second insulating film after the act of polishing the second insulating film, and calculating processing data for adjusting a film thickness distribution of a stacked insulating film formed of the second insulating film after being polished and a third insulating film by adjusting a film thickness distribution of the third insulating film formed on the second insulating film after being polished, based on the film thickness distribution data; and adjusting the film thickness distribution of the stacked insulating film by activating a process gas to form the third insulating film such that a concentration of active species of the process gas generated in a central side of the substrate and a concentration of active species of the process gas generated in a peripheral side of the substrate are different, based on the processing data.

(Supplementary Note 2)

In the method according to Supplementary Note 1, preferably, in the act of adjusting the film thickness distribution of the stacked insulating film, a magnetic force generated from the side of the substrate is set to be greater than a magnetic force generated from an upper portion of the substrate when the film thickness distribution data indicates that a film thickness of the peripheral side of the substrate is smaller than that of the central side thereof.

(Supplementary Note 3)

In the method according to Supplementary Note 1, preferably, in the act of adjusting the film thickness distribution of the stacked insulating film, a high-frequency power supplied from the side of the substrate is set to be greater than a high-frequency power supplied from an upper portion of the substrate when the film thickness distribution data indicates that a film thickness of the peripheral side of the substrate is smaller than that of the central side thereof.

(Supplementary Note 4)

In the method according to any one of Supplementary Notes 1 to 3, preferably, in the act of adjusting the film thickness distribution of the stacked insulating film, an electric potential of the peripheral side of the substrate is set to be lower than that of the central side of the substrate when the film thickness distribution data indicates that a film thickness of the peripheral side of the substrate is smaller than that of the central side thereof.

(Supplementary Note 5)

In the method according to Supplementary Note 1, preferably, in the act of adjusting the film thickness distribution of the stacked insulating film, a magnetic force generated from the upper portion of the substrate is set to be greater than a magnetic force generated from the side of the substrate when the film thickness distribution data indicates that a film thickness of the central side of the substrate is smaller than that of the peripheral side thereof.

(Supplementary Note 6)

In the method according to Supplementary Note 1 or 5, preferably, in the act of adjusting the film thickness distribution of the stacked insulating film, a high-frequency power supplied from the upper portion of the substrate is set to be greater than a high-frequency power supplied from the side of the substrate when the film thickness distribution data indicates that a film thickness of the central side of the substrate is smaller than that of the peripheral side thereof.

(Supplementary Note 7)

In the method according to any one of Supplementary Notes 1, 5 and 6, preferably, in the act of adjusting the film thickness distribution of the stacked insulating film, an electric potential of the central side of the substrate is set to be lower than that of the peripheral side of the substrate when the film thickness distribution data indicates that a film thickness of the central side of the substrate is smaller than that of the peripheral side thereof.

(Supplementary Note 8)

The method according to any one of Supplementary Notes 1 to 7 preferably further includes pattering the stacked insulating film after the act of adjusting the film thickness distribution of the stacked insulating film.

(Supplementary Note 9)

According to another aspect of the present disclosure, there is provided a program that causes a computer to perform a process or a non-transitory computer-readable recording medium storing the program, the process including: polishing a substrate in which a metal film as a metal wiring is formed on a first insulating film having a plurality of wiring grooves; forming a second insulating film as a portion of a stacked insulating film on the substrate after the act of polishing a substrate; polishing the second insulating film; receiving film thickness distribution data within a surface of the substrate of the second insulating film after the act of polishing the second insulating film; calculating processing data for adjusting a film thickness distribution of a stacked insulating film formed of the second insulating film after being polished and a third insulating film by adjusting a film thickness distribution of the third insulating film formed on the second insulating film after being polished, based on the film thickness distribution data; and adjusting the film thickness distribution of the stacked insulating film by activating a process gas to form the third insulating film such that a concentration of active species of the process gas generated in a central side of the substrate and a concentration of active species of the process gas generated in a peripheral side of the substrate are different, based on the processing data.

(Supplementary Note 10)

According to still another aspect of the present disclosure, there is provided a program that causes a computer to perform a process or a non-transitory computer-readable recording medium storing the program, the process including: polishing a substrate in which a metal film as a metal wiring is formed on a first insulating film having a plurality of wiring grooves; forming a second insulating film on the substrate after the act of polishing a substrate; polishing the second insulating film; receiving film thickness distribution data within a surface of the substrate of the second insulating film after the act of polishing the second insulating film; determining whether it is required to adjust a film thickness distribution of a stacked insulating film formed of the second insulating film after being polished and a third insulating film by adjusting a film thickness distribution of the third insulating film formed on the second insulating film after being polished, based on the film thickness distribution data, and whether the adjustment is possible; and notifying either or both of an output device and a higher network of the determination results about whether it is required to adjust the film thickness distribution and whether the adjustment is possible in the act of determining.

(Supplementary Note 1))

According to still another aspect of the present disclosure, there is provided a substrate processing system or a semiconductor device manufacturing system, including: a second insulating film forming apparatus configured to form a second insulating film on a substrate in which a metal film as a metal wiring is formed on a first insulating film having a plurality of wiring grooves;

a polishing apparatus configured to polish the second insulating film; a measuring apparatus configured to receive film thickness distribution data within a surface of the substrate of the second insulating film after polishing the second insulating film; a system controller configured to calculate processing data for adjusting a film thickness distribution of a stacked insulating film forming of the second insulating film after being polished and a third insulating film by adjusting a film thickness distribution of the third insulating film formed on the second insulating film after being polished, based on the film thickness distribution data; and a third insulating film forming apparatus configured to adjust the film thickness distribution of the stacked insulating film by activating a process gas to form the third insulating film such that a concentration of active species of the process gas generated in a central side of the substrate and a concentration of active species of the process gas generated in a peripheral side of the substrate are different, based on the processing data.

(Supplementary Note 12)

According to still another aspect of the present disclosure, there is provided a substrate processing apparatus or a semiconductor device manufacturing apparatus, including: a process chamber configured to accommodate a substrate in which a metal film as a polished metal wiring is formed on a first insulating film having a plurality of wiring grooves, and having a polished second insulating film on the corresponding metal film; a process gas supply part configured to supply a process gas to the substrate; an activation part configured to activate the process gas; a receiving part configured to receive film thickness distribution data of the polished second insulating film; a calculation part configured to calculate processing data for adjusting a film thickness distribution of a stacked insulating film formed of the second insulating film after being polished and a third insulating film by adjusting a film thickness distribution of the third insulating film formed on the second insulating film after being polished, based on the film thickness distribution data; and a control part configured to control the process gas supply part and the activation part such that a concentration of active species of the process gas generated in a central side of the substrate and a concentration of active species of the process gas generated in a peripheral side of the substrate are different, based on the processing data.

(Supplementary Note 13)

According to still another aspect of the present disclosure, there is provided a substrate processing method or a method of manufacturing a semiconductor device, including: accommodating a substrate in which a metal film as a polished metal wiring is formed on a first insulating film having a plurality of wiring grooves, and having a polished second insulating film on the corresponding metal film in a processing chamber, and receiving film thickness distribution data of the second insulating film; calculating processing data for adjusting a film thickness distribution of a stacked insulating film formed of the second insulating film after being polished and a third insulating film by adjusting a film thickness distribution of the third insulating film formed on the second insulating film after being polished, based on the film thickness distribution data; supplying a process gas to the substrate; and adjusting the film thickness distribution of the stacked insulating film by activating a process gas to form the third insulating film such that a concentration of active species of the process gas generated in a central side of the substrate and a concentration of active species of the process gas generated in a peripheral side of the substrate are different, based on the processing data.

(Supplementary Note 14)

According to still another aspect of the present disclosure, there is provided a program that causes a computer to perform a process or a non-transitory computer-readable recording medium storing the program, the process including: accommodating a substrate in which a metal film as a polished metal wiring is formed on a first insulating film having a plurality of wiring grooves, and having a polished second insulating film on the corresponding metal film in a processing chamber; receiving film thickness distribution data of the second insulating film; calculating processing data for adjusting a film thickness distribution of a stacked insulating film formed of the second insulating film after being polished and a third insulating film by adjusting a film thickness distribution of the third insulating film formed on the second insulating film after being polished, based on the film thickness distribution data; supplying a process gas to the substrate; and adjusting the film thickness distribution of the stacked insulating film by activating a process gas to form the third insulating film such that a concentration of active species of the process gas generated in a central side of the substrate and a concentration of active species of the process gas generated in a peripheral side of the substrate are different, based on the processing data.

(Supplementary Note 15)

According to still another aspect of the present disclosure, there is provided a substrate processing method or a method of manufacturing a semiconductor device, including: polishing a substrate in which a metal film as a metal wiring is formed on a first insulating film having a plurality of wiring grooves; forming a second insulating film on the substrate after the act of polishing a substrate; polishing the second insulating film; receiving film thickness distribution data of the second insulating film after the act of polishing the second insulating film; and calculating processing data for adjusting a difference between a film thickness of a central side and a film thickness of a peripheral side in-plane above a surface of the substrate of a stacked insulating film formed of the second insulating film after being polished and a third insulating film to be smaller than a difference between a film thickness of a central side and a film thickness of a peripheral side in-plane above the surface of the substrate of the second insulating film, by adjusting a film thickness distribution of the third insulating film formed on the second insulating film after being polished, based on the film thickness distribution data, and adjusting the film thickness distribution of the stacked insulating film by activating a process gas to form the third insulating film such that a concentration of active species of the process gas generated in a central side of the substrate and a concentration of active species of the process gas generated in a peripheral side of the substrate are different, based on the processing data.

(Supplementary Note 16)

According to still another aspect of the present disclosure, there is provided a substrate processing method or a method of manufacturing a semiconductor device, including: polishing a substrate in which a metal film as a metal wiring is formed on a first insulating film having a plurality of wiring grooves; forming a second insulating film on the substrate after the act of polishing a substrate; polishing the second insulating film; receiving film thickness distribution data of the second insulating film after the act of polishing the second insulating film; calculating processing data for controlling a film thickness distribution of a stacked insulating film formed of the second insulating film after being polished and a third insulating film to have a distribution having higher film thickness uniformity than a film thickness distribution of the film thickness distribution data, by adjusting a film thickness distribution of the third insulating film formed on the second insulating film after being polished, based on the film thickness distribution data; and controlling the film thickness distribution of the stacked insulating film to have a distribution having higher film thickness uniformity than a film thickness distribution of the film thickness distribution data, by activating a process gas to form the third insulating film such that a concentration of active species of the process gas generated in a central side of the substrate and a concentration of active species of the process gas generated in a peripheral side of the substrate are different, based on the processing data.

According to the present disclosure in some embodiments, it is possible to suppress variation in characteristics of a semiconductor device.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosure.

What is claimed is:

1. A substrate processing apparatus, comprising: a process chamber configured to accommodate a substrate having a metal film as a metal wiring polished on a first insulating film having a plurality of wiring grooves, and having a second insulating film polished on the metal film; a process gas supply part configured to supply a process gas to the substrate; an activation part configured to activate the process gas; a receiving part configured to receive a film thickness distribution data on the polished second insulating film; a computation part configured to compute processing data for adjusting a film thickness distribution of a stacked insulating film formed of the second insulating film after being polished and a third insulating film, by adjusting a film thickness distribution of the third insulating film to be formed on the second insulating film after being polished, based on the film thickness distribution data; and a control part configured to control the process gas supply part and the activation part to adjust the film thickness distribution of the stacked insulating film by activating the process gas to form the third insulating film, based on the processing data, such that a concentration of active species of the process gas generated in a central side of the substrate and a concentration of active species of the process gas generated in a peripheral side of the substrate are different.

2. The apparatus of claim 1, wherein, the activation part is configured such that a high-frequency power supplied to the peripheral side of the substrate is greater than a high-frequency power supplied to an upper portion of the substrate when the film thickness distribution data indicates that a film thickness of the peripheral side of the substrate is smaller than a film thickness of the central side of the substrate.

3. The apparatus of claim 2, further comprising:
a bias adjusting part configured such that an electric potential of the peripheral side of the substrate is lower than an electric potential of the central side of the substrate when the film thickness distribution data indicates that the film thickness of the peripheral side of the substrate is smaller than the film thickness of the central side of the substrate.

4. The apparatus of claim 1, further comprising:
a bias adjusting part configured such that an electric potential of the peripheral side of the substrate is lower than an electric potential of the central side of the substrate when the film thickness distribution data indicates that a film thickness of the peripheral side of the substrate is smaller than a film thickness of the central side of the substrate.

5. The apparatus of claim 1, further comprising: a magnetic force generating part configured such that a magnetic force generated at the peripheral side of the substrate is greater than that generated at an upper portion of the substrate when the film thickness distribution data indicates that a film thickness of the peripheral side of the substrate is smaller than a film thickness of the central side of the substrate.

6. The apparatus of claim 5, further comprising:
a bias adjusting part configured to control an electric potential of the peripheral side of the substrate to be lower than that of the central side of the substrate when the film thickness distribution data indicates that the film thickness of the peripheral side of the substrate is smaller than the film thickness of the central side of the substrate.

7. The apparatus of claim 5, wherein, the activation part is configured such that a high-frequency power supplied to the peripheral side of the substrate is greater than a high-frequency power supplied to the upper portion of the substrate when the film thickness distribution data indicates that the film thickness of the peripheral side of the substrate is smaller than that of the central side thereof.

8. The apparatus of claim 6, wherein, the activation part is configured such that a high-frequency power supplied to the peripheral side of the substrate is greater than a high-frequency power supplied to the upper portion of the substrate when the film thickness distribution data indicates that the film thickness of the peripheral side of the substrate is smaller than the film thickness of the central side of the substrate.

9. The apparatus of claim 1, wherein, the activation part is configured such that a high-frequency power supplied to an upper portion of the substrate is greater than a high-frequency power supplied to the peripheral side of the substrate when the film thickness distribution data indicates that a film thickness of the central side of the substrate is smaller than that of the peripheral side of the substrate.

10. The apparatus of claim 9, further comprising:
a bias adjusting part configured such that an electric potential of the central side of the substrate is lower than an electric potential of the peripheral side of the substrate when the film thickness distribution data indicates that the film thickness of the central side of the substrate is smaller than the film thickness of the peripheral side of the substrate.

11. The apparatus of claim 1, further comprising:
a bias adjusting part configured such that an electric potential of the central side of the substrate is lower than an electric potential of the peripheral side of the substrate when the film thickness distribution data indicates that a film thickness of the central side of the substrate is smaller than a film thickness of the peripheral side of the substrate.

12. The apparatus of claim 1, further comprising: a magnetic force generating part configured such that a magnetic force generated at an upper portion of the substrate is greater than that generated at the peripheral side of the substrate when the film thickness distribution data indicates that a film thickness of the central side of the substrate is smaller than a film thickness of the peripheral side of the substrate.

13. The apparatus of claim 12, further comprising:
a bias adjusting part configured such that an electric potential of the central side of the substrate is lower than that of the peripheral side of the substrate when the film thickness distribution data indicates that the film thickness of the central side of the substrate is smaller than the film thickness of the peripheral side of the substrate.

14. The apparatus of claim 13, wherein, the activation part is configured such that a high-frequency power supplied to the upper portion of the substrate is greater than a high-frequency power supplied to the peripheral side of the substrate when the film thickness distribution data indicates that the film thickness of the central side of the substrate is smaller than the film thickness of the peripheral side of the substrate.

15. The apparatus of claim 1, wherein the activation part is configured such that a high-frequency power supplied to an upper portion of the substrate is greater than a high-frequency power supplied to the peripheral side of the substrate when the film thickness distribution data indicates that a film thickness of the central side of the substrate is smaller than a film thickness of the peripheral side of the substrate.

* * * * *